United States Patent
Mori

(10) Patent No.: US 12,334,896 B2
(45) Date of Patent: Jun. 17, 2025

(54) MULTIPLEXER AND ANTENNA MODULE

(71) Applicant: Murata Manufacturing Co., Ltd., Nagaokakyo (JP)

(72) Inventor: Hirotsugu Mori, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 267 days.

(21) Appl. No.: 17/967,917

(22) Filed: Oct. 18, 2022

(65) Prior Publication Data

US 2023/0035579 A1 Feb. 2, 2023

Related U.S. Application Data

(63) Continuation of application No. PCT/JP2021/003247, filed on Jan. 29, 2021.

(30) Foreign Application Priority Data

Apr. 24, 2020 (JP) .................................. 2020-077503

(51) Int. Cl.
*H03H 7/46* (2006.01)
*H01Q 21/30* (2006.01)
(Continued)

(52) U.S. Cl.
CPC .............. *H03H 7/46* (2013.01); *H01Q 21/30* (2013.01); *H03H 7/0115* (2013.01);
(Continued)

(58) Field of Classification Search
CPC ...... H03H 7/46; H03H 7/0115; H03H 7/0163; H03H 7/463
(Continued)

(56) References Cited

U.S. PATENT DOCUMENTS

2019/0280668 A1* 9/2019 Harada ................. H04B 1/0057
2020/0014370 A1* 1/2020 Matsubara ............. H03H 9/568

FOREIGN PATENT DOCUMENTS

JP 59-126304 A 7/1984
JP 5-39003 U 5/1993
(Continued)

OTHER PUBLICATIONS

Written Opinion of the International Searching Authority mailed on Mar. 16, 2021, received for PCT Application PCT/JP2021/003247, filed on Jan. 29, 2021, 3 pages. (Previously filed; submitting English translation only.).
(Continued)

*Primary Examiner* — Rakesh B Patel
(74) *Attorney, Agent, or Firm* — XSENSUS LLP

(57) ABSTRACT

A common line is connected between a common terminal and a common connection node. A first filter has a first pass band. A second filter has a second pass band. At least one of a first condition and a second condition is satisfied. The first condition is that in the first pass band any one of a first impedance of the common line alone viewed from the common terminal (P10) and a second impedance of the first filter viewed from the common connection node includes an inductive property and the other includes a capacitive property. The second condition is that in the second pass band one of the first impedance and a third impedance of the second filter viewed from the common connection node includes an inductive property and the other includes a capacitive property.

17 Claims, 43 Drawing Sheets

(51) Int. Cl.
    *H03H 7/01*           (2006.01)
    *H03H 7/38*           (2006.01)

(52) U.S. Cl.
    CPC .......... *H03H 7/0123* (2013.01); *H03H 7/383* (2013.01); *H03H 7/463* (2013.01)

(58) Field of Classification Search
    USPC ................................. 333/126–129, 175, 185
    See application file for complete search history.

(56) References Cited

FOREIGN PATENT DOCUMENTS

| | | | |
|---|---|---|---|
| JP | 2003-324314 A | 11/2003 | |
| JP | 2008-182340 A | 8/2008 | |
| WO | WO-2018180648 A1 * | 10/2018 | ............. H03F 3/195 |

OTHER PUBLICATIONS

International Search Report and Written Opinion mailed on Mar. 16, 2021, received for PCT Application PCT/JP2021/003247, filed on Jan. 29, 2021, 8 pages including English Translation.

\* cited by examiner

2A

MULTIPLEXER AND ANTENNA MODULE

CROSS-REFERENCE TO RELATED APPLICATIONS

The present application is a continuation application of International Patent Application No. PCT/JP2021/003247, filed Jan. 29, 2021, which claims priority to Japanese patent application No. 2020-077503, filed Apr. 24, 2020, the entire contents of each of which being incorporated herein by reference.

TECHNICAL FIELD

The present disclosure relates to a multiplexer and an antenna module each having multiple pass bands.

BACKGROUND ART

A multiplexer having multiple pass bands has been known. For example, Japanese Unexamined Patent Application Publication No. 2008-182340 (Patent Document 1) discloses a diplexer including a filter having a first pass band and a filter having a second pass band that is a frequency band approximately twice or more the first pass band, and a multiplexer using the diplexer. The filter having the first pass band is configured as a lumped constant type, and the filter having the second pass band is configured as a distributed constant type. With the use of the multiplexer, an increase in the degree of freedom in design, reduction in size, and desired characteristics may be achieved.

CITATION LIST

Patent Document

Patent Document 1: Japanese Unexamined Patent Application Publication No. 2008-182340

SUMMARY

Technical Problems

The higher the frequency of an input signal to a multiplexer is, the smaller the wavelength of the input signal is, so that various elements within the multiplexer may act as resonant elements for the input signal. As a result, impedance mismatching may occur in the multiplexer, and characteristics of the multiplexer may deteriorate. However, in the multiplexer disclosed in Patent Document 1, no consideration is given to impedance mismatching due to an increase in frequency of an input signal.

The present disclosure has been made to solve the problem described above as well as other problem and is preferably configured to suppress deterioration in characteristics of a multiplexer and deterioration in characteristics of an antenna module due to impedance mismatching.

Solution to Problems

A multiplexer according to an aspect of the present disclosure includes a common terminal, a common line, a first terminal, a second terminal, a first filter, and a second filter. The common line is connected between the common terminal and a common connection node. The first filter is connected between the common connection node and the first terminal and has a first pass band. The second filter is connected between the common connection node and the second terminal and has a second pass band. At least one of a first condition and a second condition as described below is satisfied. The first condition is that in the first pass band any one of a first impedance of the common line alone viewed from the common terminal and a second impedance of the first filter viewed from the common connection node includes an inductive property, and the other includes a capacitive property. The second condition is that in the second pass band one of the first impedance and a third impedance of the second filter viewed from the common connection node includes an inductive property, and the other includes a capacitive property.

An antenna module according to another aspect of the present disclosure includes a common line, a first radiating element, and a second radiating element. One end of the common line is connected to a common connection node. The first radiating element is connected to the common connection node and has a first pass band. The second radiating element is connected to the common connection node and has a second pass band. At least one of a first condition and a second condition as described below is satisfied. The first condition is that in the first pass band any one of a first impedance of the common line alone viewed from the other end of the common line and a second impedance of the first radiating element viewed from the common connection node includes an inductive property, and the other includes a capacitive property. The second condition is that in the second pass band one of the first impedance and a third impedance of the second radiating element viewed from the common connection node includes an inductive property, and the other includes a capacitive property.

Advantageous Effects

With the use of the multiplexer according to an aspect of the present disclosure, at least one of a first condition and a second condition as described below is satisfied. The first condition is that in the first pass band any one of a first impedance of the common line alone viewed from the common terminal and a second impedance of the first filter viewed from the common connection node includes an inductive property, and the other includes a capacitive property. The second condition is that in the second pass band one of the first impedance and a third impedance of the second filter viewed from the common connection node includes an inductive property, and the other includes a capacitive property. Thus, deterioration of characteristics of the multiplexer due to impedance mismatching may be suppressed.

With the use of the antenna module according to another aspect of the present disclosure, at least one of a first condition and a second condition as described below is satisfied. The first condition is that in the first pass band any one of a first impedance of the common line alone viewed from the other end of the common line and a second impedance of the first radiating element viewed from the common connection node includes an inductive property, and the other includes a capacitive property. The second condition is that in the second pass band one of the first impedance and a third impedance of the second radiating element viewed from the common connection node includes an inductive property, and the other includes a capacitive property. Thus, deterioration of characteristics of the antenna module due to impedance mismatching may be suppressed.

DESCRIPTION OF EMBODIMENTS

Figure 1:
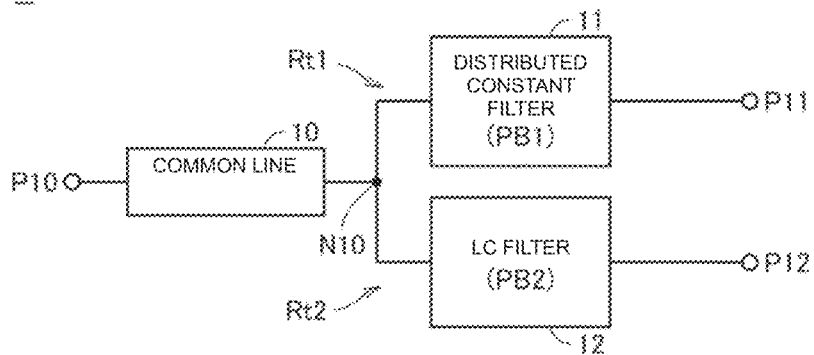
FIG. 1 is a functional block diagram illustrating a configuration of a multiplexer according to Embodiment 1.

Hereinafter, embodiments will be described in detail with reference to the drawings. Note that, in the drawings, the same or corresponding portions are denoted by the same reference signs, and a description thereof will not be repeated in principle.

Embodiment 1

FIG. 1 is a functional block diagram illustrating a configuration of a multiplexer 1 according to Embodiment 1. As illustrated in FIG. 1, the multiplexer 1 includes a common terminal P10, an input/output terminal P11 (first terminal), an input/output terminal P12 (second terminal), a common line 10, a distributed constant filter 11 (first filter), and an LC filter 12 (second filter). A path Rt1 extends from the common terminal P10 to the input/output terminal P11 through the distributed constant filter 11. A path Rt2 extends from the common terminal P10 to the input/output terminal P12 through the LC filter 12. A common connection node N10 is a branch point of the paths Rt1 and Rt2. The common line 10 is connected between the common terminal P10 and the common connection node N10. The distributed constant filter 11 is connected between the common connection node N10 and the input/output terminal P11. The LC filter 12 is connected between the common connection node N10 and the input/output terminal P12. Note that the common line 10 may be capacitively coupled to each of the common terminal P10, the distributed constant filter 11, and the LC filter 12. The distributed constant filter 11 and the LC filter 12 may be capacitively coupled to the input/output terminals P11 and P12, respectively.

The distributed constant filter 11 has a pass band PB1 (first pass band). The distributed constant filter 11 includes multiple distributed constant lines. A length of the common line 10 is substantially the same as a length of one of the multiple distributed constant lines. Each of the lengths of the multiple distributed constant lines is substantially equal to a length of one-half or one-fourth of the effective wavelength (wavelength shortened from a wavelength in free space) corresponding to a specific frequency (center frequency, for example) included in the pass band PB1, for example. The LC filter 12 has a pass band PB2 (second pass band). The LC filter 12 includes a circuit formed of an inductor and a capacitor. The LC filter 12 may be a lumped constant type filter or a circuit formed of an electrode pattern having a function of an inductor and a function of a capacitor.

The length of a line such as a common line, a distributed constant line, or a transmission line is a length of a center line in a longitudinal direction of the line. Further, the line includes a line formed of a line pattern, a line pattern formed of a via conductor, and a line formed of a via conductor and a line pattern. The line includes neither a separate capacitor nor a stub other than the line. A case that the lengths of the two lines are substantially equal to each other is, for example, a case that the length of one line is three-fourths or more and five-fourths or less the length of the other line.

When each of the lengths of the multiple distributed constant lines is one-fourth of a certain effective wavelength, the length of the distributed constant line may include a length of a via conductor connected to a ground electrode.

When a certain line is longer than one of the multiple distributed constant lines, an effect that occurs depending on a magnitude relation in the length of the line is caused to occur in each of the multiple distributed constant lines. Thus, the line is longer than any of the multiple distributed constant lines. When a certain line is shorter than one of the multiple distributed constant lines, the line is shorter than any of the multiple distributed constant lines for the same reason. In a case that the multiple distributed constant lines include both a distributed constant line ($\lambda/2$ line) having a length equal to one-half of a certain effective wavelength and a distributed constant line ($\lambda/4$ line) having a length equal to one-fourth of the effective wavelength, when one of the multiple distributed constant lines and a certain line is substantially the same, the length of the line is substantially equal to the length of the $\lambda/2$ line or substantially equal to two times the length of the $\lambda/4$ line.

The pass band PB1 is lower than the pass band PB2. The impedance (second impedance) of the distributed constant filter 11 in the pass band PB1 viewed from the common connection node N10 includes an inductive property. The impedance of the distributed constant filter 11 at a center frequency of the pass band PB1 is inductive. The impedance (third impedance) of the LC filter 12 in the pass band PB2 viewed from the common connection node N10 includes a capacitive property. The impedance of the LC filter 12 at a center frequency of the pass band PB2 is capacitive. The inductive property and capacitive property of the impedance will be described later with reference to FIG. 2. In Embodiment 1, as an example of a case that the pass band PB1 is lower than PB2, a configuration will be described in which the pass band PB1 is 26.5 GHz to 29.5 GHz and the pass band PB2 is 38 GHz to 42 GHz. In the case above, the center frequency of the pass band PB1 is 28 GHz and the center frequency of the pass band PB2 is 40 GHz.

As the frequency of a signal inputted to the multiplexer 1 increases, the wavelength of the signal decreases. As a result, resonance may occur also in the lines from the common terminal P10 to the distributed constant filter 11 or to the LC filter 12. Since the resonance affects the impedance of the multiplexer 1, the impedance matching of the multiplexer 1 preferably accounts for the impedance of the line.

As for the impedance matching of the multiplexer 1, the impedance matching may be achieved by adjusting the impedance of a circuit element connected to the common line 10 among the circuit elements included in each of the distributed constant filter 11 and the LC filter 12 (such as a first stage distributed constant line connected to the common line 10 among multiple distributed constant lines, or a capacitor connected to the common line 10 in series, for example). However, in many cases, the circuit elements in each of the distributed constant filter 11 and the LC filter 12 connected to the common line 10 are designed to provide isolation between the distributed constant filter 11 and the LC filter 12, so that it is hard to adjust the impedance mismatching caused by the common line 10 with the circuit elements.

In the multiplexer 1, therefore, the impedance when the input/output terminals P11 and P12 are viewed from the common connection node N10 is matched with a reference impedance using the impedance of the common line 10. With the use of the multiplexer 1, the impedance of the common line 10 is also considered in the impedance matching, so that the impedance matching is promoted. As a result, deterioration in characteristics of the multiplexer 1 due to impedance mismatching may be suppressed.

Figure 2:
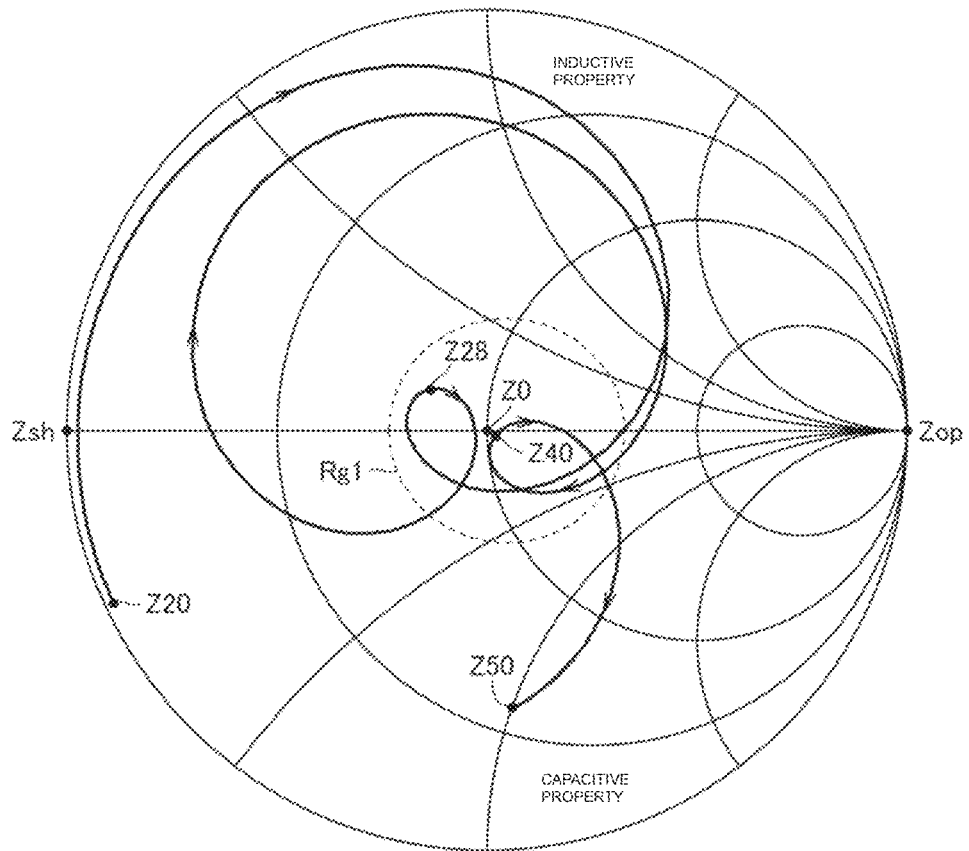
FIG. 2 is a Smith chart illustrating a frequency characteristic of impedance when an input/output terminal is viewed from a common connection node in FIG. 1.

FIG. 2 is a Smith chart illustrating a frequency characteristic of the impedance when the input/output terminals P11 and P12 are viewed from the common connection node N10 in FIG. 1. FIG. 2 illustrates a change in impedance when a frequency is varied from 20 GHz to 50 GHz. In FIG. 2, a point Zsh represents the impedance in a short-circuit state in which the magnitude of the impedance is zero. A point Zop represents the impedance in an open state in which the magnitude of the impedance is infinite. Points Z20 and Z50 respectively represent the impedance at 20 GHz and 50 GHz. A point Z28 is the impedance at a center frequency (28 GHz) of the pass band PB1. A point Z40 is the impedance at a center frequency (40 GHz) of the pass band PB2. A point Z0 represents the reference impedance (50Ω, for example) to be subjected to impedance matching, and is a center point of a Smith chart. When an imaginary component of the impedance is positive, the impedance is inductive, is included in a region above a straight line connecting the point Zsh and the point Zop in a Smith chart, and has inductive reactance. When the imaginary component of the impedance is negative, the impedance is capacitive, is included in a region below a straight line connecting the point. Zsh and the point Zop in a Smith chart, and has capacitive reactance. Note that the same applies to the Smith charts described in Embodiment 1.

As illustrated in FIG. 2, the impedance (point Z28) at the center frequency of the pass band PB1 is inductive. The impedance (point Z40) at the center frequency of the pass band PB2 is capacitive. The impedance in the pass bands PB1 and PB2, and the point Z0 (reference impedance) are included in a region Rg1. The region Rg1 is a region in a Smith chart corresponding to frequencies included in each of the pass bands PB1 and PB2, for example. The same applies to regions Rg2, Rg3, Rg4, Rg5, and Rg6 described in Embodiment 1 and Modification 1 to Modification 5 thereof.

Figure 3:
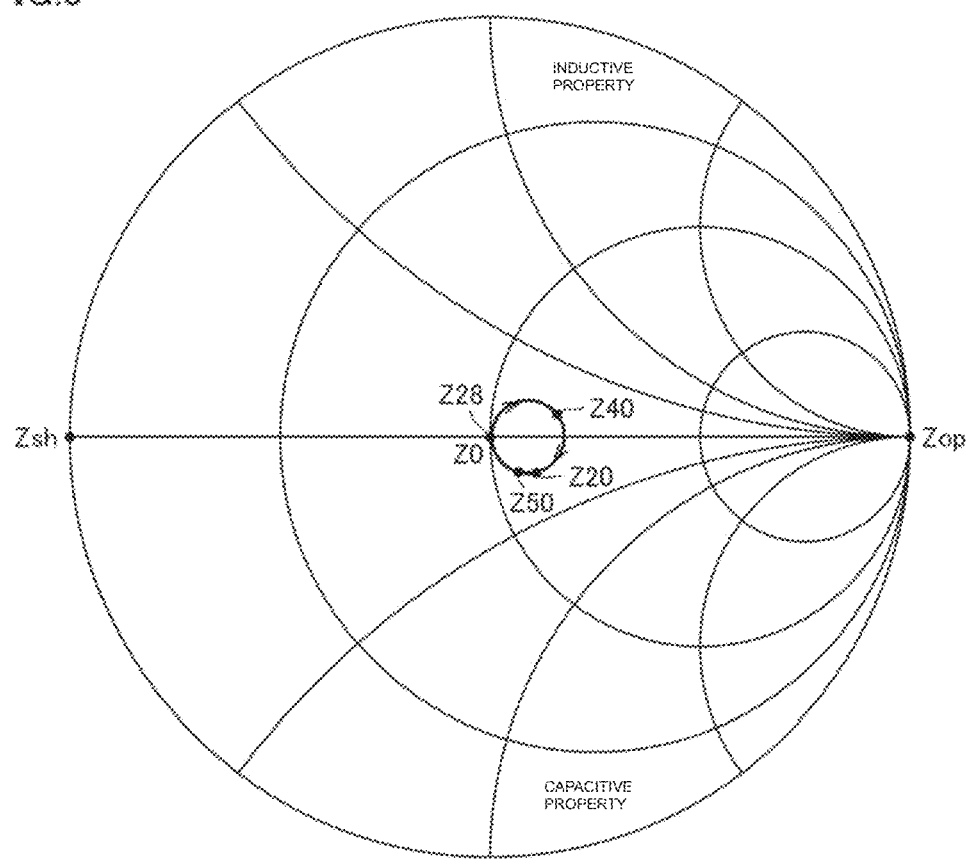
FIG. 3 is a Smith chart illustrating a frequency characteristic of impedance of a common line alone viewed from a common terminal in FIG. 1.

FIG. 3 is a Smith chart illustrating a frequency characteristic of the impedance (first impedance) of the common line 10 alone viewed from the common terminal P10 in FIG. 1. As illustrated in FIG. 3, the impedance (point Z28) at the center frequency of the pass band PB1 substantially coincides with the point Z0, whereas the impedance (Z40) at the center frequency of the pass band PB2 is inductive. The impedance of the common line 10 is distributed between the point Zop and a straight line that is orthogonal to a straight line connecting the points Zsh and Zop and passes through the point Z0. That is, the magnitude of the impedance of the common line 10 is larger than the magnitude of the reference impedance. FIG. 3 illustrates a case that the magnitude of the reference impedance is 50Ω and the magnitude of the impedance of the common line 10 is 60Ω.

Figure 4:
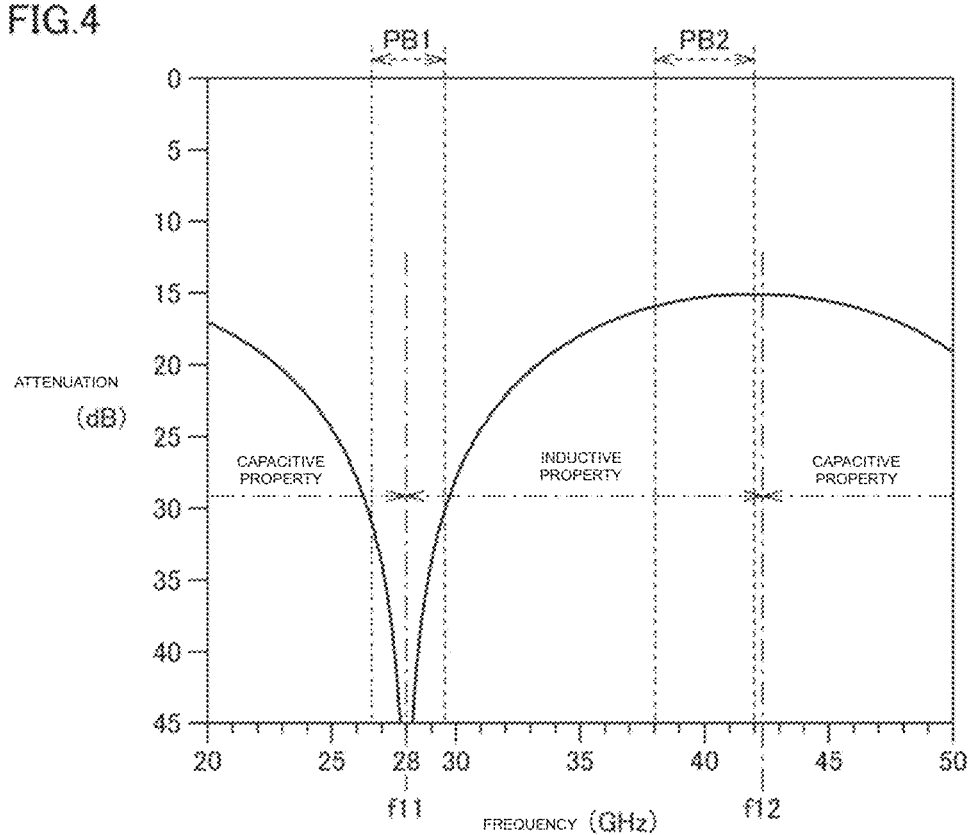
FIG. 4 is a graph illustrating a reflection characteristic of the common line in FIG. 1.

FIG. 4 is a graph illustrating a reflection characteristic of the common line 10 in FIG. 1. In the reflection characteristic, the closer the impedance is to the center of a Smith chart, the larger the attenuation is. As illustrated in FIG. 4, the attenuation of the reflection characteristic is maximum at a frequency f11 and minimum at a frequency f12 (>f11) in a frequency band from 20 GHz to 50 GHz. When the length of the common line 10 is substantially equal to the length of one of the multiple distributed constant lines included in the distributed constant filter 11, the frequency f11 being a resonant frequency is included in the pass band PB1 and is substantially equal to 28 GHz being the center frequency of the pass band PB1. The frequency f12 is higher than the pass band PB2. The reflection characteristic of the common line 10 is repeated at a period of a constant frequency interval. The frequency interval between the frequency f12 and f11 is one half of the period. The impedance of the common line 10 alternately repeats being inductive and being capacitive with the frequency interval between the frequency f12 and f11. When the magnitude of the impedance of the common line 10 is larger than the magnitude of the reference impedance, the impedance of the common line 10 becomes inductive in a frequency band from a frequency at which the attenuation becomes maximum to a frequency at which the attenuation becomes minimum, and the impedance of the common line 10 becomes capacitive in a frequency band from the frequency at which the attenuation becomes minimum to the frequency at which the attenuation becomes maximum. In the frequency band from 20 GHz to 50 GHz, the impedance of the common line 10 is capacitive in a frequency band from 20 GHz to the frequency f11, inductive in a frequency band from the frequency f11 to the frequency f12, and capacitive in a frequency band from the frequency f12 to 50 GHz. The impedance of the common line 10 is capacitive or inductive in the pass band PB1 and is inductive in the pass band PB2. That is, in the multiplexer 1, satisfied is a condition (second condition) that in the pass band PB2 the impedance of the common line 10 alone viewed from the common terminal P10 includes an inductive property and the impedance of the LC filter 12 viewed from the common connection node N10 includes a capacitive property.

Figure 5:
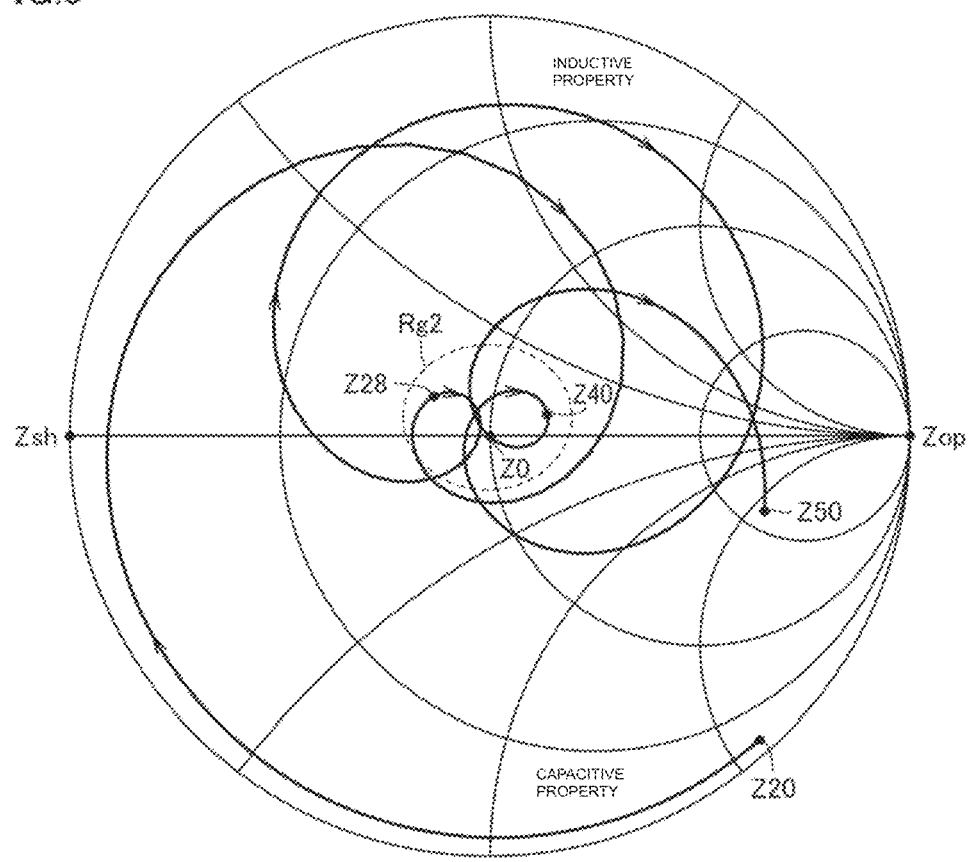
FIG. 5 is a Smith chart illustrating a frequency characteristic of impedance when the input/output terminal is viewed from the common terminal in FIG. 1.

FIG. 5 is a Smith chart illustrating a frequency characteristic of the impedance when the input/output terminals P11 and P12 are viewed from the common terminal P10 in FIG. 1. The frequency characteristic of the impedance illustrated in FIG. 5 is obtained by adding the influence of the frequency characteristic of the impedance of the common line 10 illustrated in FIG. 3 to the frequency characteristic of the impedance in FIG. 2. With reference to FIG. 2, FIG. 3, and FIG. 5, since the impedance of the common line 10 in the pass band PB2 has an inductive property different from the capacitive property in the impedance of the LC filter 12, the capacitive property in the impedance of the LC filter 12 in the pass band PB2 is weakened. As a result, the impedance in the pass bands PB1 and PB2 and the point Z0 are included in the region Rg2 that is smaller than the region Rg1. That is, in the pass bands PB1 and PB2, the frequency characteristic of the impedance illustrated in FIG. 2 is matched with the reference impedance by the common line 10.

Figure 6:
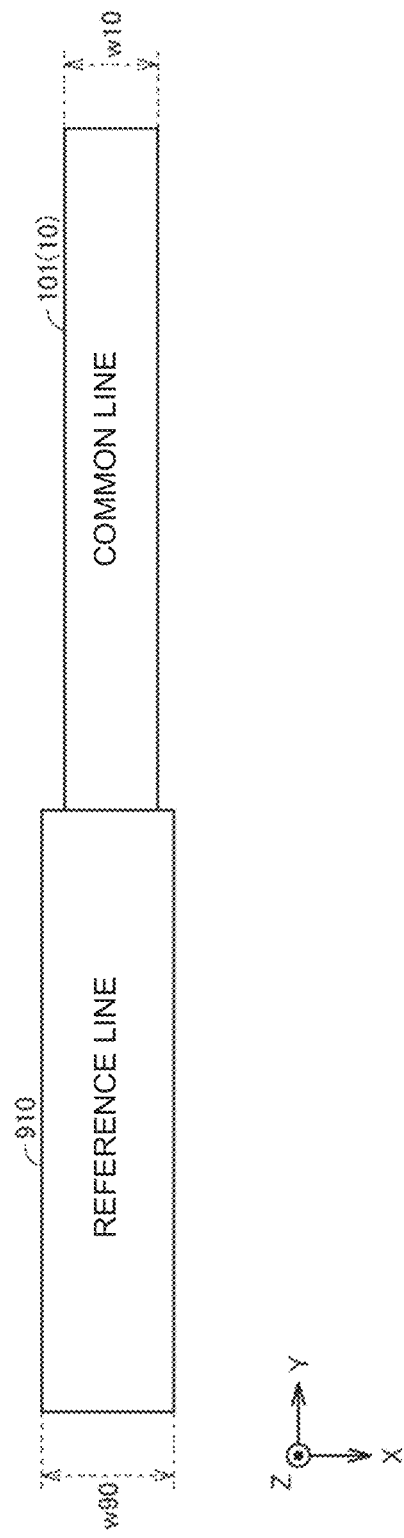
FIG. 6 is a diagram illustrating an example of a structure relating to the common line when the magnitude of the impedance of the common line in FIG. 1 is larger than the magnitude of a reference impedance.
Figure 7:
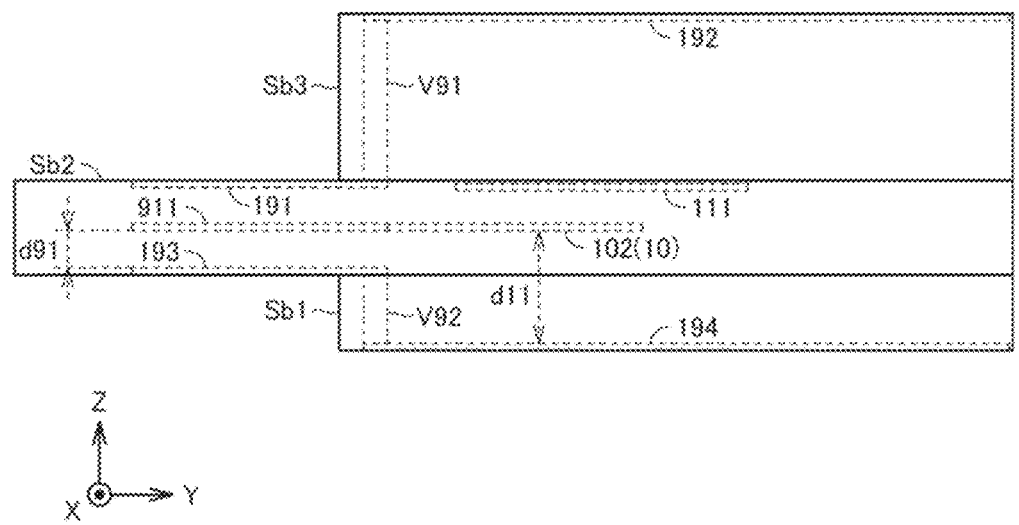
FIG. 7 is a diagram illustrating another example of a structure relating to the common line when the magnitude of the impedance of the common line in FIG. 1 is larger than the magnitude of the reference impedance.
Figure 8:
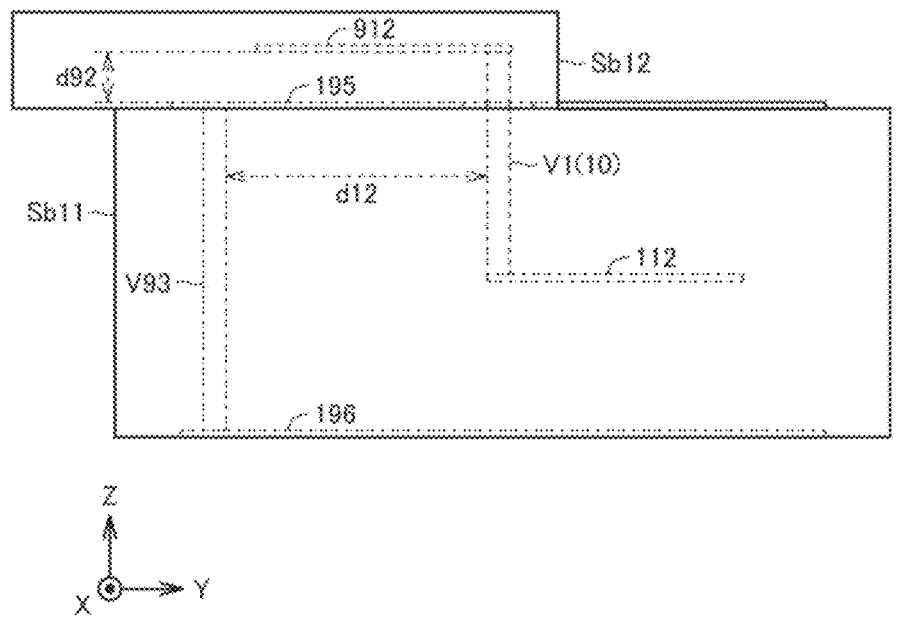
FIG. 8 is a diagram illustrating yet another example of a structure relating to the common line when the magnitude of the impedance of the common line in FIG. 1 is larger than the magnitude of the reference impedance.

In Embodiment 1, there has been described a case that the magnitude of the impedance of the common line 10 is larger than the magnitude of the reference impedance. Hereinafter, there will be described a specific structure of the common line 10 when the magnitude of the impedance of the common line 10 is larger than the magnitude of the reference impedance, with reference to FIG. 6, FIG. 7, and FIG. 8. FIG. 6 and FIG. 7 illustrate a case that the common line 10 is formed as a line pattern, and FIG. 8 illustrates a case that the common line 10 is formed as a via conductor. Note that, in FIG. 6 to FIG. 8, in order to emphasize a characteristic structure causing the larger magnitude of the impedance of the common line 10 than the reference impedance, structures of the multiplexer 1 other than the characteristic structure are not illustrated.

FIG. 6 is a diagram illustrating an example of a structure of the common line 10 when the magnitude of the impedance of the common line 10 in FIG. 1 is larger than the magnitude of the reference impedance. In FIG. 6, the X-axis, the Y-axis, and the Z-axis are orthogonal to each other. The same applies to FIG. 7 and FIG. 8.

As illustrated in FIG. 6, a line pattern 101 extends in the Y-axis direction and forms the common line 10. One end of the line pattern 101 is connected to a line pattern 910 extending in the Y-axis direction. The line pattern 910 (reference line) is formed outside the multiplexer 1 and has the reference impedance. The impedance of the multiplexer 1 is matched with the impedance of the line pattern 910. The width w10 of the line pattern 101 in the X-axis direction is narrower than the width w90 of the line pattern 910 in the X-axis direction. With this, the impedance of the line pattern 101 (common line 10) is larger than the reference impedance.

FIG. 7 is a diagram illustrating another example of a structure of the common line 10 when the magnitude of the impedance of the common line 10 in FIG. 1 larger than the magnitude of the reference impedance. A line pattern P11 (reference line), ground electrodes 191, 192, 193, and 194, and via conductors V91 and V92 in FIG. 7 are formed outside the multiplexer 1.

As illustrated in FIG. 7, substrates Sb1, Sb2, and Sb3 are laminated in this order in the Z-axis direction. The ground electrode 194 and the via conductor V92 are formed in the substrate Sb1. The ground electrodes 191 and 193, and line patterns 102, 111, and 911 are formed in the substrate Sb2. The ground electrode 192 and the via conductor V91 are formed in the substrate Sb3. The substrate Sb2 in which the line pattern 911 is formed includes a flexible substrate. The width (thickness) of the substrate Sb2 in the Z-axis direction is thinner than each of the thicknesses of the substrates Sb1 and Sb3. Note than the substrates Sb1 to Sb3 do not need to be formed as separate substrates and may be formed as an integrated substrate.

The ground electrodes 191 and 193 are disposed between the Ground electrodes 192 and 194 in the Z-axis direction. The Ground electrodes 191 and 192 are connected to each other by the via conductor V91 extending in the Z-axis direction. The ground electrodes 193 and 194 are connected to each other by the via conductor V92 extending in the Z-axis direction. The ground electrodes 191 to 194, and the via conductors V91 and V92 are respectively grounded and form a ground electrode portion.

The line pattern 911 extends in the Y-axis direction and is disposed between the ground electrodes 191 and 193. The line Pattern 911 has the reference impedance.

The line pattern 102 extends in the Y-axis direction and forms the common line 10. The line pattern 102 is disposed between the ground electrodes 192 and 194. One end of the line pattern 102 is connected to the line pattern 911. The line pattern 111 extends in the Y-axis direction and forms a distributed constant line included in the distributed constant filter 11. The line pattern 111 is disposed between the line pattern 102 and the ground electrode 192. The line pattern 102 faces the line pattern 111 in the Z-axis direction. The line pattern 102 is capacitively coupled to the line pattern 111.

A distance d11 between the line pattern 102 and the ground electrode 194 is longer than the distance d91 between the line pattern 911 and the ground electrode 193. With this, the impedance of the line pattern 102 (common line 10) is larger than the reference impedance.

FIG. 8 is a diagram illustrating yet another example of a structure of the common line 10 when the magnitude of the impedance of the common line 10 in FIG. 1 is larger than the magnitude of the reference impedance. A line pattern 912 (reference line), ground electrodes 195 and 196, and a via conductor V93 illustrated in FIG. 8 are formed outside the multiplexer 1.

As illustrated in FIG. 8, substrates Sb11 and Sb12 are laminated in this order in the Z-axis direction. The ground electrode 196, the via conductor V93, part of a via conductor V1, and a line pattern 112 are formed in the substrate Sb11. Part of the ground electrode 195, part of the via conductor V1, and the line pattern 912 are formed in the substrate Sb12. The substrate Sb12 in which the line pattern 912 is formed includes a flexible substrate. The thickness of the substrate Sb12 in the Z-axis direction is thinner than the thickness of the substrate Sb11. The substrates Sb11 and Sb12 do not need to be formed as separate substrates and may be formed as an integrated substrate.

The ground electrodes 195 and 196 are connected by the via conductor V93 extending in the Z-axis direction. The ground electrodes 195 and 196, and the via conductor V93 are respectively grounded and form a ground electrode portion.

The line pattern 912 extends in the Y-axis direction and is disposed on a side opposite to the extending direction of the via conductor V93 with respect to the ground electrode 195. The line pattern 912 has the reference impedance.

The line pattern 112 extends in the Y-axis direction and is disposed between the ground electrodes 195 and 196. The line pattern 112 forms a distributed constant line included in the distributed constant filter 11. The via conductor V1 extends in the Z-axis direction, penetrates through the ground electrode 195, and connects the line patterns 912 and 112. The via conductor V1 forms the common line 10. Note that the via conductor V1 and the ground electrode 195 are electrically insulated from each other.

A distance d12 between the via conductors V1 and V93 is longer than a distance d92 between the line pattern 912 and the Ground electrode 195. With this, the magnitude of the impedance of the via conductor V1 (common line 10) is larger than the magnitude of the reference impedance.

Modification 1 of Embodiment 1

In Embodiment 1, there has been described the impedance matching of a multiplexer when a filter is viewed from a common terminal. In Modification 1 of Embodiment 1, there will be described the impedance matching when a filter is viewed from an input/output terminal.

Figure 9:
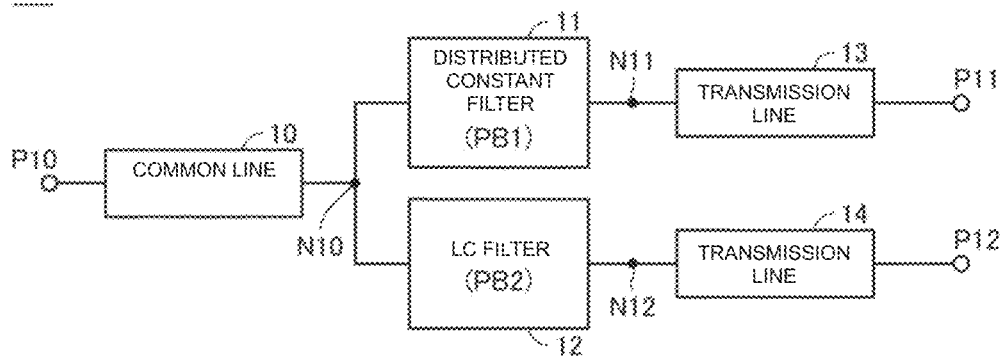
FIG. 9 is a functional block diagram illustrating a configuration of a multiplexer according to Modification 1 of Embodiment 1.

FIG. 9 is a functional block diagram illustrating a configuration of a multiplexer 1A according to Modification 1 of Embodiment 1. The multiplexer 1A has a configuration in which a transmission line 13 (first line) and a transmission line 14 (second line) are added to the multiplexer 1 in FIG. 1. Since other configurations are the same, a description thereof will not be repeated.

As illustrated in FIG. 9, the transmission line 13 is connected between the distributed constant filter 11 and the input/output terminal P11. The transmission line 14 is connected between the LC filter 12 and the input/output terminal P12. Each of the length of the transmission line 13 and the length of the transmission line 14 is substantially the same as the length of one of the multiple distributed constant lines included in the distributed constant filter 11. With this, each of a frequency characteristic of the impedance of the transmission line 13 alone viewed from the input/output terminal P11 and a frequency characteristic of the impedance of the transmission line 14 alone viewed from the input/output terminal P12 is substantially the same as the frequency characteristic of the impedance of the common line 10 in FIG. 3. That is, the impedance of each of the transmission lines 13 and 14 at the center frequency of the pass band PB1 substantially coincides with the center of a Smith chart, whereas the impedance of each of the transmission lines 13 and 14 at the center frequency of the pass band PB2 includes an inductive property. Note that the transmission line 13 may be capacitively coupled to each of the distributed constant filter 11 and the input/output terminal P11. The transmission line 14 may be capacitively coupled to each of the LC filter 12 and the input/output terminal P12.

Figure 10:
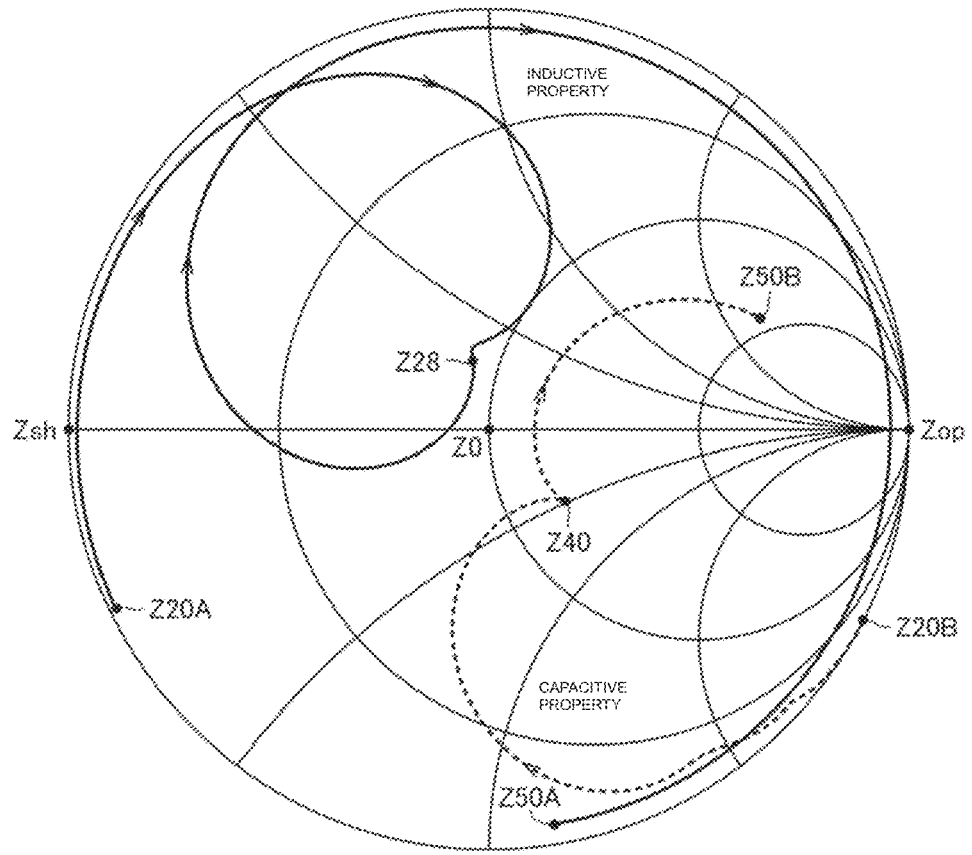
FIG. 10 is a diagram illustrating both a frequency characteristic (solid line) of the impedance of a distributed constant filter viewed from a connection node between the distributed constant filter and a transmission line in FIG. 9, and a frequency characteristic (dotted line) of the impedance of an LC filter viewed from a connection node between the LC filter and a transmission line in FIG. 9.

FIG. 10 is a chart illustrating both a frequency characteristic (solid line) of the impedance of the distributed constant filter 11 viewed from the connection node N11 between the distributed constant filter 11 and the transmission line 13 in FIG. 9, and a frequency characteristic (dotted line) of the impedance of the LC filter 12 viewed from the connection node N12 between the LC filter 12 and the transmission line 14 in FIG. 9. In FIG. 10, points Z20A and Z50A respectively represent the impedance at 20 GHz and 50 GHz when the distributed constant filter 11 is viewed from the connection node N11. Points Z20B and Z50B respectively represent the impedance at 20 GHz and 50 GHz when the LC filter 12 is viewed from the connection node N12. The same applies to FIG. 11 to be described after FIG. 10.

As illustrated in FIG. 10, the impedance (Z28) at the center frequency of the pass band PB1 is inductive. The impedance (Z40) at the center frequency of the pass band PB2 is capacitive.

Figure 11:
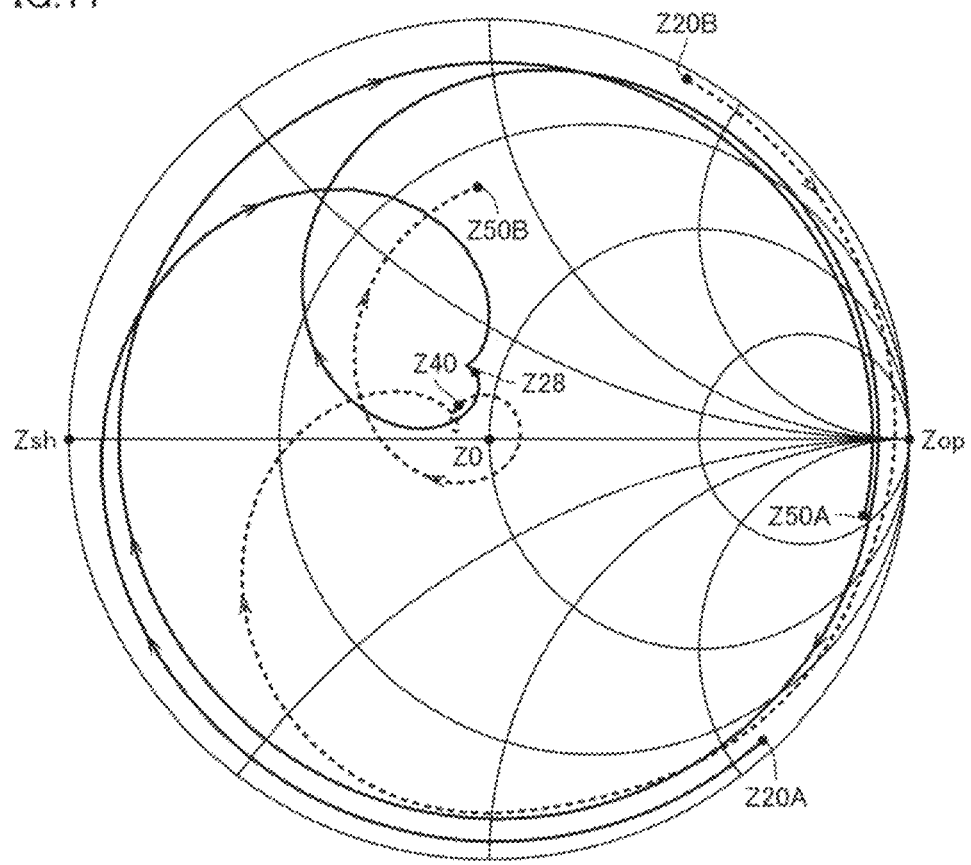
FIG. 11 is a diagram illustrating both a frequency characteristic (solid line) of the impedance of the distributed constant filter viewed from a first input/output terminal in FIG. 9, and a frequency characteristic (dotted line) of the impedance of the LC filter viewed from a second input/output terminal in FIG. 9.

FIG. 11 is a graph illustrating both a frequency characteristic (solid line) of the impedance of the distributed constant filter 11 viewed from the input/output terminal P11 in FIG. 9, and a frequency characteristic (dotted line) of the impedance of the LC filter 12 viewed from the input/output terminal P12 in FIG. 9. The frequency characteristic of the impedance illustrated in FIG. 11 is obtained by adding the influence of the frequency characteristic of the impedance of the transmission lines 13 and 14 to the frequency characteristic of the impedance in FIG. 10. With reference to FIG. 10 and FIG. 11, the impedance (point Z28) at the center frequency of the pass band PB1 is inductive both in FIG. 10 and FIG. 11, because the impedance of the transmission line 13 in the pass band PB1 includes inductive property or capacitive property. Whereas, since the impedance of the transmission line 14 in the pass band PB2 has an inductive property different from the capacitive property in the impedance of the LC filter 12, the capacitive property in the impedance of the LC filter 12 in the pass band PB2 is weakened. With this, the impedance of the LC filter 12 in the pass band PB2 becomes closer to the point Z0 than in the case illustrated in FIG. 10. That is, in the pass bands PB1 and PB2, the impedance illustrated in FIG. 10 is matched with the reference impedance with the transmission lines 13 and 14.

Modification 2 of Embodiment 1

In Embodiment 1 and Modification 1 of Embodiment 1, there has been described a case that the impedance of the common line 10 in the pass band PB1 includes an inductive property or a capacitive property. In Modification 2 of Embodiment 1, there will be described a case that the impedance of the common line 10 includes a capacitive property in the pass band PB1.

Figure 12:
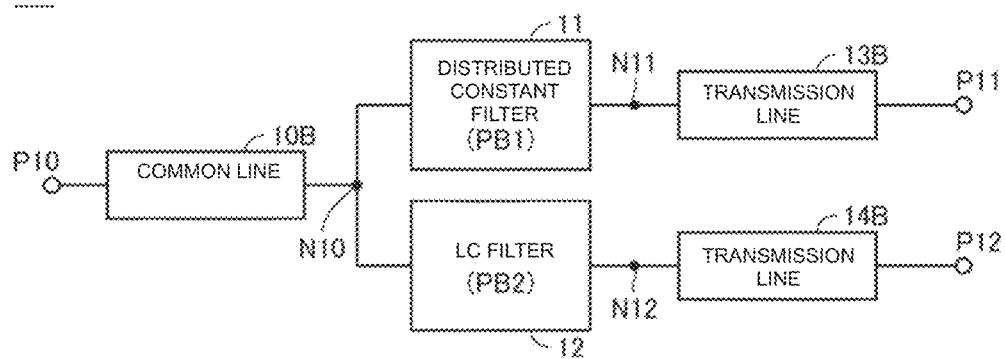
FIG. 12 is a functional block diagram illustrating a configuration of a multiplexer according to Modification 2 of Embodiment 1.

FIG. 12 is a functional block diagram illustrating a configuration of a multiplexer 1B according to Modification 2 of Embodiment 1. The multiplexer 1B has a configuration in which the common line 10, and the transmission lines 13 and 14 of the multiplexer 1A in FIG. 9 are respectively replaced with a common line 10B, a transmission line 13B (first line), and a transmission line 14B (second line). Each of the common line 10B, the transmission line 13B, and the transmission line 14B is shorter than one of the multiple distributed constant lines included in the distributed constant filter 11. Each of the length of the transmission line 13B and the length of the transmission line 14B is substantially the same as the length of the common line 10B. Since other configurations are the same, a description thereof will not be repeated.

Figure 13:
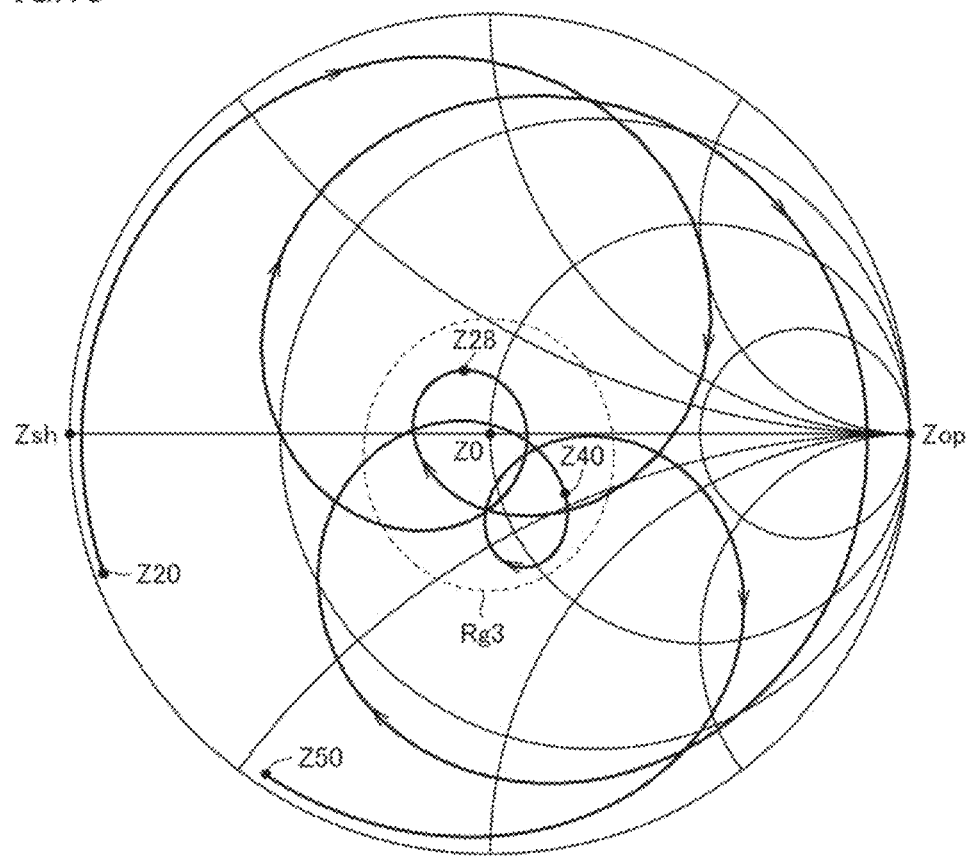
FIG. 13 is a Smith chart illustrating a frequency characteristic when an input/output terminal is viewed from a common connection node in FIG. 12.

FIG. 13 is a Smith chart illustrating a frequency characteristic of the impedance when the input/output terminals P11 and P12 are viewed from the common connection node N10 in FIG. 12. As illustrated in FIG. 13, the impedance (point Z28) at the center frequency of the pass band PB1 is inductive. The impedance (point Z40) at the center frequency of the pass band PB2 is capacitive. The impedance in the pass bands PB1 and PB2 and the point Z0 are included in the region Rg3.

Figure 14:
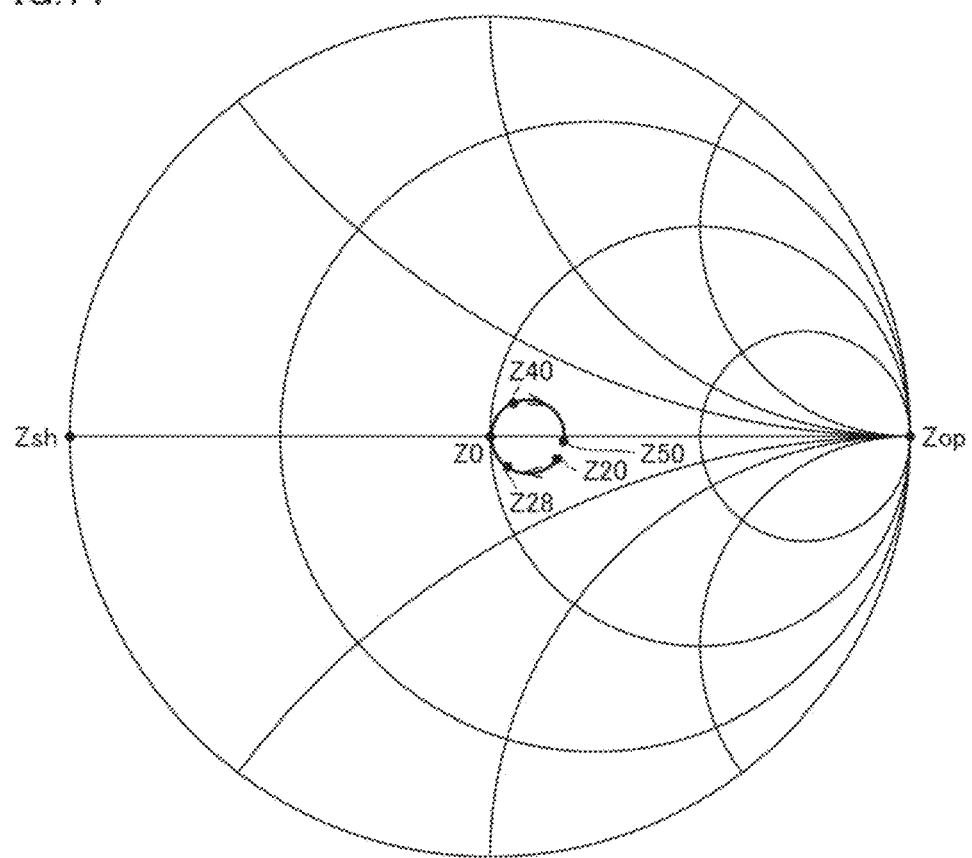
FIG. 14 is a Smith chart illustrating a frequency characteristic of the impedance of a common line alone viewed from a common terminal in FIG. 12.

FIG. 14 is a Smith chart illustrating a frequency characteristic of the impedance of the common line 10B alone viewed from the common terminal P10 in FIG. 12. As illustrated in FIG. 14, the impedance (point Z28) at the center frequency of the pass band PB1 is capacitive. The impedance (Z40) at the center frequency of the pass band PB2 inductive. Note that each of a frequency characteristic of the impedance of the transmission line 13B alone viewed from the input/output terminal P11 and a frequency characteristic of the impedance of the transmission line 14B alone viewed from the input/output terminal P12 is substantially the same as the frequency characteristic of the impedance of the common line 10B illustrated in FIG. 14.

Figure 15:
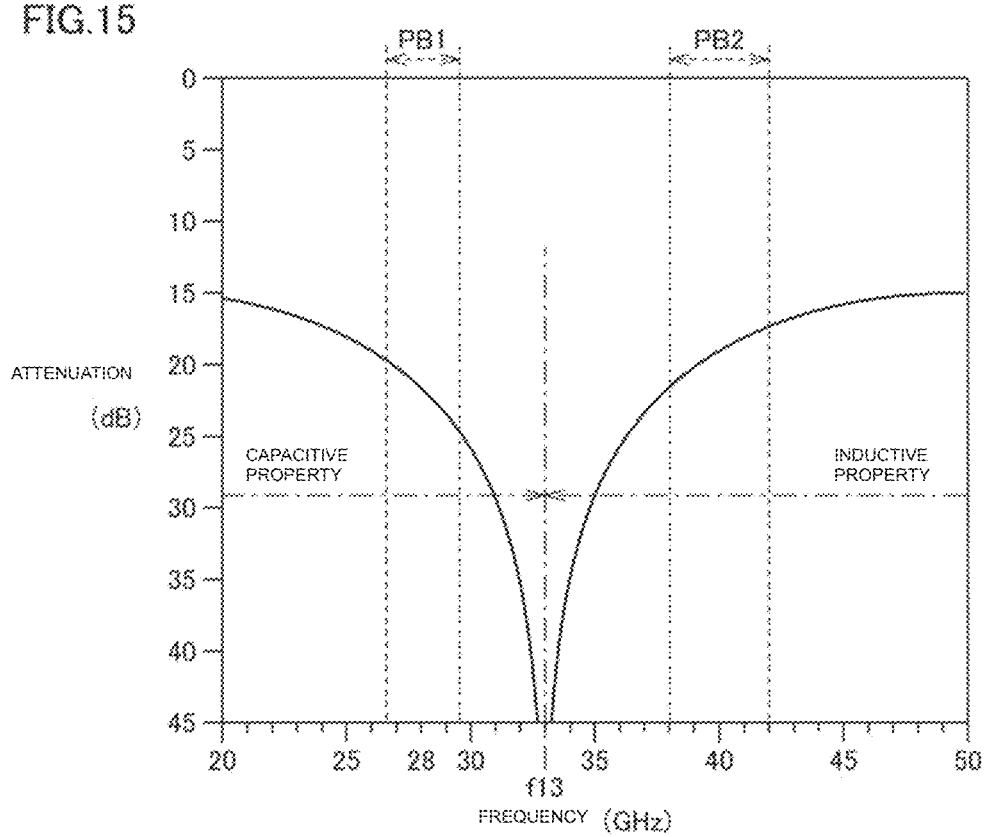
FIG. 15 is a graph illustrating a reflection characteristic of the common line in FIG. 12.

FIG. 15 is a graph illustrating a reflection characteristic of the common line 10B in FIG. 12. As illustrated in FIG. 15, in the frequency band from 20 GHz to 50 GHz, the attenuation of the reflection characteristic becomes maximum at a frequency f13. The frequency f13 is higher than the pass band PB1 and lower than the pass band PB2. Since the common line 10B is shorter than one of the multiple distributed constant lines included in the distributed constant filter 11, the wavelength of a signal that resonates in the common line 10B becomes shorter. As a result, the frequency f13 being the resonant frequency of the common line 10B is made higher than the pass band PK. In the frequency band from 20 GHz to 50 GHz, the impedance of the common line 10B is capacitive in a frequency band from 20 GHz to the frequency f13 and is inductive in a frequency band from the frequency f13 to 50 GHz. The impedance of the common line 10B is capacitive in the pass band PB1 and inductive in the pass band PB2. That is, in the multiplexer 1B, both a first condition and a second condition as follows are satisfied. The first condition is that in the pass band PB1 the impedance of the common line 10B alone viewed from the common terminal P10 includes a capacitive property, and the impedance of the distributed constant filter 11 viewed from the common connection node N10 includes an inductive property. The second condition is that in the pass band PB2 the impedance of the common line 10B alone viewed from the common terminal P10 includes an inductive property, and the impedance of the LC filter 12 viewed from the common connection node N10 includes a capacitive property.

When the magnitude of the impedance of a common line is larger than the magnitude of the reference impedance like the common line 10B, the resonant frequency of the common line may be a frequency between the pass bands PB1 and PB2. That is, it is acceptable that the length of the common line is shorter than one of the multiple distributed constant lines included in the distributed constant filter 11 and is longer than one of the electrode patterns (lines) included in the LC filter 12.

Note that each of the frequency characteristic of the impedance of the transmission line 13B alone viewed from the input/output terminal P11 and the frequency characteristic of the impedance of the transmission line 14B alone viewed from the input/output terminal P12 is substantially the same as the frequency characteristic of the impedance of the common line 10B illustrated in FIG. 14. Further, a reflection characteristic of the transmission line 13B and a reflection characteristic of the transmission line 14B are substantially the same as the reflection characteristic of the common line 10B illustrated in FIG. 15.

Figure 16:
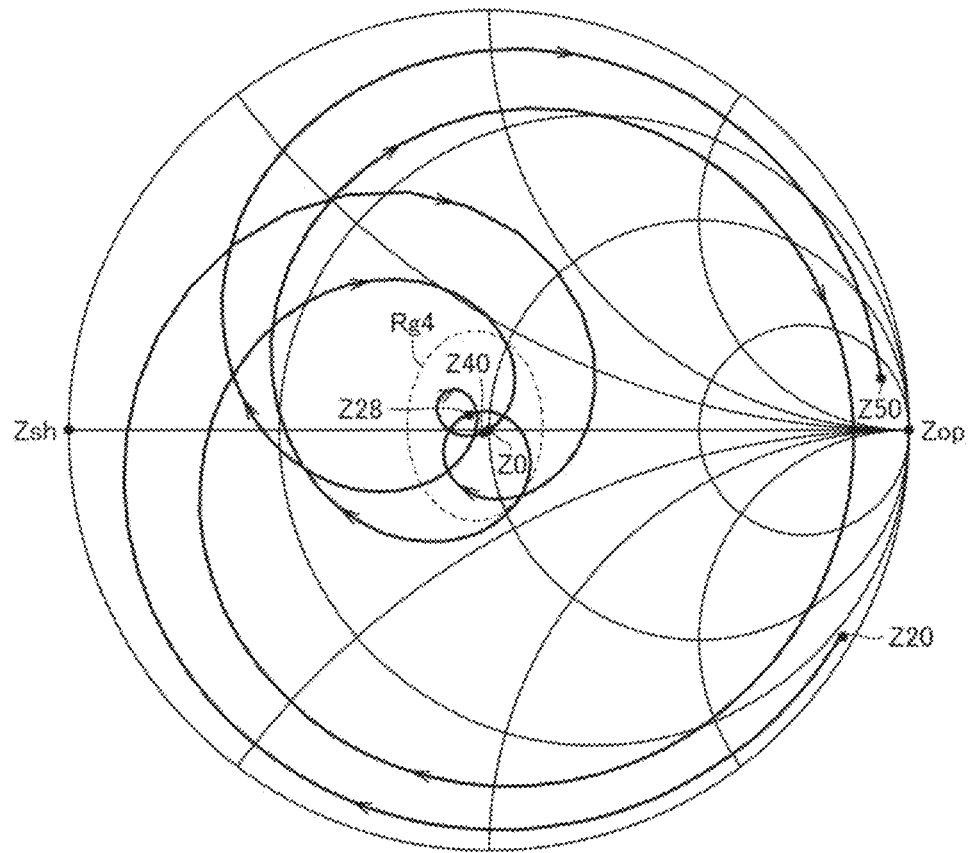
FIG. 16 is a Smith chart illustrating a frequency characteristic of the impedance when the input/output terminal is viewed from the common terminal in FIG. 12.

FIG. 16 is a Smith chart illustrating a frequency characteristic of the impedance when the input/output terminals P11 and P12 are viewed from the common terminal P10 in FIG. 12. The frequency characteristic of the impedance illustrated in FIG. 16 is obtained by adding the influence of the frequency characteristic of the impedance of the common line 10B illustrated in FIG. 14 to the frequency characteristic or the impedance illustrated in FIG. 13. With reference to FIG. 13, FIG. 14, and FIG. 16, the impedance (point Z28) at the center frequency of the pass band PB1 is closer to the point Z0 in FIG. 16 than in FIG. 13. This is because the impedance of the common line 10B includes a capacitive property in the pass band PB1, and the inductive property of the impedance of the distributed constant filter 11 in the pass band PB1 is weakened therewith. The impedance (point Z40) at the center frequency of the pass band PB2 closer to the point Z0 in FIG. 16 than in FIG. 13. This is because the impedance of the common line 10B includes an inductive property in the pass band PB2, and the capacitive property of the impedance of the LC filter 12 in the pass band PB2 is weakened therewith. As a result, the impedance in the pass bands PB1 and PB2 and the point Z0 are included in the region Rg4 that is smaller than the region Rg3. That is, in the pass bands PB1 and PB2, the frequency characteristic of the impedance illustrated in FIG. 13 is matched with the reference impedance with the common line 10B.

Since the impedance of the transmission line 13B in the pass band PB1 includes a capacitive property different from that of the impedance of the distributed constant filter 11, the inductive property of the impedance of the distributed constant filter 11 in the pass band PB1 is weakened. As a result, the impedance of the distributed constant filter 11 in the pass band PB1 is matched with the point Z0. Further, since the impedance of the transmission line 14B in the pass band PB2 includes an inductive property different from that of the impedance of the LC filter 12, the capacitive property of the impedance of the LC filter 12 in the pass band PB2 is weakened. As a result, the impedance of the LC filter 12 in the pass band PB2 is matched with the point Z0.

Modification 3 of Embodiment 1

In Embodiment 1, and Modification 1 and Modification 2 of Embodiment 1, there has been described a case that the magnitude of the impedance of a common line is larger than the magnitude of the reference impedance. In Modification 3 of Embodiment 1, there will be described a case that the magnitude of the impedance of a common line is smaller than the magnitude of the reference impedance.

Figure 17:
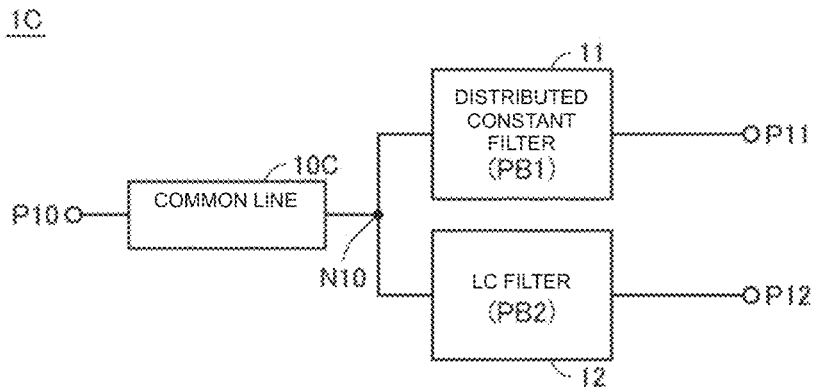
FIG. 17 is a functional block diagram illustrating a configuration of a multiplexer according to Modification 3 of Embodiment 1.

FIG. 17 is a functional block diagram illustrating a configuration of a multiplexer 1C according to Modification 3 of Embodiment 1. The multiplexer 1C has a configuration in which the common line 10 of the multiplexer 1 in FIG. 1 is replaced with a common line 10C. A length of the common line 10C is shorter than one of the multiple distributed constant lines included in the distributed constant filter 11. Since other configurations are the same, a description thereof will not be repeated.

Figure 18:
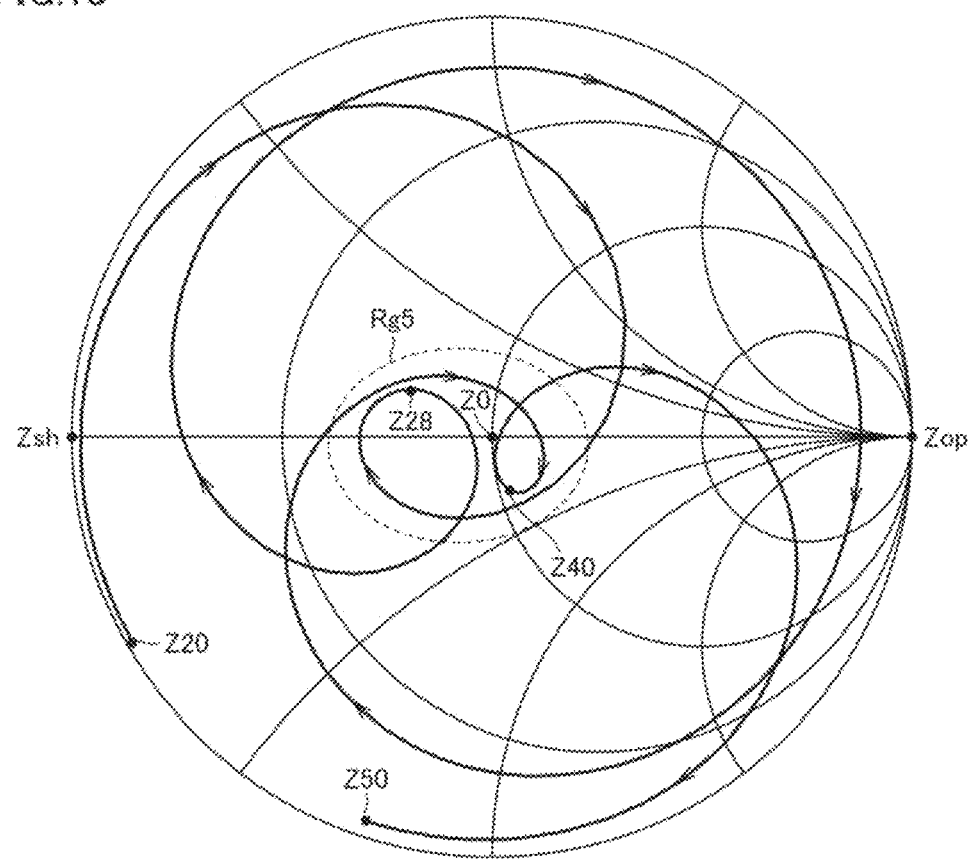
FIG. 18 is a smith chart illustrating a frequency characteristic of the impedance when an input/output terminal is viewed from a common connection node in FIG. 17.

FIG. 18 is a Smith chart illustrating a frequency characteristic of the impedance when the input/output terminals P11 and P12 are viewed from the common connection node N10 in FIG. 17. As illustrated in FIG. 18, the impedance (point Z28) of the distributed constant filter 11 at the center frequency of the pass band PB1 is inductive. The impedance (point Z40) of the LC filter 12 at the center frequency of the pass band PB2 is capacitive. The impedance of the pass bands PB1 and PB2 and the point Z0 are included in the region Rg5.

Figure 19:
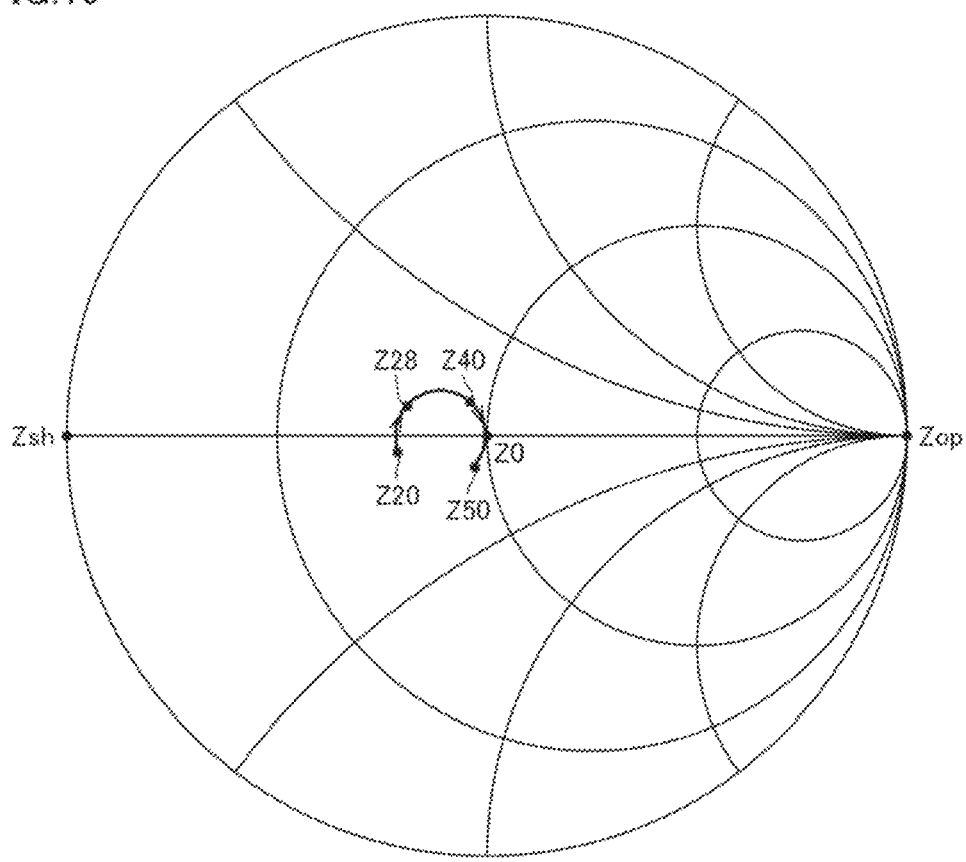
FIG. 19 is a Smith chart illustrating a frequency characteristic of the impedance of a common line alone viewed from a common terminal in FIG. 17.

FIG. 19 is a Smith chart illustrating a frequency characteristic of the impedance of the common line 10C alone viewed from the common terminal P10 in FIG. 17. As illustrated in FIG. 19, the impedance (point Z28) at the center frequency of the pass band PB1 is inductive. The impedance (Z40) at the center frequency of the pass band PB2 is inductive. The impedance of the common line 10C is distributed between the point Zsh and a straight line that is orthogonal to a straight line connecting the points Zsh and Zop and passes through the point Z0. That is, the magnitude of the impedance of the common line 10C is smaller than the magnitude of the reference impedance. FIG. 19 illustrates a case that the magnitude of the reference impedance is 50Ω, and the magnitude of the impedance of the common line 10C is 40Ω.

Figure 20:
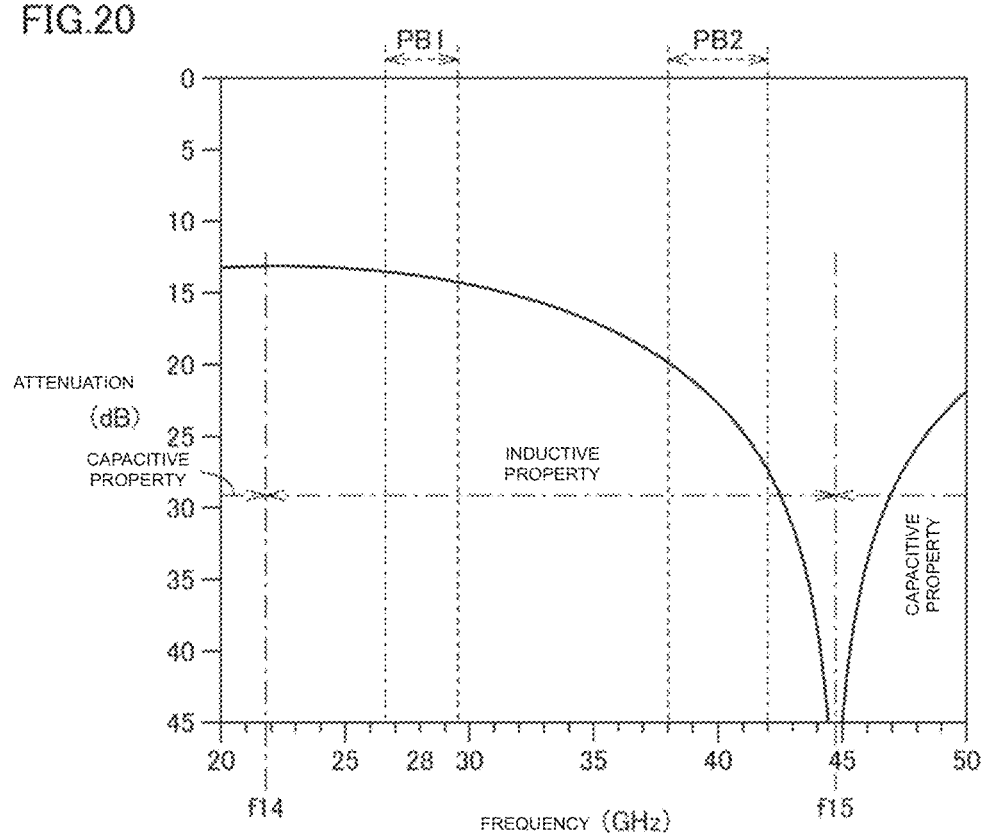
FIG. 20 is a graph illustrating a reflection characteristic of the common line in FIG. 17.

FIG. 20 is a graph illustrating a reflection characteristic of the common line 10C in FIG. 17. As illustrated in FIG. 20, in the frequency band from 20 GHz to 50 GHz, the attenuation of the reflection characteristic is minimum at a frequency f14 and maximum at a frequency f15 (>f14). The frequency, f14 is lower than the pass band PB1. The frequency f15 is higher than the pass band PB2. Since the common line 10C is shorter than one of the multiple distributed constant lines included in the distributed constant filter 11, the wavelength of a signal that resonates in the common line 10C becomes shorter. As a result, the frequency f15 being the resonant frequency of the common line 10C is made higher than the pass band PB2. When the magnitude of the impedance of the common line 10C is smaller than the magnitude of the reference impedance, the following is true. The impedance of the common line 10C is capacitive in a frequency band from a first frequency at which the attenuation becomes maximum to a second frequency at which the attenuation becomes minimum at first in a frequency band higher than the first frequency. The impedance of the common line 10C is inductive in a frequency band from a frequency at which the attenuation becomes minimum to a frequency at which the attenuation becomes maximum. In the frequency band from 20 GHz to 50 GHz, the impedance of the common line 10C is capacitive in a frequency band from 20 GHz to the frequency f14, inductive in a frequency band from the frequency f14 to f15, and capacitive in a frequency band from the frequency f15 to 50 GHz. That is, in the multiplexer 1C, satisfied is a condition (second condition) that in the pass band PB2 the impedance of the common line 10C alone viewed from the common terminal P10 includes an inductive property, and the impedance of the LC filter 12 viewed from the common connection node N10 includes a capacitive property.

Figure 21:
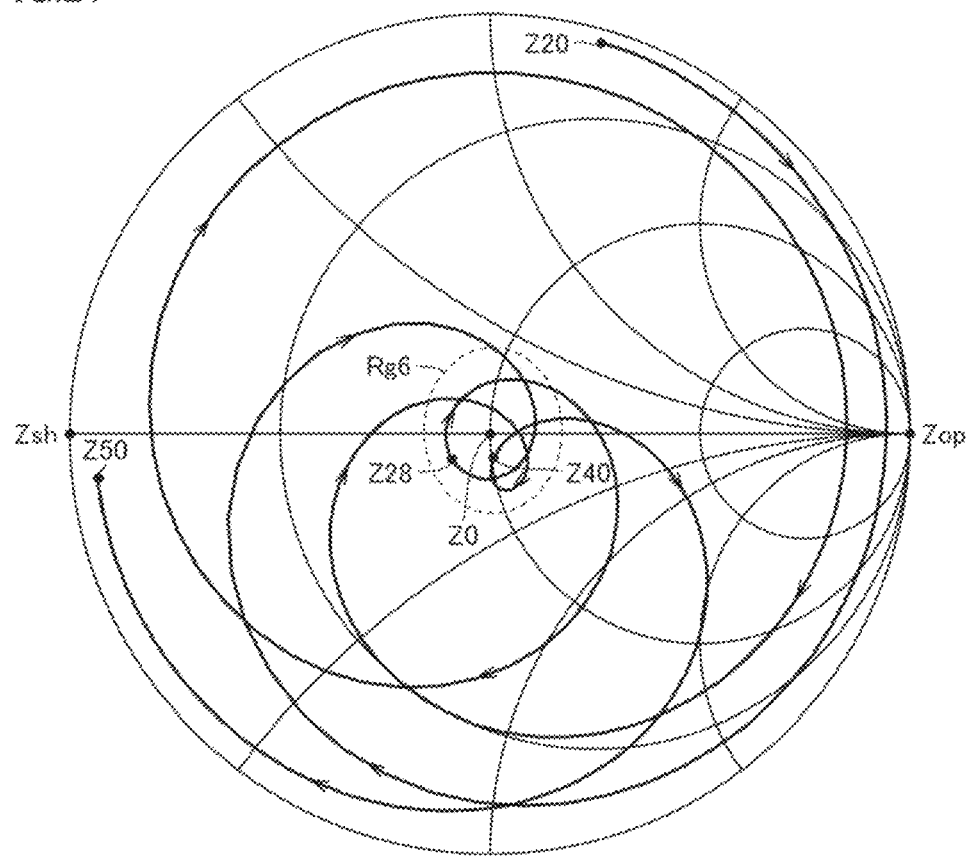
FIG. 21 is a Smith chart illustrating a frequency characteristic of the impedance when the input/output terminal is viewed from the common terminal in FIG. 17.

FIG. 21 is a Smith chart illustrating a frequency characteristic of the impedance when the input/output terminals P11 and P12 are viewed from the common terminal P10 in FIG. 17. The frequency characteristic of the impedance illustrated in FIG. 21 is obtained by add-no the influence of the frequency characteristic of the impedance of the common line 10C illustrated in FIG. 19 to the frequency characteristic of the impedance illustrated in FIG. 18. With reference to FIG. 18, FIG. 19, and FIG. 21, the impedance (point Z40) at the center frequency of the pass band PB2 is closer to the point Z0 in FIG. 21 than in FIG. 18. This is because the impedance of the common line 10C includes an inductive property in the pass band PB2, and the capacitive property of the impedance of the LC filter 12 in the pass band PB2 is weakened therewith. As a result, the impedance of the pass bands PB1 and PB2, and the point Z0 are included in the region Rg6 that is smaller than the region Rg5. That is, in the pass bands PB1 and PB2, the frequency characteristic of the impedance illustrated in FIG. 18 is matched with the reference impedance with the common line 10C.

Figure 22:
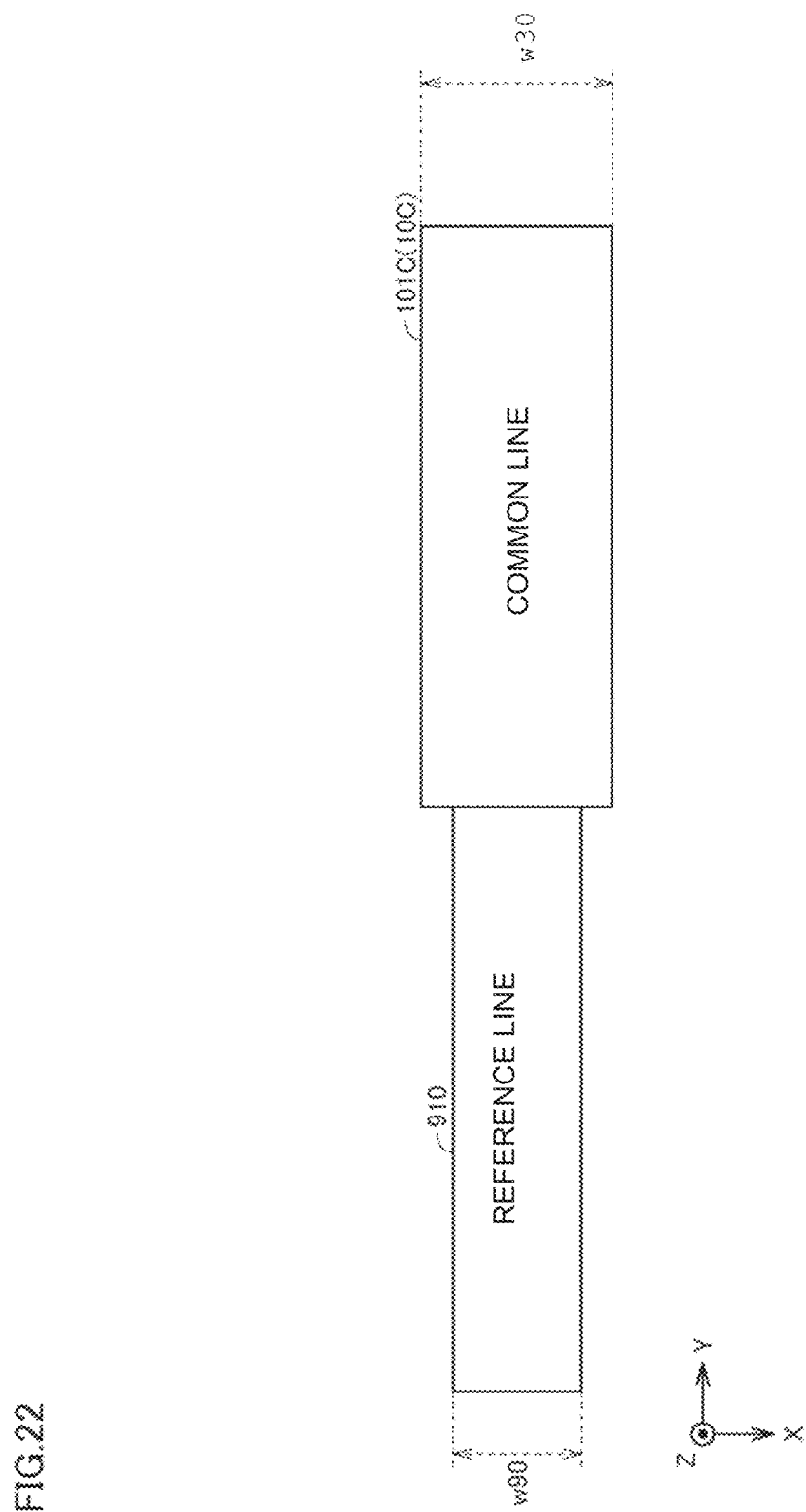
FIG. 22 is a diagram illustrating an example of a structure relating to the common line when the magnitude of the impedance of the common line in FIG. 17 is smaller than the magnitude of a reference impedance.
Figure 23:
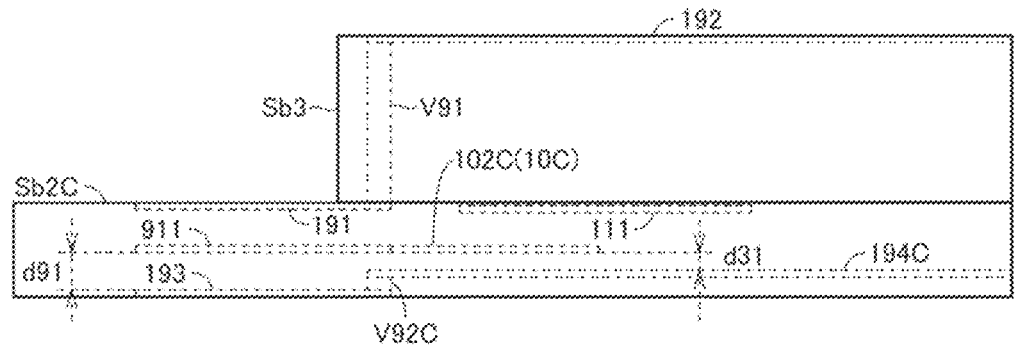
FIG. 23 is a diagram illustrating another example of a structure relating to the common line when the magnitude of the impedance of the common line in FIG. 17 is smaller than the magnitude of the reference impedance.
Figure 24:
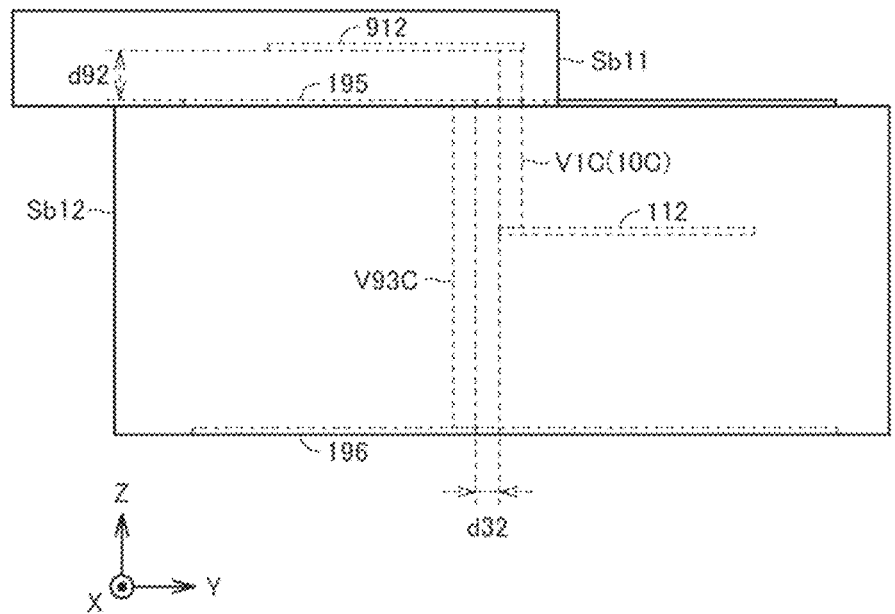
FIG. 24 is a diagram illustrating yet another example of a structure relating to the common line when the magnitude of the impedance of the common line in FIG. 17 is smaller than the magnitude of the reference impedance.

In the Modification 3 of Embodiment 1, there has been described a case that the magnitude of the impedance of the common line 10C is smaller than the magnitude of the reference impedance. Hereinafter, there will be described a specific structure of the common line 10C when the magnitude of the impedance of the common line 10C is smaller than the magnitude of the reference impedance, with reference to FIG. 22, FIG. 23, and FIG. 24. FIG. 22 and FIG. 23 illustrate a case that the common line 10C is formed as a line pattern, and FIG. 24 illustrates a case that the common line 10C is formed as a via conductor. Note that, in FIG. 22 to FIG. 24, in order to emphasize a characteristic structure causing the smaller magnitude or the impedance of the common line 10C than the reference impedance, structures of the multiplexer 1C other than the characteristic structure are not illustrated.

FIG. 22 is a diagram illustrating an example of a structure of the common line 10C when the magnitude of the impedance of the common line 10C in FIG. 17 is smaller than the magnitude of the reference impedance. In FIG. 22, the X-axis, the Y-axis, and the Z-axis are orthogonal to each other. The same applies to FIG. 23 and FIG. 24. In the configuration illustrated in FIG. 22, the line pattern 101 in FIG. 6 is replaced with the line pattern 101C. Since other configurations are the same, a description thereof will not be repeated.

As illustrated in FIG. 22, the line pattern 101C extends in the Y-axis direction and forms the common line 10C. One end of the line pattern 101C is connected to the line pattern 910. The impedance of the multiplexer 1C is matched with the impedance of the line pattern 910. The width w30 of the line pattern 101C in the X-axis direction is wider than the width w90 of the line pattern 910 in the X-axis direction. With this, the magnitude of the impedance of the line pattern 101C (common line 10C) is smaller than the magnitude of the reference impedance.

FIG. 23 is a diagram illustrating another example of a structure of the common line 10C when the magnitude of the impedance of the common line 10C in FIG. 17 is smaller than the magnitude of the reference impedance. In the configuration illustrated in FIG. 23, the via conductor V92, the ground electrode 194, the common line 10, and the substrate Sb2 in FIG. 7 are respectively replaced with a via conductor V92C, a ground electrode 194C, the common line 10C, and a substrate Sb2C, and in addition to that, the substrate Sb1 is removed. Since other configurations are the same, a description thereof will not be repeated.

As illustrated in FIG. 23, in addition to the ground electrodes 191 and 193 and the line patterns 102, 111, and 911, the via conductor V92C and the ground electrode 194C are also formed in the substrate Sb2C. The Ground electrode 194C is disposed between the ground electrodes 191 and 193 in the Z-axis direction. The ground electrodes 193 and 194C are connected with the via conductor V92C extending in the Z-axis direction. The ground electrodes 191, 192, 193, and 194C and the via conductors V91 and V92C are respectively grounded and form a ground electrode portion.

The distance d31 between the line pattern 102C forming the common line 10C and the ground electrode 194C is shorter than the distance d91 between the line pattern 911 and the ground electrode 193. With this, the magnitude of the impedance of the line pattern 102C (common line 10C) is smaller than the magnitude of the reference impedance.

FIG. 24 is a diagram illustrating yet another example of a structure of the common line 10C when the magnitude of the impedance of the common line 10C in FIG. 17 is smaller than the magnitude of the reference impedance. In the configuration illustrated in FIG. 24, the via conductors V93 and V1 in FIG. 8 are respectively replaced with via conductors V93C and V10. Since other configurations are the same, a description thereof will not be repeated.

As illustrated in FIG. 24, the ground electrodes 195 and 196 are connected with the via conductor V93C extending in the Z-axis direction. The ground electrodes 195 and 196 and the via conductor V93C are respectively grounded and form a ground electrode portion.

The via conductor V1C extends in the Z-axis direction, penetrates through the Ground electrode 195, and connects the line patterns 912 and 112. The via conductor V1C forms the common line 10C. Note that the via conductor V1C and the Ground electrode 195 are electrically insulated from each other.

The distance d32 between the via conductors V1C and v shorter than the distance d92 between the line pattern 912 and the ground electrode 195. With this, the magnitude of the impedance of the via conductor V1C (common line 10C) is smaller than the magnitude of the reference impedance.

Modification 4 of Embodiment 1

In Modification 4 of Embodiment 1, the same as in Modification 1 of Embodiment 1, there will be described the impedance matching when a filter is viewed from an input/output terminal with the magnitude of the impedance of a common line being smaller than the magnitude of the reference impedance.

Figure 25:
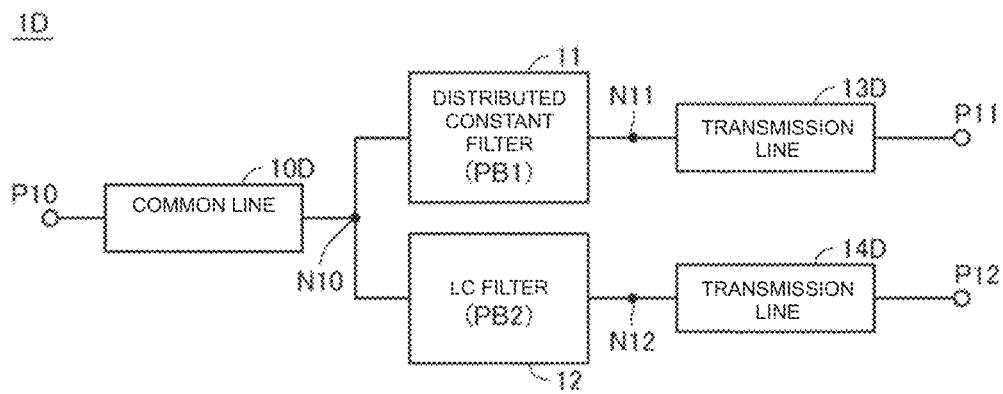
FIG. 25 is a functional block diagram illustrating a configuration of a multiplexer according to Modification 4 of Embodiment 1.

FIG. 25 is a functional block diagram illustrating a configuration of a multiplexer 1D according to Modification 4 of Embodiment 1. The multiplexer 1D has a configuration in which a transmission line 13D (first line) and a transmission line 14D (second line) are added to the multiplexer 1C in FIG. 17. Since other configurations are the same, a description thereof will not be repeated.

The transmission line 13D is shorter than the common line 10D. A length of the transmission line 14D is substantially the same as the length of the common line 10C. A frequency characteristic of the impedance of the transmission line 14D alone viewed from the input/output terminal P12 and a reflection characteristic of the transmission line 14D are substantially the same as the frequency characteristic (FIG. 19) of the impedance of the common line 10C alone viewed from the common terminal P10 and the reflection characteristic (FIG. 20) of the common line 10C, Note that the transmission line 13D may be capacitively coupled to each of the distributed constant filter 11 and the input/output terminal P11. The transmission line 14D may be capacitively coupled to each of the LC filter 12 and the input/output terminal P12.

Hereinafter, there will be described a frequency characteristic of the impedance of the transmission line 13D alone viewed from the input/output terminal P11 and a reflection characteristic of the transmission line 13D, with reference to FIG. 26 and FIG. 27.

Figure 26:
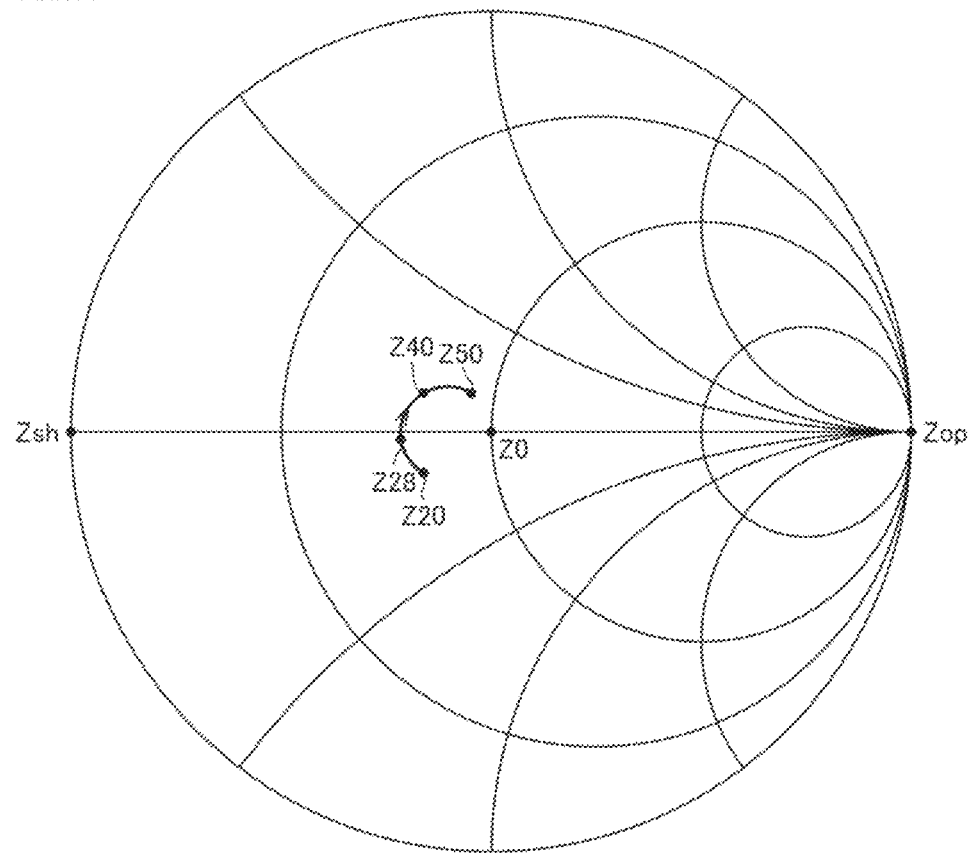
FIG. 26 is a Smith chart illustrating a frequency characteristic of the impedance of a transmission line alone viewed from an input/output terminal in FIG. 25.

FIG. 26 is a Smith chart illustrating a frequency characteristic of the impedance of the transmission line 13D alone viewed from the input/output terminal P11 in FIG. 25. As illustrated in FIG. 26, the impedance (point Z28) at the center frequency of the pass band PB1 is capacitive. The impedance (Z40) at the center frequency of the pass band PB2 is inductive. The impedance of the transmission line 13D is distributed between the point Zsh and a straight line that is orthogonal to the straight line connecting the points Zsh and Zop and passes through the point Z0. That is, the magnitude of the impedance of the transmission line 13D is smaller than the magnitude of the reference impedance.

Figure 27:
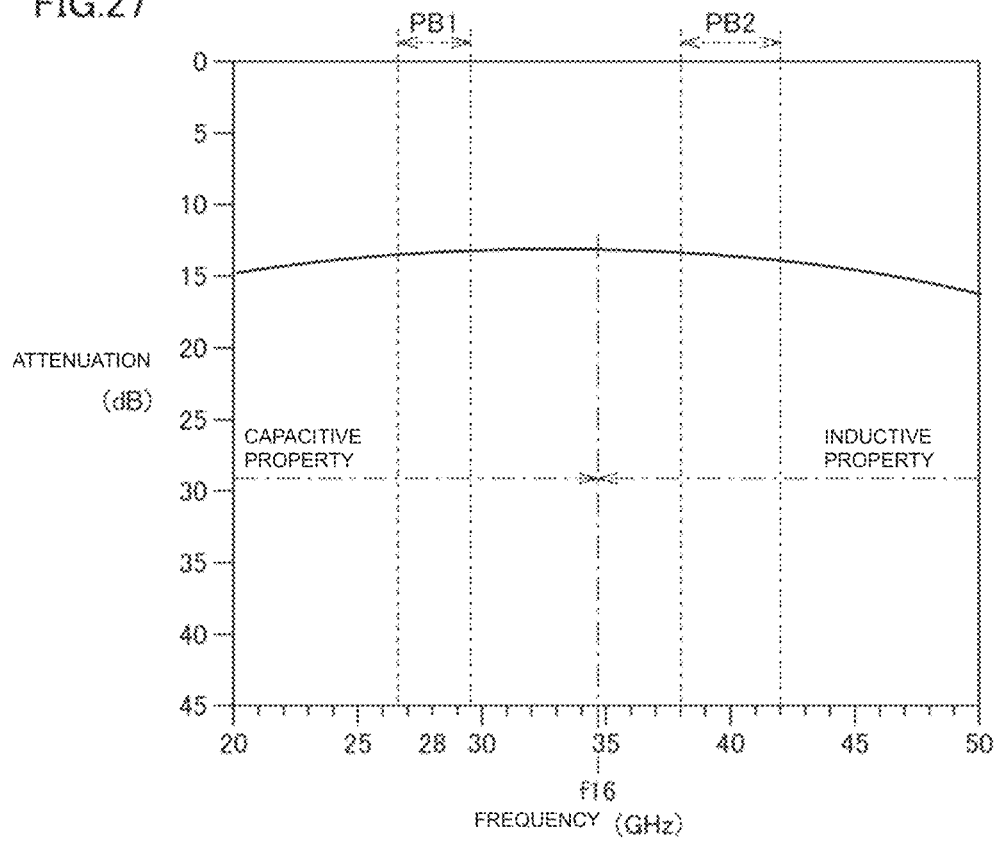
FIG. 27 is a graph illustrating a reflection characteristic of the transmission line in FIG. 25.

FIG. 27 is a graph illustrating a reflection characteristic of the transmission line 13D in FIG. 25. As illustrated in FIG. 27, in the frequency band from 20 GHz to 50 GHz, the attenuation of the reflection characteristic is minimum at a frequency f16. The frequency f16 is higher than the pass band PB1 and lower than the pass band PB2. In the frequency band from 20 GHz to 50 GHz, the impedance of the transmission line 13D is capacitive in a frequency band from 20 GHz to the frequency f16 and inductive in a frequency band from the frequency f16 to 50 GHz.

When the distributed constant filter 11 is viewed from the input/output terminal P11, the inductive property of the impedance of the distributed constant filter 11 in the pass band PB1 is weakened, because the impedance of the transmission line 13D in the pass band PB1 includes a capacitive property. Further, when the LC filter 12 is viewed from the input/output terminal P12, the capacitive property of the impedance of the LC filter 12 in the pass band PB2 is weakened, because the impedance of the transmission line 14D in the pass band PB2 includes an inductive property. As a result, in the pass bands PB1 and PB2, the frequency characteristic of the impedance of the multiplexer 1D viewed from each of the input/output terminals P11 and P12 is matched with the reference impedance with the transmission lines 13D and 14D.

As described above, by adjusting each of a length of a common line and a length of a transmission line, both the impedance viewed from a common terminal and the impedance viewed from an input/output terminal may be matched with the reference impedance.

Modification 5 of Embodiment 1

In Embodiment 1 and Modification 1 to Modification 4 thereof, there has been described a multiplexer including a distributed constant filter and an LC filter. In Modification 5 of Embodiment 1, there will be described a multiplexer including two distributed constant filters.

Figure 28:
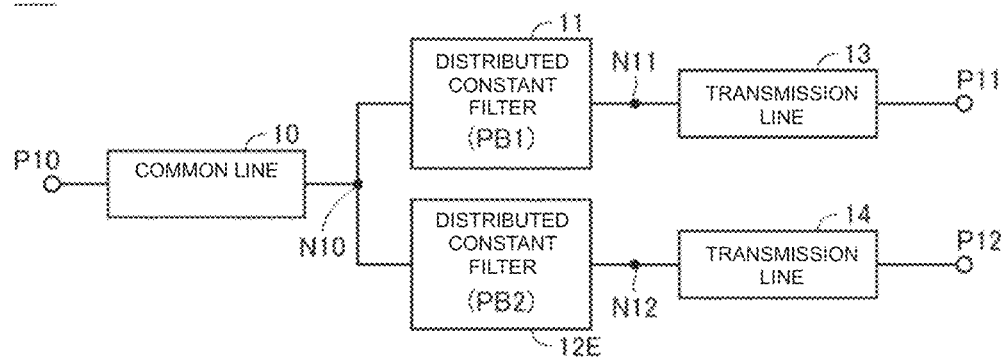
FIG. 28 is a functional block diagram illustrating a configuration of a multiplexer according to Modification 5 of Embodiment 1.

FIG. 28 is a functional block diagram illustrating a configuration of a multiplexer 1E according to Modification 5 of Embodiment 1. The multiplexer 1E has a configuration in which the LC filter 12 in FIG. 9 is replaced with a distributed constant filter 12E (second filter). Since other configurations are the same, a description thereof will not be repeated. Note that, hereinafter, a configuration will be described in which the LC filter 12 of Modification 1 of Embodiment 1 is replaced with the distributed constant filter 12E, but it is also possible to replace the LC filter of Embodiment 1 and Modification 2 to Modification 4 of Embodiment 1 with a distributed constant filter.

The distributed constant filter 12E has the pass band PB2. The distributed constant filter 12E includes multiple distributed constant lines. Each of the lengths of the multiple distributed constant lines is substantially equal to a length of one-half or one-fourth of an effective wavelength corresponding to a specific frequency (center frequency, for example) included in the pass band PB2, for example. The impedance (second impedance) of the distributed constant filter 12E in the pass band PB2 viewed from a common connection node includes a capacitive property. The impedance of the distributed constant filter 12E at the center frequency of the pass band PB2 is capacitive.

When viewed from the common terminal P10, the capacitive property of the impedance of the distributed constant filter 12E in the pass band PB2 weakened, because the impedance of the common line 10 alone in the pass band PB2 includes an inductive property. As a result, in the pass bands PB1 and PB2, a frequency characteristic of the impedance of the multiplexer 1E viewed from the common terminal P10 is matched with the reference impedance with the common line 10 the same as in Modification 1 of Embodiment 1.

The impedance matching when the distributed constant filter 11 is viewed from the input/output terminal P11 is similar to that in Modification 1 of Embodiment 1. When the distributed constant filter 12E is viewed from the input/output terminal P12, the capacitive property of the impedance of the distributed constant filter 12E in the pass band PB2 is weakened, because the impedance of the transmission line 14 in the pass band PB2 includes an inductive property. As a result, in the pass bands PB1 and PB2, the frequency characteristic of the impedance of the multiplexer 1E viewed from the input/output terminals P11 and P12 is matched with the reference impedance with the transmission lines 13 and 14 the same as in Modification 1 of Embodiment 1.

As described above, with the use of the multiplexers according to Embodiment 1 and Modification 1 to Modification 5 thereof, deterioration in characteristics of a multiplexer due to impedance mismatching may be suppressed.

Embodiment 2

In Embodiment 2, there has been described a case that a first pass band of a first filter that is a distributed constant filter is lower than a second pass band of a second filter that may be an LC filter. In Embodiment. 2, there will be described a case that the first pass band is higher than the second pass band.

Figure 29:
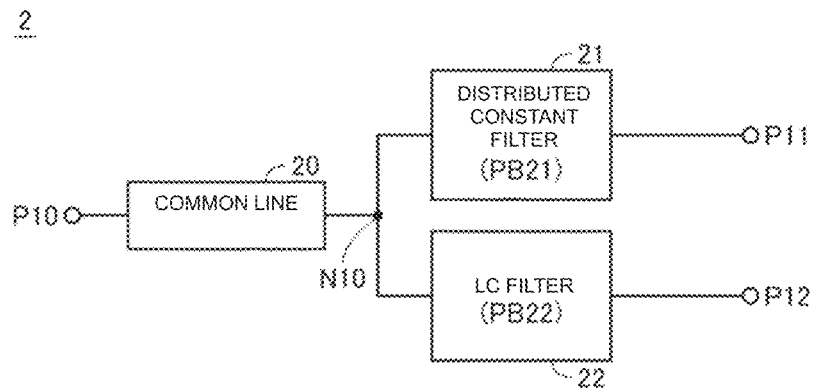
FIG. 29 is a functional block diagram illustrating a configuration of a multiplexer according to Embodiment 2.

FIG. 29 is a functional block diagram illustrating a configuration of a multiplexer 2 according to Embodiment 2. The multiplexer 2 has a configuration in which the common line 10, the distributed constant filter 11, and the LC filter 12 in FIG. 1 are respectively replaced with a common line 20, a distributed constant filter 21, and an LC filter 22. Since other configurations are the same, a description thereof will not be repeated.

As illustrated in FIG. 29, the common line 20 is connected between the common terminal P10 and the common connection node N10. The distributed constant filter 21 is connected between the common connection node N10 and the input/output terminal P11. The LC filter 22 is connected between the common connection node N10 and the input/output terminal P12. Note that the common line 20 may be capacitively coupled to each of the common terminal P10, the distributed constant filter 21, and the LC filter 22.

The distributed constant filter 21 has a pass band PB21 (first pass band). The distributed constant filter 21 includes multiple distributed constant lines. A length of the common line 20 is substantially the same as a length of one of the multiple distributed constant lines. Each of the lengths of the multiple distributed constant lines is substantially equal to a length of one-half or one-fourth of an effective wavelength corresponding to a specific frequency (center frequency, for example) included in the pass band PB21, for example. The LC filter 22 has a pass band PB22 (second pass band). The LC filter 22 includes a resonant circuit formed of an inductor and a capacitor. The LC filter 22 may be a lumped constant type filter or a circuit formed of an electrode pattern having a function of an inductor and a function of a capacitor.

The pass band PB21 is higher than the pass band PB22. The impedance (second impedance) of the distributed constant filter 21 in the pass band PB21 viewed from the common connection node N10 includes a capacitive property. The impedance of the distributed constant filter 21 at a center frequency of the pass band PB21 is capacitive. The impedance (third impedance) of the LC filter 22 the pass band PB22 viewed from the common connection node N10 includes an inductive property. The impedance of the LC filter 22 at a center frequency of the pass band PB22 is inductive. In Embodiment 2, as an example of a case that the pass band PB21 is higher than PB22, a configuration will be described in which the pass band PB21 is 38 GHz to 42 GHz and the pass band PB22 is 26.5 GHz to 29.5 GHz. In the case above, the center frequency of the pass band PB21 is 40 GHz, and the center frequency of the pass band PB22 is 28 GHz.

Figure 30:
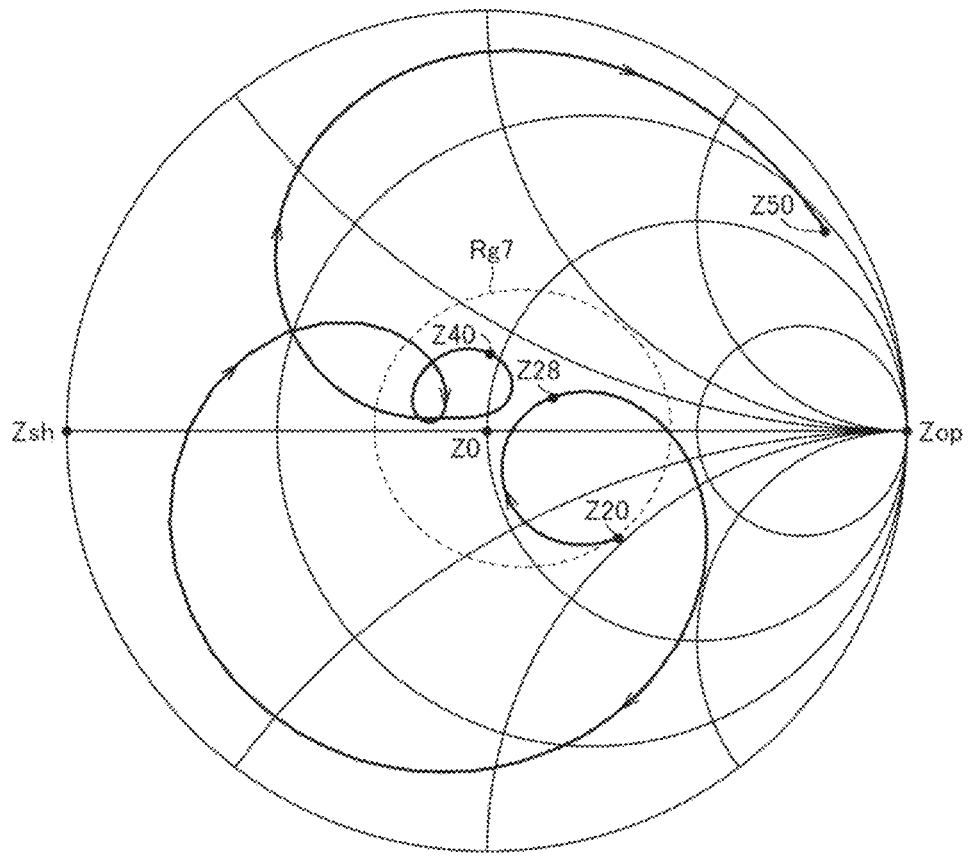
FIG. 30 is a Smith chart illustrating a frequency characteristic of the impedance when an input/output terminal is viewed from a common connection node in FIG. 29.

FIG. 30 is a Smith chart illustrating a frequency characteristic of impedance when the input/output terminals P11 and P12 are viewed from the common connection node N10 in FIG. 29. FIG. 30 illustrates a change in impedance when a frequency is varied from 20 GHz to 50 GHz. In FIG. 30, a point Z28 is the impedance at the center frequency (28 GHz) of the pass band PB22, and a point Z40 is the impedance at the center frequency (40 GHz) of the pass band PB21. Points described above are the same as those in Smith charts that will be described in Embodiment 2. Further, points other than the above are the same as those in the Smith charts described in Embodiment 1.

As illustrated in FIG. 30, the impedance (point Z28) at the center frequency of the pass band PB22 is inductive. The impedance (point Z40) at the center frequency of the pass band PB21 is inductive. The impedance of the pass bands PB21 and PB22, and the point Z0 are included in a region Rg7. The region Rg7 is a region in a Smith chart corresponding to frequencies included in each of the pass bands PB21 and PB22, for example. The same applies to regions Rg8, Rg9, and Rg10 described in Embodiment 2 and Modification 1 to Modification 4 thereof.

Figure 31:
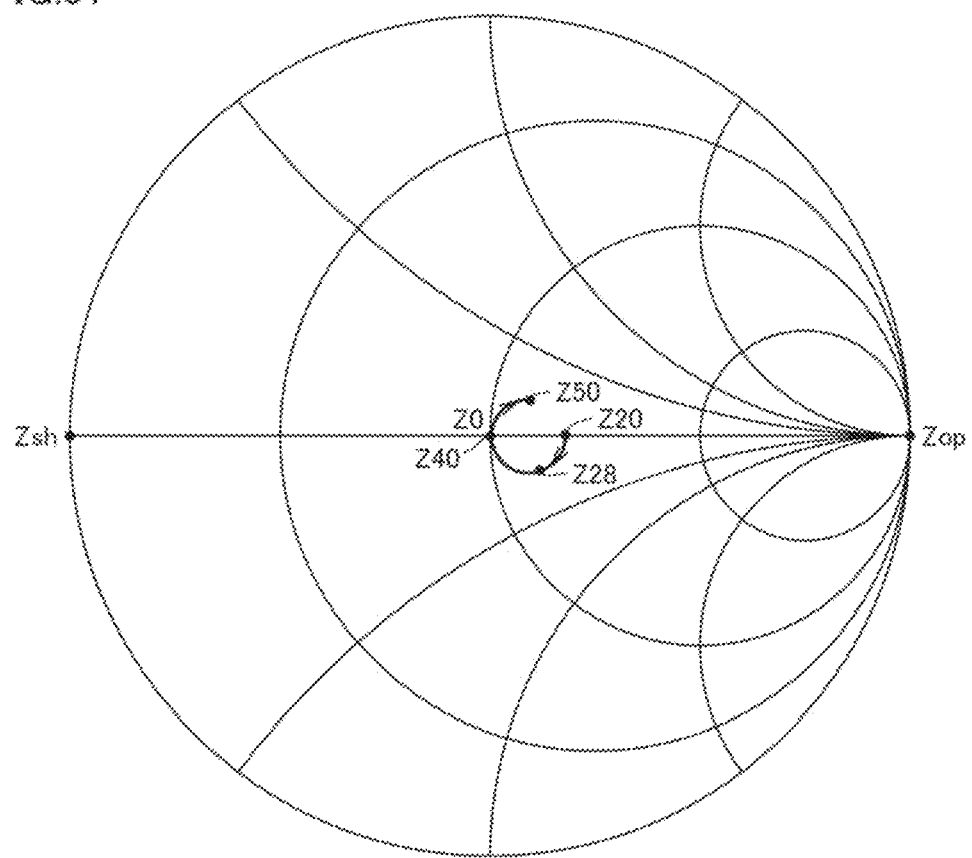
FIG. 31 is a Smith chart illustrating a frequency characteristic of the impedance of a common line alone viewed from a common terminal in FIG. 29.

FIG. 31 is a Smith chart illustrating a frequency characteristic of the impedance (first impedance) of the common line 20 alone viewed from the common terminal P10 in FIG. 29. As illustrated in FIG. 31, the impedance (point Z40) at the center frequency of the pass band PB21 substantially coincides with the point Z0 whereas the impedance (Z28) at the center frequency of the pass band PB22 is capacitive. The impedance of the common line 20 is distributed between the point Zop and a straight line that is orthogonal to a straight line connecting the points Zsh and Zop and passes through the point Z0. That is, the magnitude of the impedance of the common line 20 is larger than the magnitude or the reference impedance. FIG. 31 illustrates a case that the magnitude of the reference impedance is 50Ω, and the magnitude of the impedance of the common line 20 is 60Ω.

Figure 32:
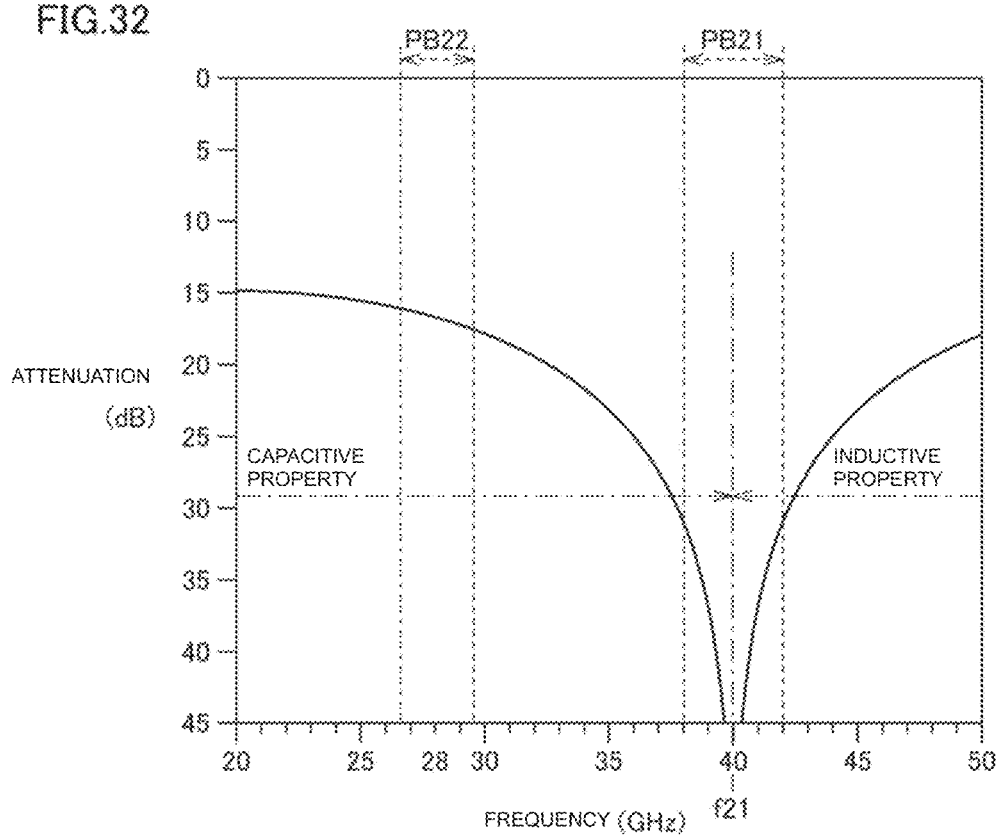
FIG. 32 is a graph illustrating a reflection characteristic of a common line in FIG. 29.

FIG. 32 is a graph illustrating a reflection characteristic of the common line 20 in FIG. 29. As illustrated in FIG. 32, the attenuation of the reflection characteristic becomes maximum at a frequency f21 in 20 GHz to 50 GHz frequency band. Since the length of the common line 20 is substantially equal to the length of one of the multiple distributed constant lines included in the distributed constant filter 21, the frequency f21 being a resonant frequency is included in the pass band PB21 and is substantially equal to the center frequency 40 GHz of the pass band PB21. In the frequency band from 20 GHz to 50 GHz, the impedance of the common line 20 is capacitive in a frequency band from 20 GHz to the frequency f21 and inductive in a frequency band from the frequency f21 to 50 GHz. The impedance of the common line 20 is capacitive or inductive in the pass band PB21 and capacitive in the pass band PB22. That is, in the multiplexer 2, satisfied is a condition (second condition) that in the pass band PB22 the impedance of the common line 20 alone viewed from the common terminal P10 includes a capacitive property, and the impedance of the LC filter 22 viewed from the common connection node N10 includes an inductive property.

Note that, when the magnitude of the impedance of the common line is larger than the magnitude of the reference impedance, the resonant frequency of the common line may be a frequency between the pass bands PB22 and PB21. That is, the length of the common line may be longer than one of the multiple distributed constant lines included in the distributed constant filter 21.

Figure 33:
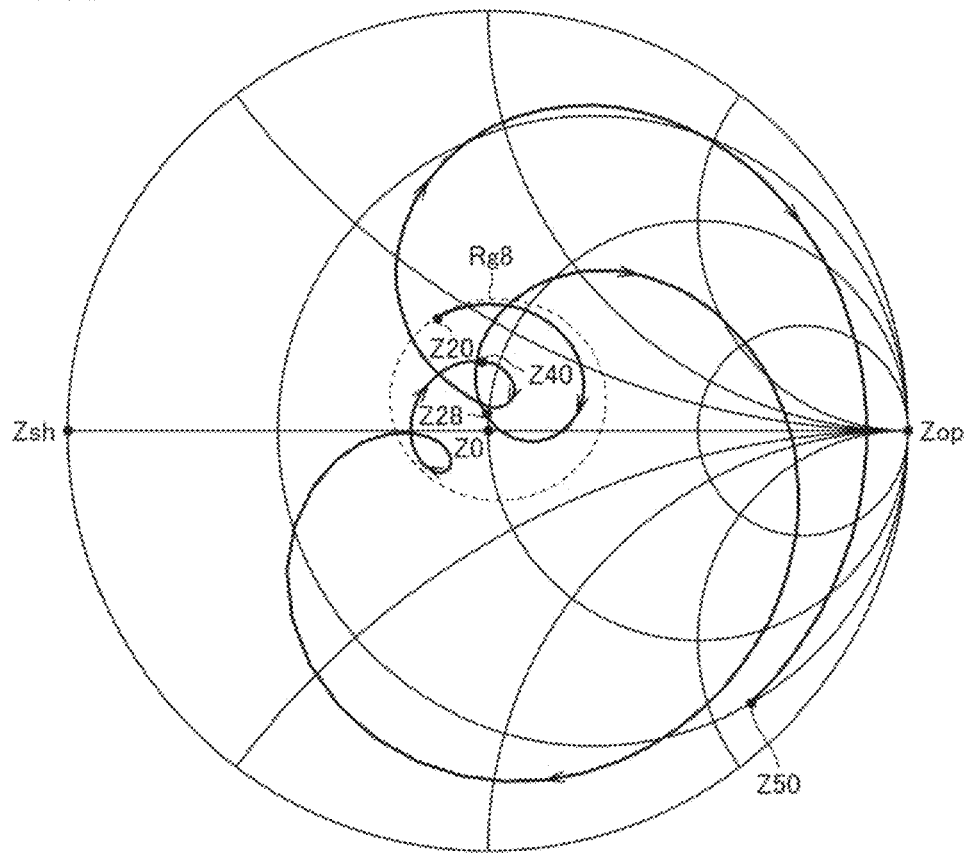
FIG. 33 is a Smith chart illustrating a frequency characteristic of the impedance when the input/output terminal is viewed from a common terminal in FIG. 29.

FIG. 33 is a Smith chart illustrating a frequency characteristic of the impedance when the input/output terminals P11 and P12 are viewed from the common terminal P10 in FIG. 29. The frequency characteristic of the impedance illustrated in FIG. 33 is obtained by adding the influence of the frequency characteristic of the impedance of the common line 20 illustrated in FIG. 31 to the frequency characteristic of the impedance in FIG. 30. With reference to FIG. 30, FIG. 31, and FIG. 33, the inductive property of the impedance of the LC filter 22 in the pass band PB22 is weakened, because the impedance of the common line 20 in the pass band PB22 includes the capacitive property. With this, the impedance (point Z28) at the center frequency of the pass band PB22 is closer to the point Z0 in FIG. 33 than in FIG. 30. As a result, the impedance of the pass bands PB21 and PB22 and the point Z0 are included in the region Rg6 that is smaller than the region Rg7. That is, in the pass bands PB21 and PB22, the frequency characteristic of the impedance illustrated in FIG. 30 is matched with the reference impedance with the common line 20.

Modification 1 of Embodiment 2

In Embodiment 2, there has been described the impedance matching of a multiplexer when a filter is viewed from a common terminal. In Modification 1 of Embodiment 2, there will be described the impedance matching when a filter is viewed from an input/output terminal.

Figure 34:
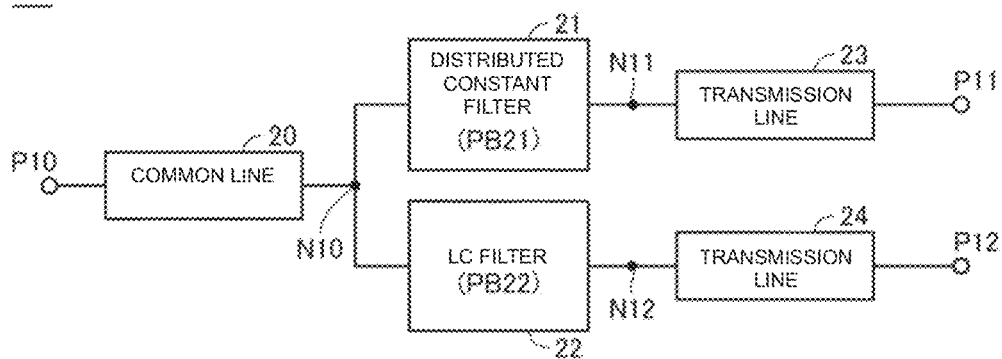
FIG. 34 is a functional block diagram illustrating a configuration of a multiplexer according to Modification 1 of Embodiment 2.

FIG. 34 is a functional block diagram illustrating a configuration of a multiplexer 2A according to Modification 1 of Embodiment 2. The multiplexer 2A has a configuration in which a transmission line 23 (first line) and a transmission line 24 (second line) are added to the multiplexer 2 in FIG. 29. Since other configurations are the same, a description thereof will not be repeated.

As illustrated in FIG. 34, the transmission line 23 is connected between the distributed constant filter 21 and the input/output terminal P11. The transmission line 24 is connected between the LC filter 22 and the input/output terminal P12. Each of the length of the transmission line 23 and the length of the transmission line 24 is substantially the same as the length of one of the multiple distributed constant lines included in the distributed constant filter 21. With this, each of a frequency characteristic of the impedance of the transmission line 23 alone viewed from the input/output terminal P11 and a frequency characteristic of the impedance of the transmission line 24 viewed from the input/output terminal P12 is substantially the same as the frequency characteristic of the impedance of the common line 20 illustrated in FIG. 31. Further, each of a reflection characteristic of the transmission line 23 and a reflection characteristic of the transmission line 24 is substantially the same as the reflection characteristic of the common line 20 illustrated in FIG. 32. That is, the impedance of each of the transmission lines 23 and 24 at the center frequency of the pass band PB21 substantially coincides with the center of a Smith chart whereas the impedance of each of the transmission lines 23 and 24 at the center frequency of the pass band PB22 includes a capacitive property. Note that the transmission line 23 may be capacitively coupled to each of the distributed constant filter 21 and the input/output terminal P11. The transmission line 24 may be capacitively coupled to each of the LC filter 22 and the input/output terminal P12.

As for the impedance at the center frequency in the pass band PB22, the inductive property of the impedance of the LC filter 22 in the pass band PB22 is weakened, because the impedance of the transmission line 24 in the pass band PB22 includes a capacitive property. With this, the impedance of the LC filter 22 the pass band PB22 is brought close to the reference impedance. As a result, in the pass bands PB21 and PB22, a frequency characteristic of the impedance of the multiplexer 2A is matched with the reference impedance with the transmission lines 23 and 24.

Modification 2 of Embodiment 2

In Embodiment 2 and Modification 1 of Embodiment 2, there has been described a case that the magnitude of the impedance of a common line is larger than the magnitude of the reference impedance. In Modification 2 of Embodiment 2, there will be described a case that the magnitude of the impedance of a common line is smaller than the magnitude of the reference impedance.

Figure 35:
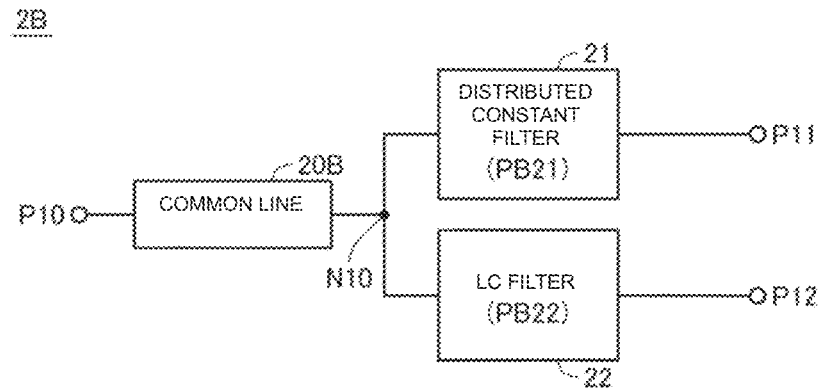
FIG. 35 is a functional block diagram illustrating a configuration of a multiplexer according to Modification 2 of Embodiment 2.

FIG. 35 is a functional block diagram illustrating a configuration of a multiplexer 2B according to Modification 2 of Embodiment 2. The multiplexer 2B has a configuration in which the common line 20 of the multiplexer 2 in FIG. 29 is replaced with a common line 20B. The length of the common line 20B is longer than one of the multiple distributed constant lines included in the distributed constant filter 21. Since other configurations are the same, a description thereof will not be repeated.

Figure 36:
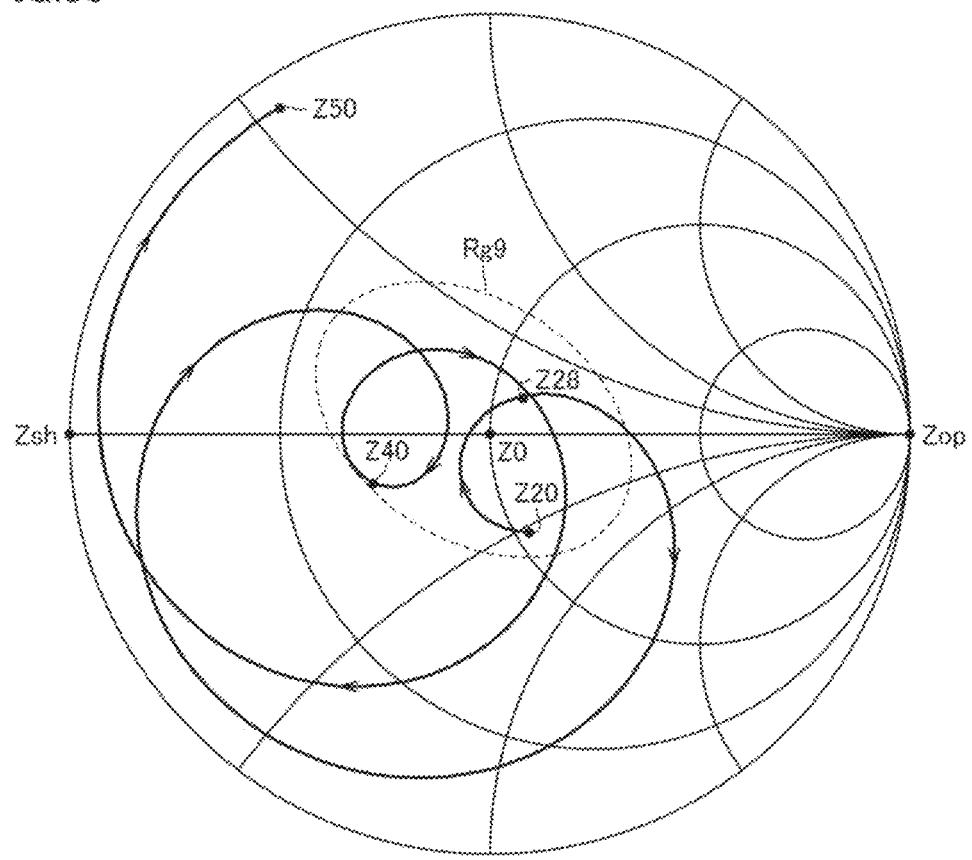
FIG. 36 is a Smith chart illustrating a frequency characteristic of the impedance when an input/output terminal is viewed from a common connection node in FIG. 35.

FIG. 36 is a Smith chart illustrating the frequency characteristic of the impedance when the input/output terminals P11 and P12 are viewed from the common connection node N10 in FIG. 35. As illustrated in FIG. 36, the impedance (point Z40) of the distributed constant filter 21 at the center frequency of the pass band PB21 is capacitive. The impedance (point Z28) of the LC filter 22 at the center frequency of the pass band PB22 is inductive. The impedance of the pass bands PB21 and PB22 and the point Z0 are included in the region Rg9.

Figure 37:
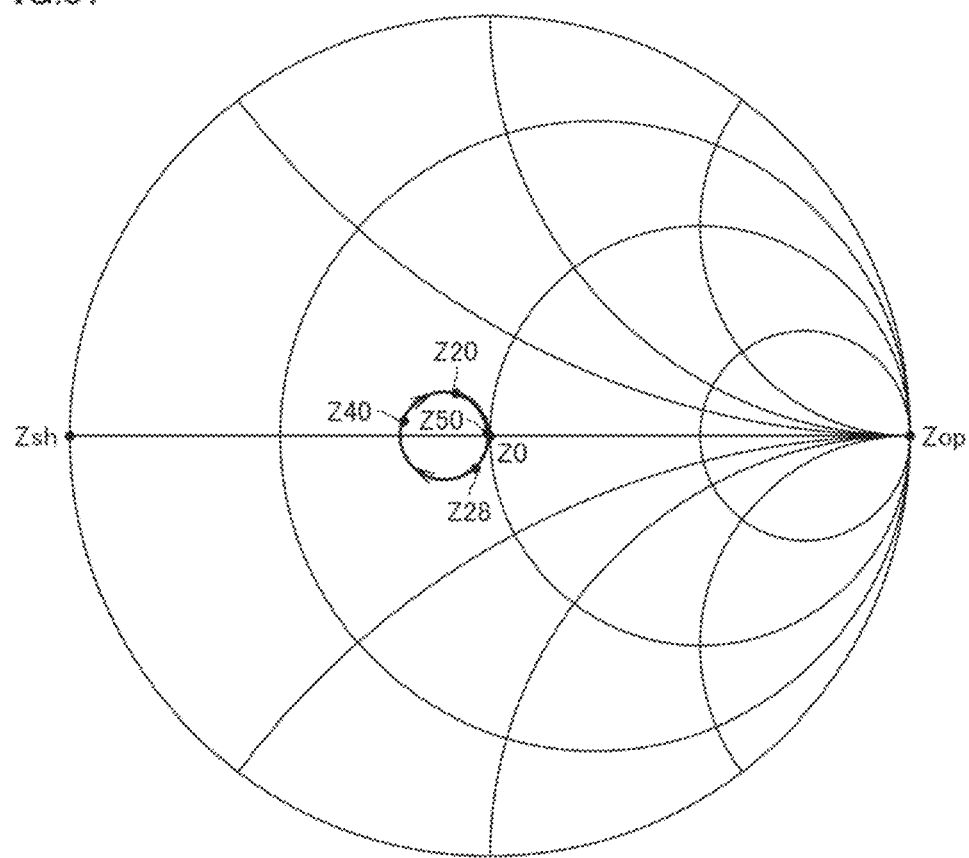
FIG. 37 is a Smith chart illustrating a frequency characteristic of the impedance of a common line alone viewed from a common terminal in FIG. 35.

FIG. 37 is a Smith chart illustrating the frequency characteristic of the impedance of the common line 20B alone viewed from the common terminal P10 in FIG. 35. As illustrated in FIG. 37, the impedance (point Z40) at the center frequency of the pass band PB21 is inductive. The impedance (Z28) at the center frequency of the pass band PB22 is capacitive. The impedance of the common line 20B is distributed between the point Zsh and a straight line that is orthogonal to the straight line connecting the points Zsh and Zop and passes through the point Z0. That is, the magnitude of the impedance of the common line 20B is smaller than the magnitude of the reference impedance. FIG. 37 illustrates a case that the magnitude of the reference impedance is 50Ω, and the magnitude of the impedance of the common line 20B is 40Ω.

Figure 38:
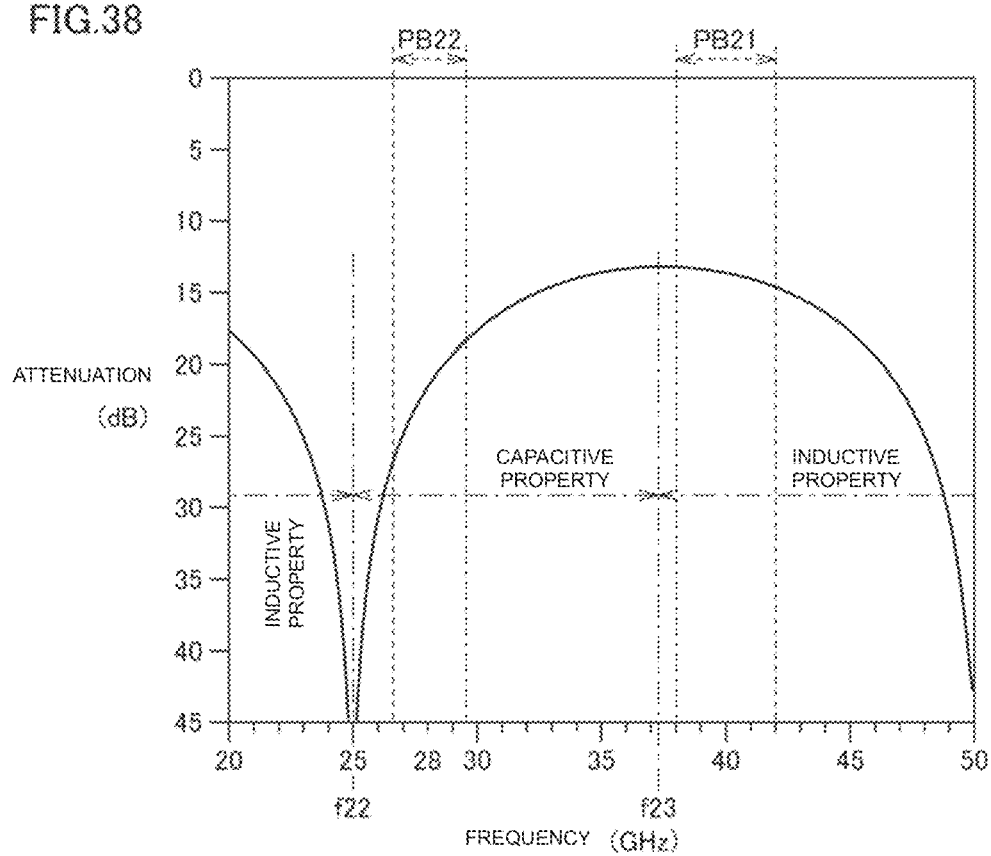
FIG. 38 is a graph illustrating a reflection characteristic of the common line in FIG. 35.

FIG. 38 is a graph illustrating a reflection characteristic of the common line 20B in FIG. 35. As illustrated in FIG. 38, in the frequency band from 20 GHz to 50 GHz, the attenuation of the reflection characteristic is maximum at a frequency f22 and minimum at a frequency f23 (>f22). The frequency f22 is lower than the pass band PB22. The frequency f23 is higher than the pass band PB22 and lower than the pass band PB21. Since the common line 20B is longer than one of the multiple distributed constant lines included in the distributed constant filter 21, the wavelength of a signal that resonates in the common line 20B becomes longer. As a result, the frequency f22 being the resonant frequency of the common line 20B is made lower than the pass band PB22. In the frequency band from 20 GHz to 50 GHz, the impedance of the common line 20B is inductive in a frequency band from 20 GHz to the frequency f22, capacitive in a frequency band from the frequency f22 to f23, and inductive in a frequency band from the frequency f23 to 50 GHz. That is, in the multiplexer 2B, both a first condition and a second condition as follows are satisfied. The first condition is that in the pass band PB21 the impedance of the common line 20B alone viewed from the common terminal P10 includes an inductive property, and the impedance of the distributed constant filter 21 viewed from the common connection node N10 includes a capacitive property. The second condition is that in the pass band PB22 the impedance of the common line 20B alone viewed from the common terminal P10 includes a capacitive property, and the impedance of the LC filter 22 viewed from the common connection node N10 includes an inductive property.

Figure 39:
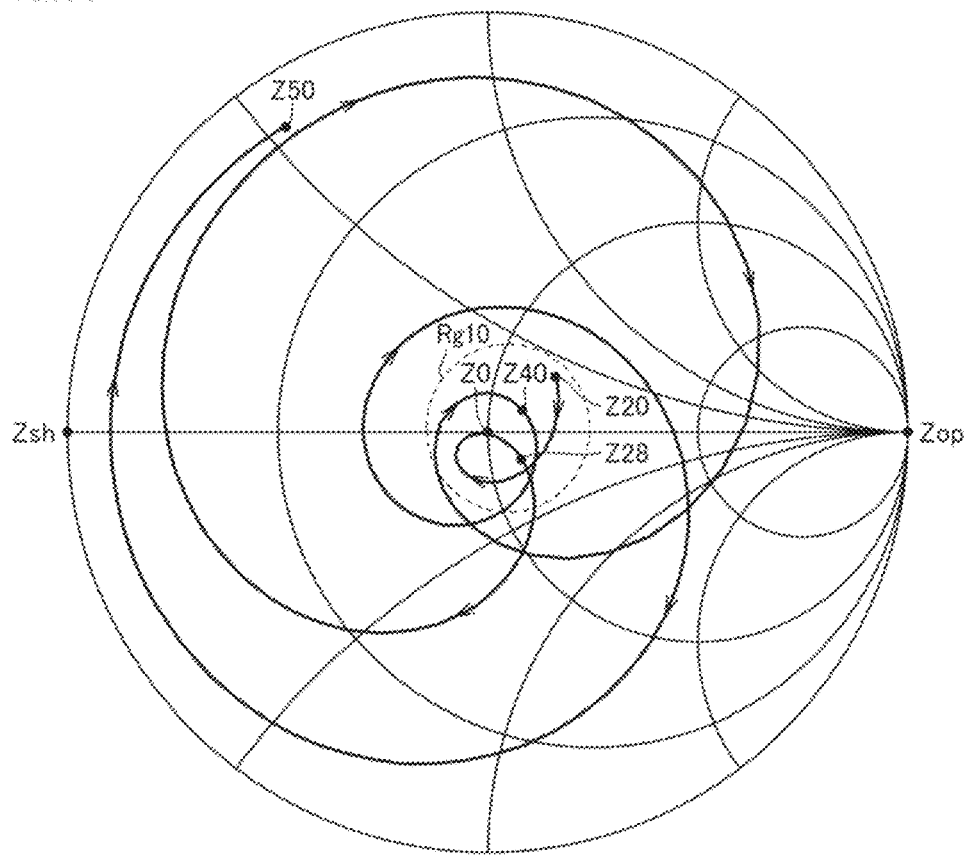
FIG. 39 is a Smith chart illustrating a frequency characteristic of the impedance when the input/output terminal is viewed from the common terminal in FIG. 35.

FIG. 39 is a Smith chart illustrating a frequency characteristic of the impedance when the input/output terminals P11 and P12 are viewed from the common terminal P10 in FIG. 35. The frequency characteristic of the impedance illustrated in FIG. 39 is obtained by adding the influence of the frequency characteristic of the impedance of the common line 20B illustrated in FIG. 37 to the frequency characteristic of the impedance illustrated in FIG. 36. With reference to FIG. 36, FIG. 37, and FIG. 39, as for the impedance (point Z40) at the center frequency of the pass band PB21, the capacitive property of the impedance of the distributed constant filter 21 in the pass band PB21 is weakened, because the impedance of the common line 20B in the pass band PB21 includes an inductive property. With this, the impedance (point Z40) at the center frequency of the pass band PB21 is closer to the point Z0 in FIG. 39 than in FIG. 36. Further, as for the impedance (point Z28) at the center frequency of the pass band PB22, the inductive property of the impedance of the LC filter 22 in the pass band PB22 is weakened, because the impedance of the common line 20B in the pass band PB22 includes a capacitive property. With this, the impedance (point Z28) at the center frequency of the pass band PB22 is closer to the point Z0 in FIG. 39 than in FIG. 36. As a result, the impedance of the pass bands PB21 and PB22 and the point Z0 are included in the region Rg9 that is smaller than the region. Rg10. That is, in the pass bands PB21 and PB22, the frequency characteristic of the impedance illustrated in FIG. 36 is matched with the reference impedance with the common line 20B.

Modification 3 of Embodiment 2

In Modification 3 of Embodiment 2, there will be described the impedance matching when a filter is viewed from an input/output terminal in a case that the magnitude of the impedance of a common line is smaller than the magnitude of the reference impedance, the same as in Modification 1 of Embodiment 2.

Figure 40:
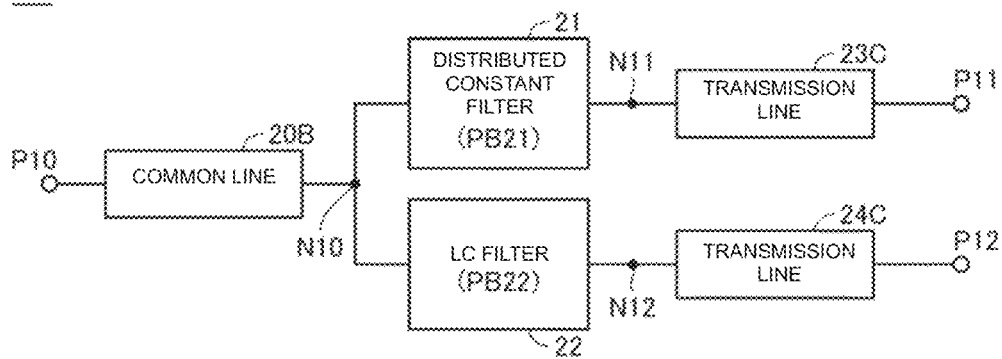
FIG. 40 is a functional block diagram illustrating a configuration of a multiplexer according to Modification 3 of Embodiment 2.

FIG. 40 is a functional block diagram illustrating a configuration of a multiplexer 2C according to Modification 3 of Embodiment 2. The multiplexer 2C has a configuration in which a transmission line 23C (first line) and a transmission line 24C (second line) are added to the multiplexer 2B in FIG. 35. Since other configurations are the same, a description thereof will not be repeated.

The transmission line 23C is substantially the same as the common line 20B. The length of the transmission line 24C is substantially the same as the length of the common line 20B. Note that the transmission line 23C may capacitively be coupled to each of the distributed constant filter 21 and the input/output terminal P11. The transmission line 24C may capacitively be coupled to each of the LC filter 22 and the input/output terminal P12.

When the distributed constant filter 21 is viewed from the input/output terminal P11, the capacitive property of the impedance of the distributed constant filter 21 in the pass band PB21 is weakened, because the impedance of a transmission line 23C in the pass band PB21 includes an inductive property. Further, when the LC filter 22 is viewed from the input/output terminal P12, the inductive property of the impedance of the LC filter 22 in the pass band PB22 is weakened, because the impedance of a transmission line 24C in the pass band PB22 includes a capacitive property. As a result, in the pass bands PB21 and PB22, a frequency characteristic of the impedance of the multiplexer 2C viewed from each of the input/output terminals P11 and P12 is matched with the reference impedance with the transmission lines 23C and 24C.

Modification 4 of Embodiment 2

In Embodiment 2 and Modification 1 to Modification 3 thereof, there has been described a multiplexer including a distributed constant filter and an LC filter. In Modification 4 of Embodiment 2, there will be described a multiplexer including two distributed constant filters.

Figure 41:
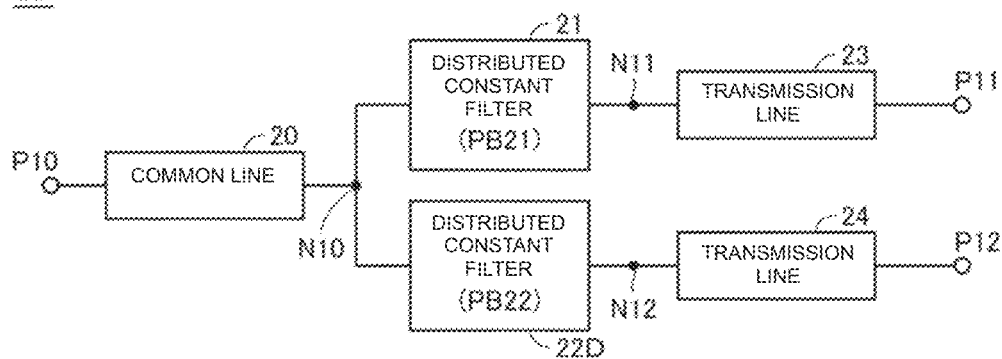
FIG. 41 is a functional block diagram illustrating a configuration of a multiplexer according to Modification 4 of Embodiment 2.

FIG. 41 is a functional block diagram illustrating a configuration of a multiplexer 2D according to Modification 4 of Embodiment 2. The multiplexer 2D has a configuration in which the LC filter 22 in FIG. 34 is replaced with a distributed constant filter 22D (second filter). Since other configurations are the same, a description thereof will not be repeated. Note that, hereinafter, a configuration will be described in which the LC filter 22 of Modification 1 of Embodiment 2 is replaced with the distributed constant filter 22D, but it is also possible to replace the LC filter of Embodiment 2 and Modification 2 to Modification 3 of Embodiment 2 with a distributed constant filter.

The distributed constant filter 22D has the pass band PB22. The distributed constant filter 22D includes multiple distributed constant lines. Each of the lengths of the multiple distributed constant lines is substantially equal to a length of one-half or one-fourth of an effective wavelength corresponding to a specific frequency (center frequency, for example) included in the pass band PB22, for example. The impedance (second impedance) of the distributed constant filter 22D in the pass band PB22 viewed from a common connection node includes a capacitive property.

When viewed from the common terminal P10, the inductive property of the impedance of the distributed constant filter 22D in the pass band PB22 is weakened, because the impedance of the common line 20 alone in the pass band PB22 includes a capacitive property. As a result, in the pass bands PB21 and PB22, the frequency characteristic of the impedance of the multiplexer 2D viewed from the common terminal P10 is matched with the reference impedance with the common line 20 the same as in Modification 1 of Embodiment 2.

Impedance matching when the distributed constant filter 21 is viewed from the input/output terminal P11 is the same as that in Modification 1 of Embodiment 2. When the distributed constant filter 22D is viewed from the input/output terminal P12, the inductive property of the impedance of the distributed constant filter 22D in the pass band PB22 is weakened, because the impedance of the transmission line 24D in the band PB22 includes a capacitive property. As a result, in the pass bands PB21 and PB22, the frequency characteristic of the impedance of the multiplexer 2D viewed from each of the input/output terminals P11 and P12 is matched with the reference impedance with the transmission lines 23 and 24 the same as in Modification 1 of Embodiment 2.

As described above, with the use of the multiplexers according to Embodiment 2 and Modification 1 to Modification 4 thereof, deterioration in characteristics of a multiplexer due to impedance mismatching may be suppressed.

Embodiment 3

In Embodiment 3, there will be described a multiplexer formed as a multilayer body of multiple dielectrics.

Figure 42:
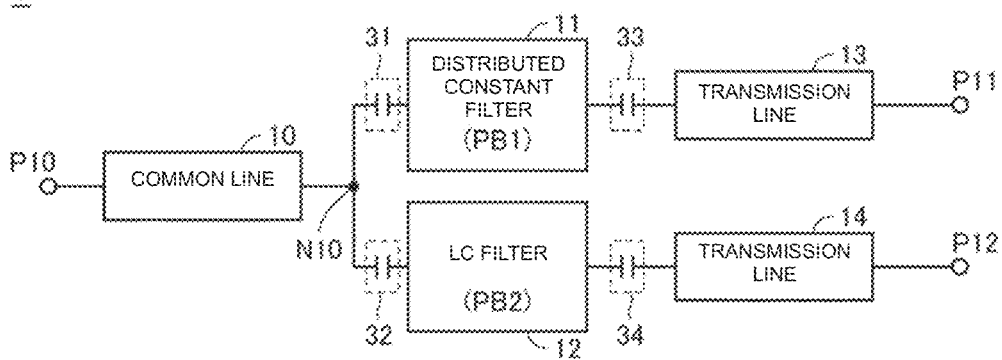
FIG. 42 is a functional block diagram illustrating a configuration of a multiplexer according to Embodiment 3.

FIG. 42 is a functional block diagram illustrating a configuration of a multiplexer 3 according to Embodiment 3. The multiplexer 3 has a configuration in which capacitors 31, 32, 33, and 34 are added to the multiplexer 1A in FIG. 9. Since other configurations are the same, a description thereof will not be repeated.

As illustrated in FIG. 42, the capacitor 31 is connected between the common connection node N10 and the distributed constant filter 11. The common line 10 is capacitively coupled to the distributed constant filter 11 through the capacitor 31. The capacitor 32 is connected between the common connection node N10 and the LC filter 12. The common line 10 is capacitively coupled to the LC filter 12 through the capacitor 32.

The capacitor 33 is connected between the distributed constant filter 11 and the transmission line 13. The distributed constant filter 11 is capacitively coupled to the transmission line 13 through the capacitor 33. The capacitor 34 is connected between the LC filter 12 and the transmission line 14. The LC filter 12 is capacitively coupled to the transmission line 14 through the capacitor 34.

Figure 43:
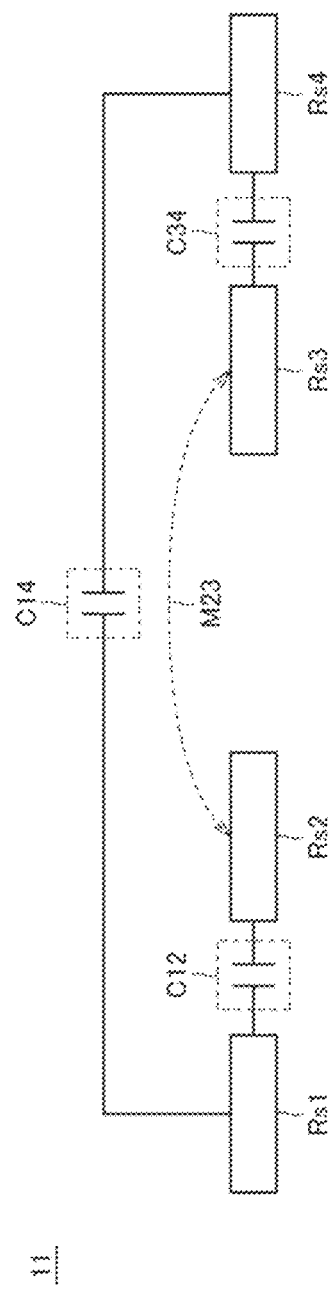
FIG. 43 is a circuit diagram illustrating an example of a configuration of a distributed constant filter in FIG. 42.

FIG. 43 is a circuit diagram illustrating an example of a configuration of the distributed constant filter 11 in FIG. 42. As illustrated in FIG. 43, the distributed constant filter 21 includes distributed constant lines Rs1, Rs2, Rs3, and Rs4, and capacitors C12, C14, and C34. The capacitor C12 is connected between the distributed constant lines Rs1 and Rs2. The distributed constant lines Rs1 and Rs2 are capacitively coupled through the capacitor C12. The capacitor C14 is connected between the distributed constant lines Rs1 and Rs4. The distributed constant lines Rs1 and Rs4 are capacitively coupled through the capacitor C14. The capacitor C34 is connected between the distributed constant lines Rs3 and Rs4. The distributed constant lines Rs3 and Rs4 are capacitively coupled through the capacitor C34. The distributed constant lines Rs2 and Rs3 are magnetically coupled to each other.

Figure 44:
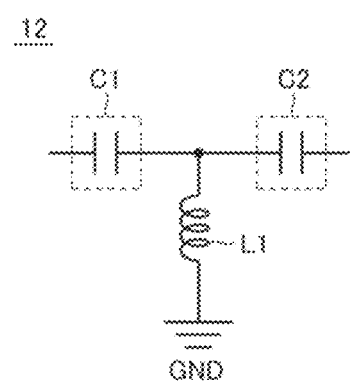
FIG. 44 is a circuit diagram illustrating an example of a configuration of an LC filter in FIG. 42.

FIG. 44 is a circuit diagram illustrating an example of a configuration of the LC filter 12 in FIG. 42. The LC filter 22 includes an inductor L1 and capacitors C1 and C2. The inductor L1 is connected between a connection node of the capacitors C1 and C2, and the ground point GND.

Figure 45:
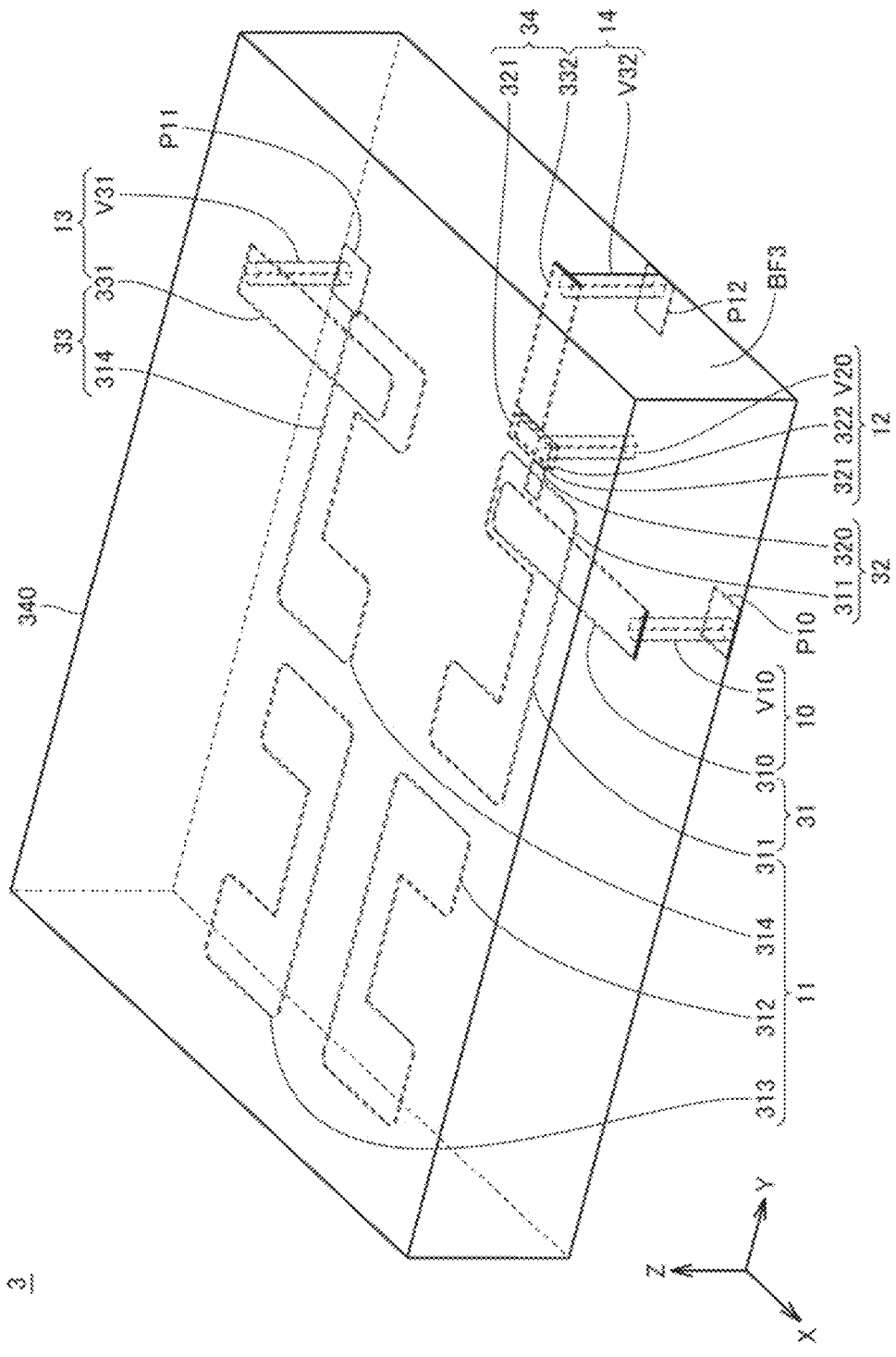
FIG. 45 is an external perspective view of the multiplexer in FIG. 42.
Figure 46:
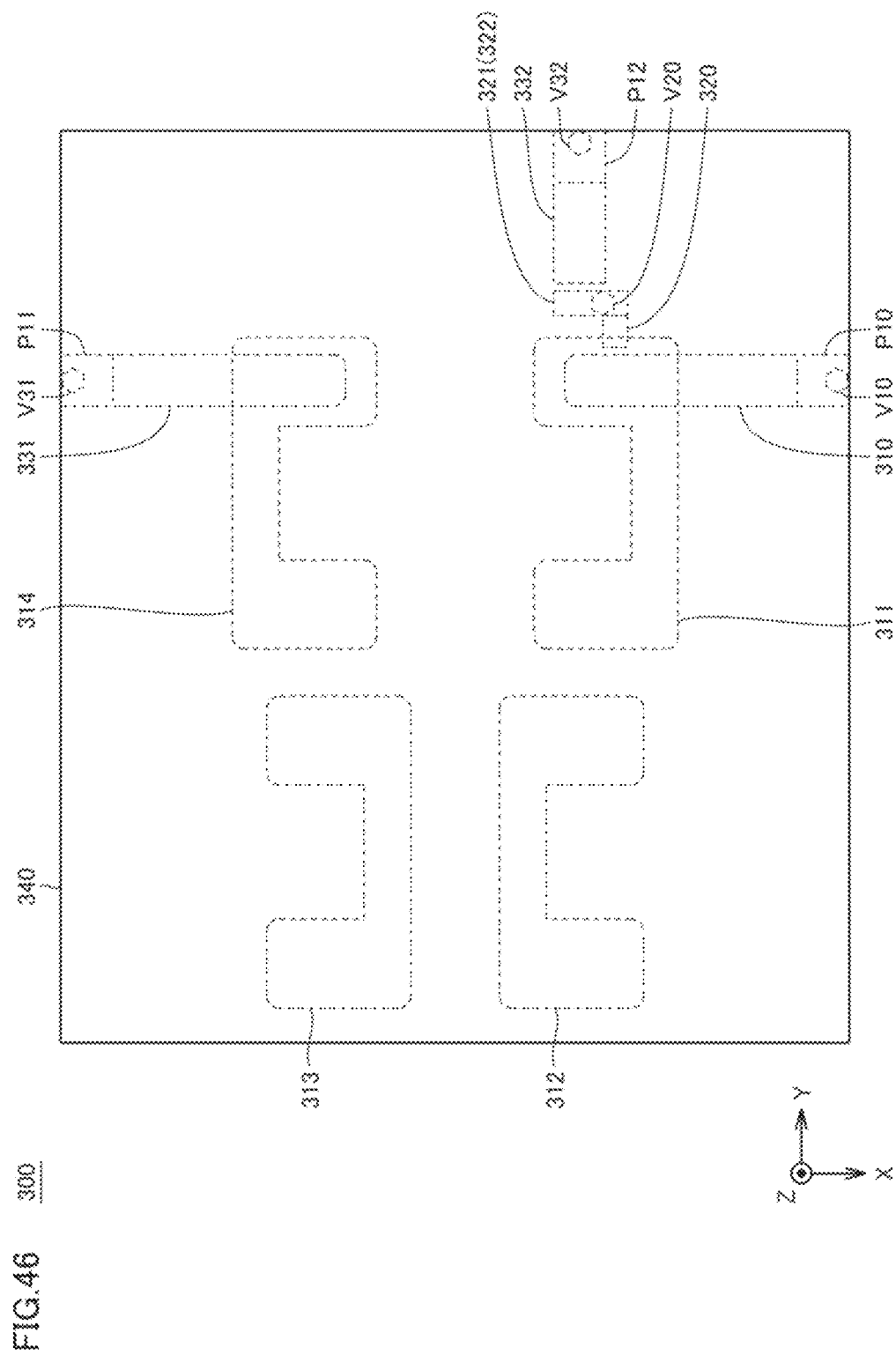
FIG. 46 is a diagram of the multiplexer in FIG. 45 in a plan view in a Z-axis direction.
Figure 47:
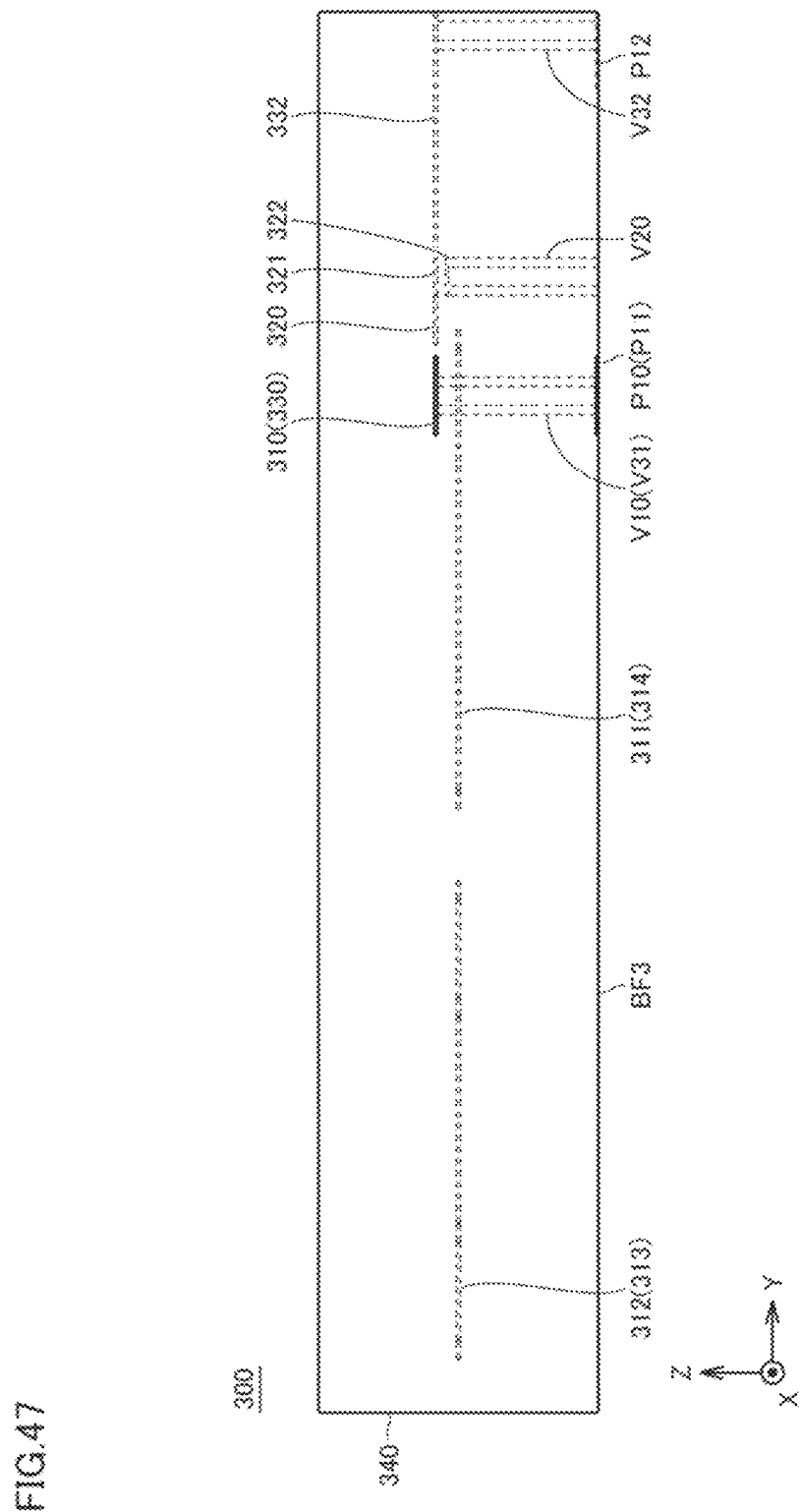
FIG. 47 is a diagram of the multiplexer in FIG. 45 in a plan view in an X-axis direction.
Figure 48:
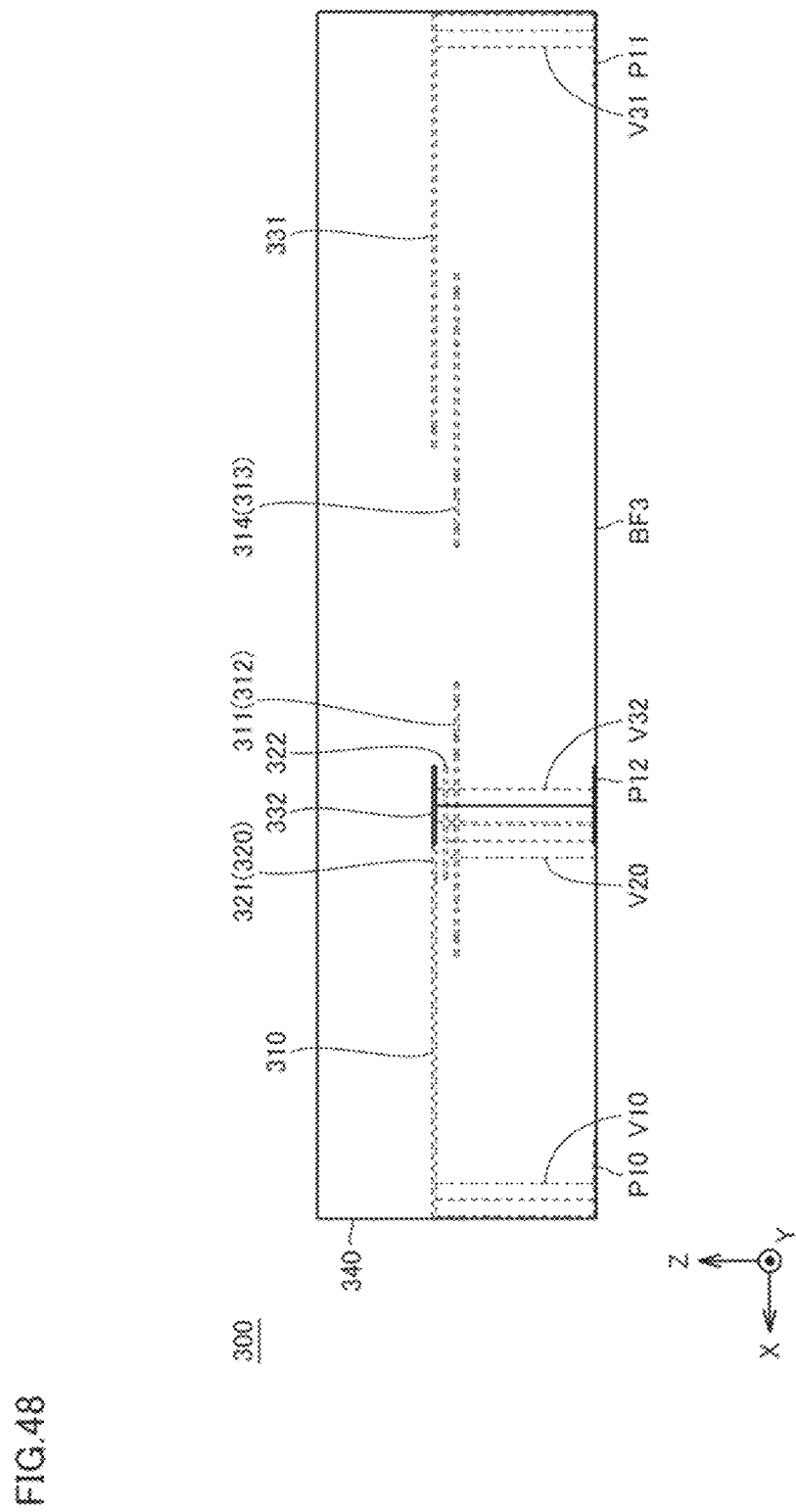
FIG. 48 is a diagram of the multiplexer in FIG. 45 in a plan view in a Y-axis direction.

FIG. 45 is an external perspective view of the multiplexer 3 in FIG. 42. FIG. 46 is a diagram of the multiplexer 3 in FIG. 45 in a plan view in the Z-axis direction. FIG. 47 is a diagram of the multiplexer 3 in FIG. 45 in a plan view in the X-axis direction. FIG. 48 is a diagram of the multiplexer 3 in FIG. 45 in a plan view in the Y-axis direction. In FIG. 45 to FIG. 48, the X-axis, the Y-axis, and the Z-axis are orthogonal to each other.

As illustrated in FIG. 45 to FIG. 48, the multiplexer 3 is formed as a multilayer body 840 in which multiple dielectric layers are laminated in the Z-axis direction. The common terminal P10 and the input/output terminals P11 and P12 are formed on a bottom surface BF3 of the multilayer body 340.

Inside the multilayer body 340, a line pattern 310 extends in the X-axis direction and is connected to the common terminal P10 with a via conductor V10. The via conductor V10 and the line pattern 310 form the common line 10. A line pattern 331 extends in the X-axis direction and is connected to the input/output terminal P11 with a via conductor V31. The via conductor V31 and the line pattern 331 form the transmission line 13. A line pattern 332 extends in the Y-axis direction and is connected to the input/output terminal P12 with a via conductor V32. The via conductor V32 and the line pattern 332 form the transmission line 14.

A line pattern 311 extends in the Y-axis direction and is disposed between the line pattern 310 and the common terminal P10 in the Z-axis direction. The line pattern 311 forms the distributed constant line Rs1. The line pattern 311 faces the line pattern 310 in the Z-axis direction. The line patterns 310 and 311 form the capacitor 31.

A line pattern 314 extends in the Y-axis direction and is disposed between the line pattern 331 and the input/output terminal P11 in the Z-axis direction. The line pattern 314 forms the distributed constant line Rs4. The line pattern 314 faces the line pattern 331 in the Z-axis direction. The line patterns 314 and 331 form the capacitor 33.

The line pattern 314 faces the line pattern 311 in the X-axis direction. Both end portions of the line pattern 311 protrude toward the line pattern 314. Both end portions of the line pattern 314 protrude toward the line pattern 311.

A line pattern 312 extends in the Y-axis direction and faces the line pattern 311 in the Y-axis direction. The line pattern 312 forms the distributed constant line Rs2. A line pattern 313 extends in the Y-axis direction and faces the line pattern 314 in the Y-axis direction. The line pattern 313 forms the distributed constant line Rs3. The line pattern 313 faces the line pattern 312 in the X-axis direction. Both end portions of the line pattern 312 protrude toward a side opposite to the line pattern 313. Both end portions of the line pattern 313 protrude toward a side opposite to the line pattern 312.

The line patterns 311 and 312 are coupled with an electric field coupling at respective end portions adjacent to each other in the Y-axis direction. The line patterns 312 and 313 are coupled with a magnetic field coupling at respective center portions adjacent to each other in the X-axis direction. The line patterns 313 and 314 are coupled with an electric field coupling at respective end portions adjacent to each other in the Y-axis direction.

Each of the line patterns 311 to 314 is a distributed constant line. The length of the distributed constant line is the length of the U-shaped center line from one end to the other end of the distributed constant line. The line patterns 311 to 314 form the distributed constant filter 11.

A line pattern 321 extends in the X-axis direction and is disposed between the line pattern 310 and the line pattern 332 the Y-axis direction. A line pattern 322 faces the line pattern 321 in the Z-axis direction. A via conductor V20 extends from the line pattern 322 to the bottom surface BF3 of the multilayer body 340. The via conductor V20 forms the inductor L1. The line patterns 321 and 322, and the via conductor V20 form the LC filter 12.

A line pattern 320 extends from one end of the line pattern 321 in the Y-axis direction. The line pattern 320 faces the line pattern 311 in the Z-axis direction. The line patterns 311 and 320 form the capacitor 32. The line pattern 321 faces the line pattern 332 in the Y-axis direction. The line patterns 321 and 332 form the capacitor 34. The line patterns 311, 320, 321, and 322 form the capacitor C1. The line patterns 332, 321, and 322 form the capacitor C2.

Figure 49:
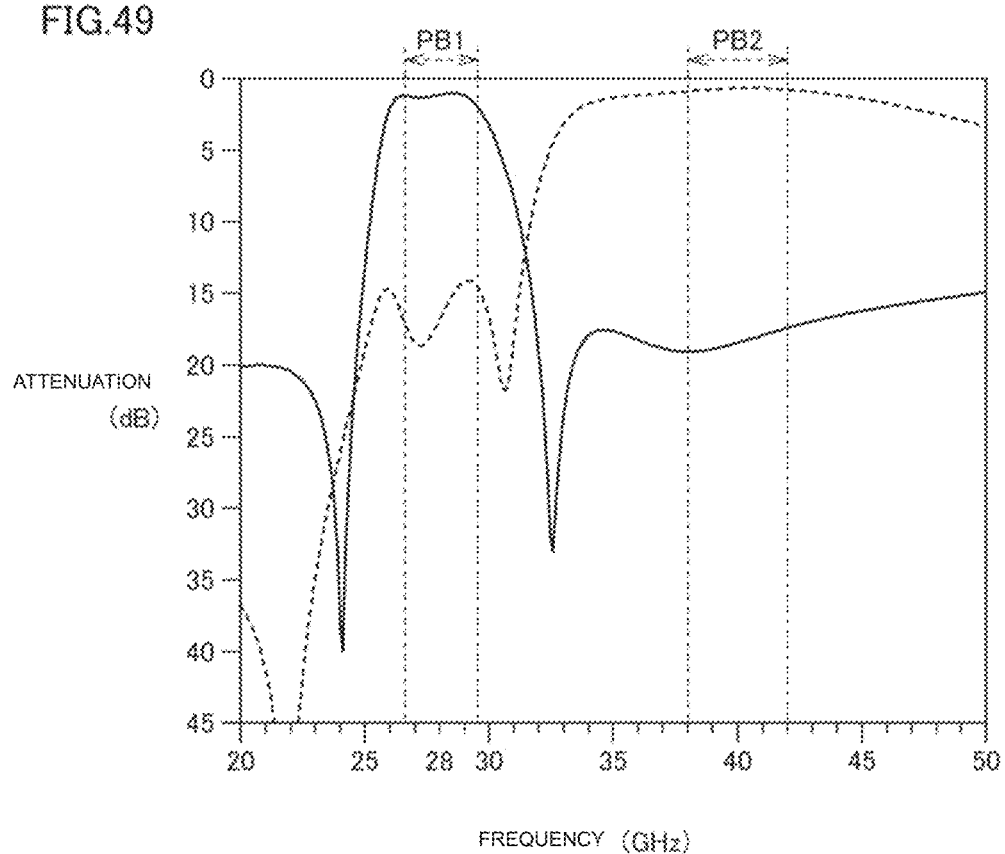
FIG. 49 is a graph illustrating a bandpass characteristic of the multiplexer in FIG. 42.

FIG. 49 illustrates a bandpass characteristic of the multiplexer 3 in FIG. 42. In FIG. 49, a solid line illustrates a bandpass characteristic when a signal is inputted from the common terminal P10, and the signal is outputted from the input/output terminal P11, and a dotted line illustrates a bandpass characteristic when a signal is inputted from the common terminal P10, and the signal is outputted from the input/output terminal P12.

Note that, in Embodiment 3, there has been described a case that each of the common line 10 and the transmission lines 13 and 14 in FIG. 42 is formed of a via conductor and a line pattern, but the line may be formed of a line pattern without including a via conductor.

Further, the second filter is not limited to an LC filter and may be a filter configured of an acoustic wave resonator, a waveguide filter, or a dielectric filter. A first filter and a second filter are formed in the same substrate because low loss may be achieved. It is acceptable that the first filter and the second filter are formed on substrates different from each other, or one filter is formed in a substrate and the other filter is formed on a surface of the substrate. Further, the permittivity of a first substrate on which the first filter is formed and the permittivity of a second substrate on which the second filter is formed may be different from each other in order to reduce the multiplexer in size. In the case above, a distributed constant filter, a common line, and a transmission line, which are relatively large in size, are formed on substrates having substantially the same permittivity.

As described above, with the use of the multiplexer according to Embodiment 3, deterioration in characteristics of a multiplexer due to impedance mismatching may be suppressed, because of the length of the common line and the length of the transmission line described in Embodiment 1 and Embodiment 2.

Embodiment 4

In Embodiment 4, there will be described an antenna module including the multiplexer described in Embodiment 1 to Embodiment 3.

Figure 50:
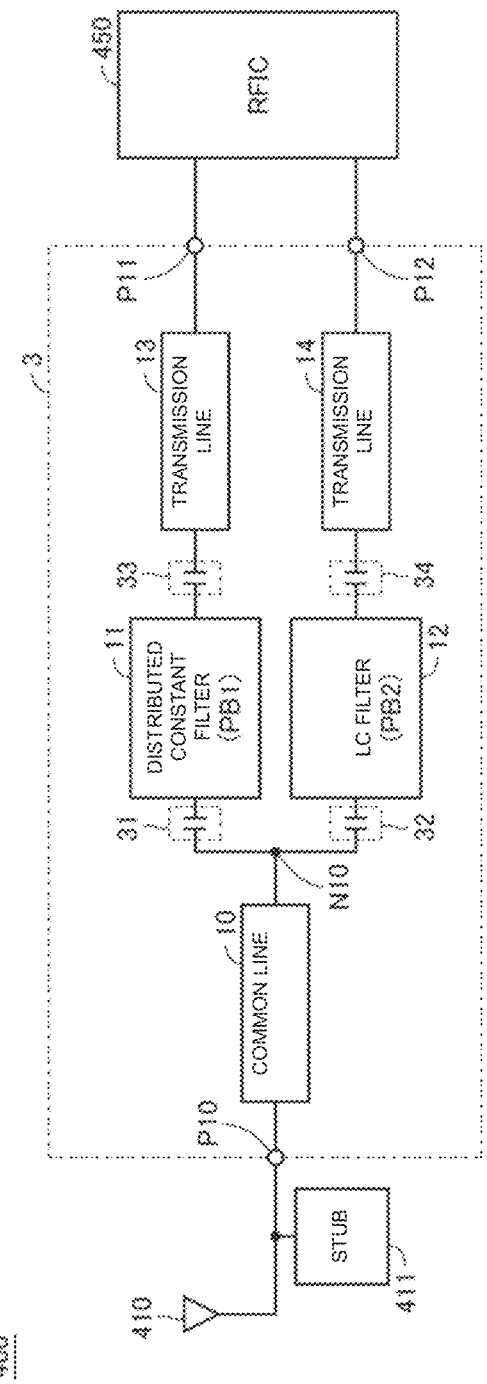
FIG. 50 is a functional block diagram illustrating a configuration of an antenna module according to Embodiment 4.

FIG. 50 is a functional block diagram illustrating a configuration of an antenna module 400 according to Embodiment 4. As illustrated in FIG. 50, the antenna module 400 includes an antenna 410, a stub 411, the multiplexer 3, and an RFIC (Radio Frequency Integrated Circuit) 450. Note that the multiplexer included in the antenna module according to Embodiment 4 is not limited to the multiplexer 3 described in Embodiment 3, and may be the multiplexer described in each of Embodiment 1 and Modification 1 to Modification 5 of Embodiment. 1, and Embodiment 2 and Modification 1 to Modification 4 of Embodiment 2.

The antenna 410 is connected to the common terminal P10. The stub 411 connected to a connection node of the antenna 410 and the common terminal P10. The input/output terminals P11 and P12 are connected to the RFIC 450.

Figure 51:
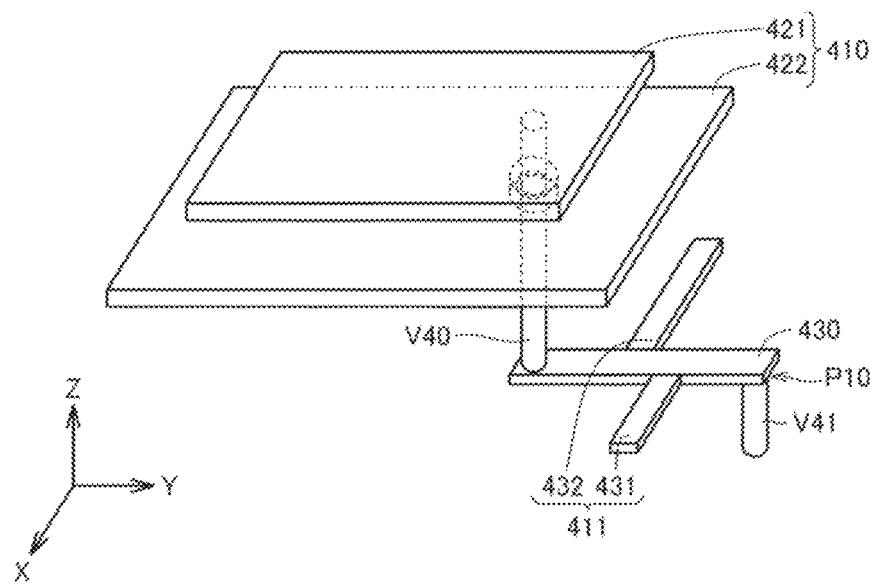
FIG. 51 is an external perspective view of an electrode structure of an antenna and a stub in FIG. 50.

FIG. 51 is an external perspective view of an electrode structure of the antenna 410 and the stub 411 in FIG. 50. In FIG. 51, the X-axis, the Y-axis, and the Z-axis are orthogonal to each other. The same applies to FIG. 52 to be described later.

As illustrated in FIG. 51, radiating elements 421 and 422 face each other in the Z-axis direction to form the antenna 410. The radiating element 421 is connected to one end of a line pattern 430 extending in the Y-axis direction with a via conductor V40. The via conductor V40 passes through a hole formed in the radiating element 422. The other end of the line pattern 430 is connected to a via conductor V41. A connection portion between the line pattern 430 and the via conductor V41 form the common terminal P10.

A line pattern 431 extends from a portion between both ends of the line pattern 430 in the X-axis direction. A line pattern 432 extends from a portion between both ends of the line pattern 430 in a direction opposite to the line pattern 431. The line patterns 431 and 432 form the stub 411.

A radio frequency signal from the multiplexer 3 is directly fed to the radiating element 421 through the line pattern 430 and the via conductor V40. The radiating element 421 is a feed element whereas a radio frequency signal from the multiplexer 3 is indirectly transferred to the radiating element 422 through electromagnetic field coupling with the via conductor V40. The radiating element 422 is a parasitic element.

Figure 52:
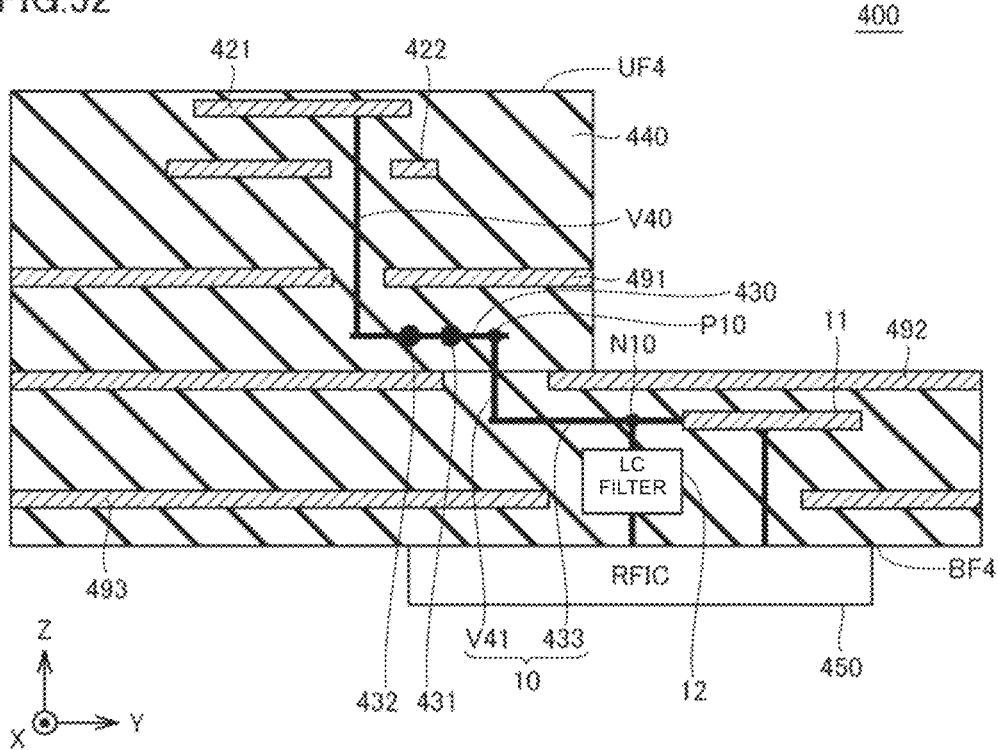
FIG. 52 is a sectional view of the antenna module in FIG. 50 formed as a multilayer body of multiple dielectric layers.

FIG. 52 is a sectional view of the antenna module 400 in FIG. 50 formed as a multilayer body 440 of multiple dielectric layers. In the multilayer body 440, multiple dielectric layers are laminated in the Z-axis direction. As illustrated in FIG. 52, inside the multilayer body 440, the radiating elements 421 and 422 are disposed between a ground electrode 491 and a top surface UF4 of the multilayer body 440 in the Z-axis direction. The line patterns 430 to 432 are disposed between the ground electrodes 491 and 492 in the Z-axis direction. A line pattern 433 is disposed between the ground electrodes 492 and 493. The via conductor V41 connects the line patterns 430 and 433. The via conductor V41 and the line pattern 433 form the common line 10. The common line 10 passes through a hole formed in the ground electrode 492, passes between the ground electrodes 492 and 493, and connects the line pattern 430 and the common connection node N10. The RFIC 450 is disposed on a bottom surface BF4 of the multilayer body 440. The distributed constant filter 11 and the LC filter 12 are connected in parallel between the common connection node N10 and the RFIC 450.

Modification of Embodiment 4

In Embodiment 4, there has been described a case that the common line 10 includes the via conductor V41. In a modification of Embodiment 4, there will be described a case that the common line 10 is formed of a line pattern.

Figure 53:
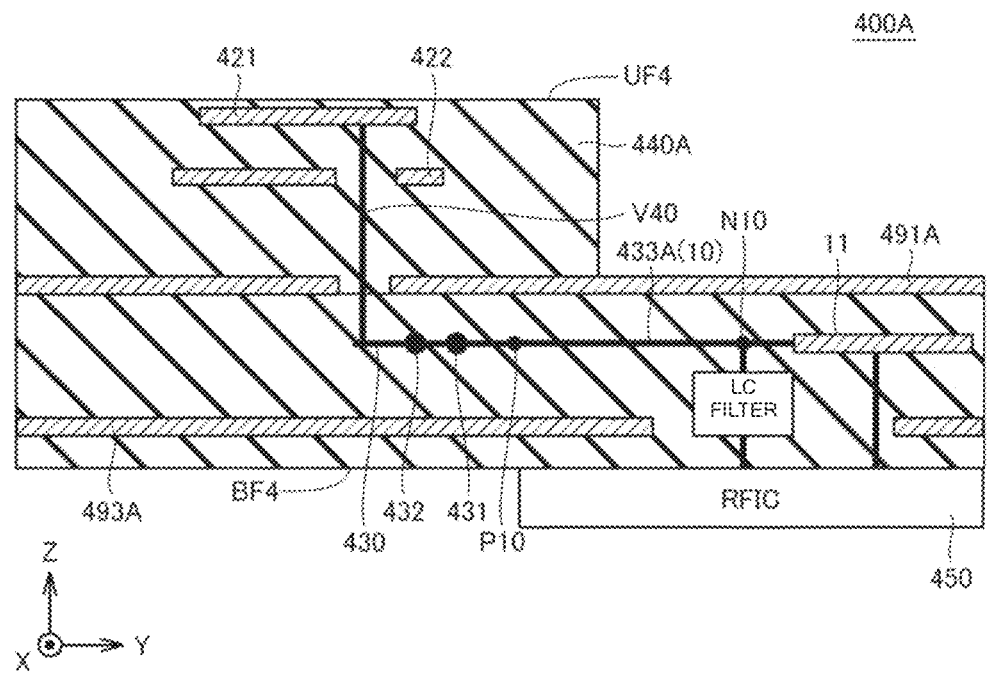
FIG. 53 is a sectional view of an antenna module according to a modification of Embodiment 4 formed as a multilayer body of multiple dielectric layers.

FIG. 53 is a sectional view of an antenna module 400A according to the modification of Embodiment 4 formed as a multilayer body 440A of multiple dielectric layers. The antenna module 400A has a configuration in which the multilayer body 440, the ground electrodes 491 and 493, and the line pattern 433 in FIG. 52 are respectively replaced with the multilayer body 440A, ground electrodes 491A and 493A, and a line pattern 433A, and in addition to that, the via conductor V41 and the ground electrode 492 are removed. Since other configurations are the same, a description thereof will not be repeated.

As illustrated in FIG. 53, the other end of the line pattern 430 is connected to the common connection node N10 with the line pattern 433A extending in the Y-axis direction. The line pattern 433A forms the common line 10. A connection portion between the line pattern 430 and the line pattern 433A form the common terminal P10.

As described above, with the use of the antenna module according to Embodiment 4 and the modification thereof, deterioration in characteristics of an antenna module due to impedance mismatching of the impedance of a multiplexer may be suppressed, because of the length of the common line and the length of the transmission line described in Embodiment 1 and Embodiment 2.

Note that, in Embodiment 1 to Embodiment 4, it is acceptable that one of the impedance of a common line and the impedance of transmission lines (first line and second line) is larger than the reference impedance, and the other impedance is smaller than the reference impedance. Further, it is acceptable that the impedance of one of the two transmission lines is larger than the reference impedance, and the impedance of the other transmission line is smaller than the reference impedance.

Embodiment 5

In Embodiment 5, there will be described an antenna module in which the first filter and the second filter of the multiplexer described in Embodiment 1 to Embodiment 4 are respectively replaced with two radiating elements.

Figure 54:
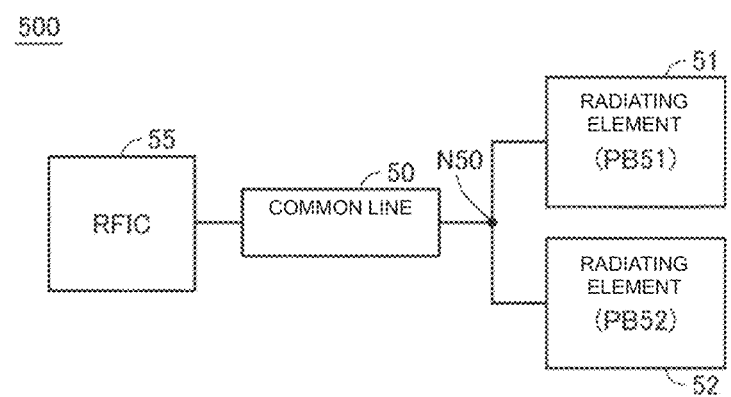
FIG. 54 is a functional block diagram illustrating a configuration of an antenna module according to Embodiment 5.

FIG. 54 is a functional block diagram illustrating a configuration of an antenna module 500 according to Embodiment 5. As illustrated in FIG. 54, the antenna module 500 includes a common line 50, a radiating element 51 (first radiating element), a radiating element 52 (second radiating element), and an RFIC 55. One end of the common line 50 is connected to a common connection node N50. The other end of the common line 50 is connected to the RFIC 55. The radiating element 51 is connected to the common connection node N50 and has a pass band PB51 (first pass band). The radiating element 52 is connected to the common connection node N50 and has a pass band PB52 (second pass band). The pass band PB51 is different from the pass band PB52. The pass band PB51 may be higher or lower than the pass band PB52.

In the antenna module 500, at least one of a first condition and a second condition as described below is satisfied. The first condition is that in the pass band PB51 any one of an impedance (first impedance) of the common line 50 alone viewed from the other end of the common line 50 and an impedance (second impedance) of the radiating element 51 viewed from the common connection node N50 includes an inductive property, and the other includes a capacitive property. The second condition is that in the pass band PB52 one of the impedance of the common line 50 alone and an impedance (third impedance) of the radiating element 52 viewed from the common connection node N50 includes an inductive property, and the other includes a capacitive property.

With the use of the antenna module 500, at least one of the impedance of the radiating element 51 viewed from the common connection node N50 in the pass band PB51 and the impedance of the radiating element 52 viewed from the common connection node N50 in the pass band PB52 is weakened, with the impedance of the common line 50 alone viewed from the other end of the common line 50. As a result, the impedance of the antenna module 500 viewed from the other end of the common line 50 is matched with the reference impedance with the common line 50.

Figure 55:
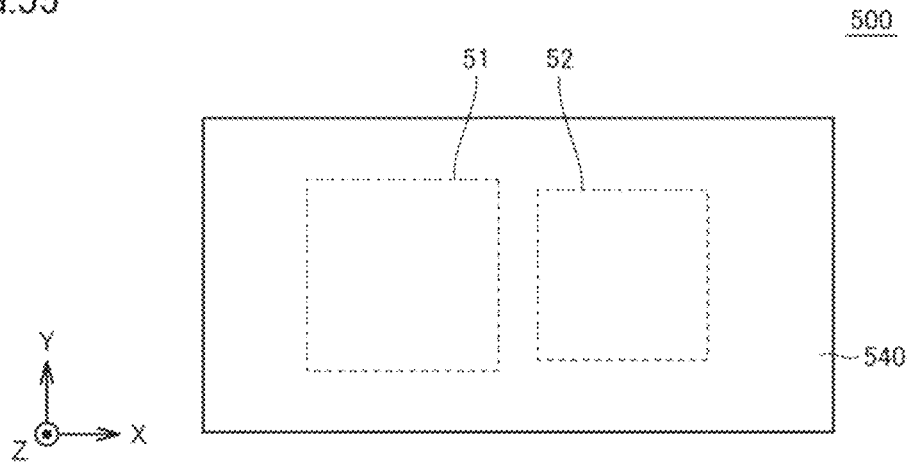
FIG. 55 is a diagram of an antenna module formed as a multilayer body of multiple dielectric layers in a plan view in the Z-axis direction.
Figure 56:
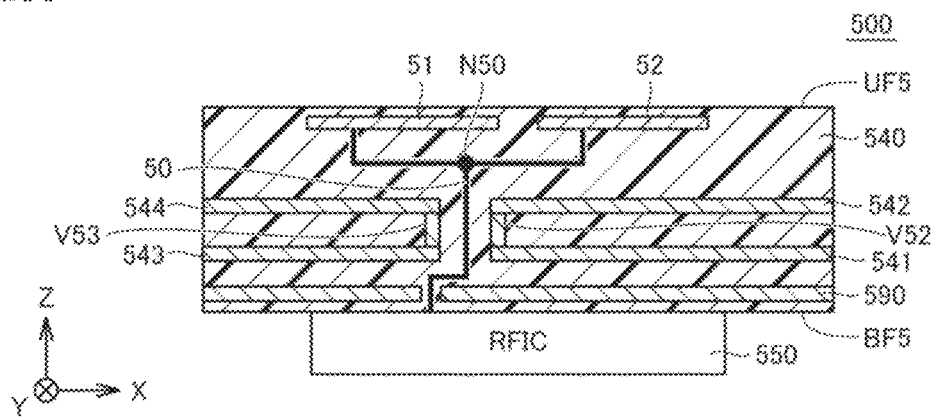
FIG. 56 is a sectional view of the antenna module in FIG. 55.

FIG. 55 is a diagram of the antenna module 500 formed as a multilayer body 540 of multiple dielectric layers in a plan view in the Z-axis direction. In the multilayer body 540, multiple dielectric layers are laminated in the Z-axis direction. FIG. 56 is a sectional view of the antenna module 500 in FIG. 55. In FIG. 55 and FIG. 56, the X-axis, the Y-axis, and the Z-axis are orthogonal to each other.

As illustrated in FIG. 55 and FIG. 56, the radiating elements 51 and 52 are arranged side by side in the X-axis direction inside the multilayer body 540. The radiating elements 51 and 52 are disposed between a top surface UF5 of the multilayer body 540 and a ground electrode 590 formed inside the multilayer body 540. The ground electrodes 541 and 543 face the ground electrode 590 in the Z-axis direction. The ground electrodes 541 and 542 face each other in the Z-axis direction and are connected to each other with a via conductor V52. The around electrodes 543 and 544 face each other in the Z-axis direction and are connected to each other with a via conductor V53. The ground electrodes 541 to 544, and the via conductors V52 and V53 form a ground electrode portion. The RFIC 55 is disposed on a bottom surface BF5 of the multilayer body 540. The radiating elements 51 and 52 are connected to the common connection node N50. The common line 50 passes through the Ground electrode 590, passes between the via conductors V52 and V53, and connects the common connection node N50 and the RFIC 55. The radiating elements 51 and 52 are directly fed with a radio frequency signal from the RFIC 55 through the common line 50. Each of the radiating elements 51 and 52 is a feed element. Note that a line connecting the common connection node N50 and each of the radiating elements 51 and 52 corresponds to the reference line.

Modification of Embodiment 5

In Embodiment 5, there has been described a configuration in which two radiating elements are both feed elements. In a modification of Embodiment 5, there will be described a configuration in which one of the two radiating elements is a feed element and the other is a parasitic element.

Figure 57:
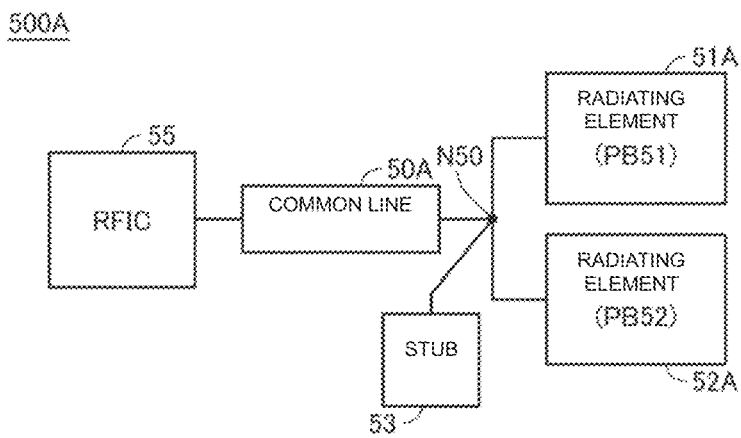
FIG. 57 is a functional block diagram illustrating a configuration of an antenna module according to a modification of Embodiment 5.

FIG. 57 is a functional block diagram of a configuration of an antenna module 500A according to a modification of Embodiment 5. The antenna module 500A has a configuration in which the common line 50 and the radiating elements 51 and 52 of FIG. 54 are respectively replaced with a common line 50A and radiating elements 51A and 52A, and in addition to that, a stub 53 is added. Since other configurations are the same, a description thereof will not be repeated. As illustrated in FIG. 57, the stub 53 is connected to the common connection node N50.

Figure 58:
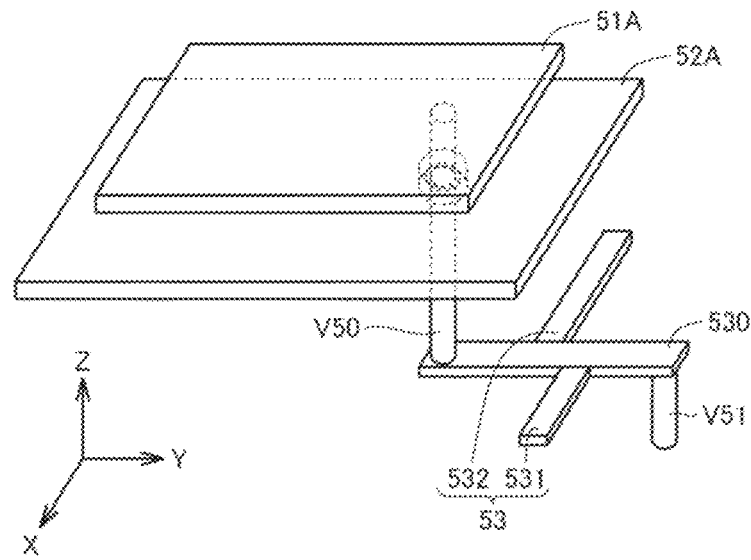
FIG. 58 is an external perspective view of an electrode structure of a radiating element and a stub in FIG. 57.

FIG. 58 is an external perspective view of an electrode structure of the radiating elements 51A and 52A and the stub 53 in FIG. 57. In FIG. 58, the X-axis, the Y-axis, and the Z-axis are orthogonal to each other. The same applies to FIG. 59 to be described later.

As illustrated in FIG. 58, the radiating elements 51A and 52A face each other in the Z-axis direction. The radiating element 51A is connected to one end of a line pattern 530 extending in the Y-axis direction with a via conductor V50. The via conductor V50 passes through a hole formed in the radiating element 52A. The other end of the line pattern 530 is connected to a via conductor V51.

A line pattern 531 extends from a portion between both ends of the line pattern 530 in the X-axis direction. A line pattern 532 extends from a portion between both ends of the line pattern 530 in a direction opposite to the line pattern 531. The line patterns 531 and 532 form the stub 53.

A radio frequency signal is directly fed to the radiating element 51A from the RFIC 55 through the line pattern 530 and the via conductor V50. The radiating element 51A is a feed element whereas a radio frequency signal is indirectly transferred to the radiating element 52A from the RFIC 55 through electromagnetic coupling with the via conductor V50. The radiating element 52A is a parasitic element.

Figure 59:
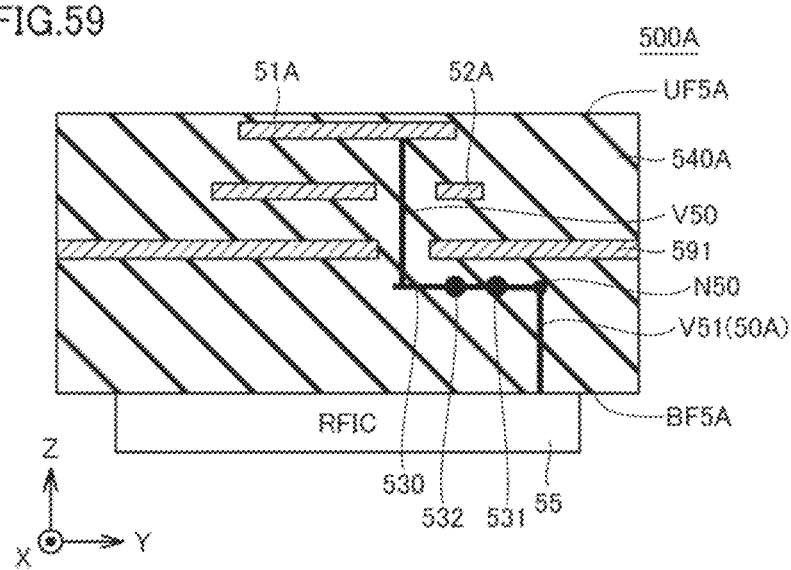
FIG. 59 is a sectional view of the antenna module in FIG. 57 formed as a multilayer body of multiple dielectric layers.

FIG. 59 is a sectional view of the antenna module 500A in FIG. 57 formed as a multilayer body 540A of multiple dielectric layers. In the multilayer body 540A, multiple dielectric layers are laminated in the Z-axis direction. As illustrated in FIG. 59, in the multilayer body 540A, the radiating elements 51A and 52A are disposed between a ground electrode 591 and a top surface UF5A of the multilayer body 540 in the Z-axis direction. The line patterns 530 to 532 are disposed between the ground electrode 591 and a bottom surface BF5A of the multilayer body 540 in the Z-axis direction. The via conductor V51 connects the line pattern 530 and the RFIC 55. The via conductor V51 forms the common line 50A. A connection portion between the via conductor V51 and the line pattern 530 forms the common connection node N50. A ground electrode (not illustrated) included in the ground electrode portion is formed around the via conductor V51.

Figure 60:
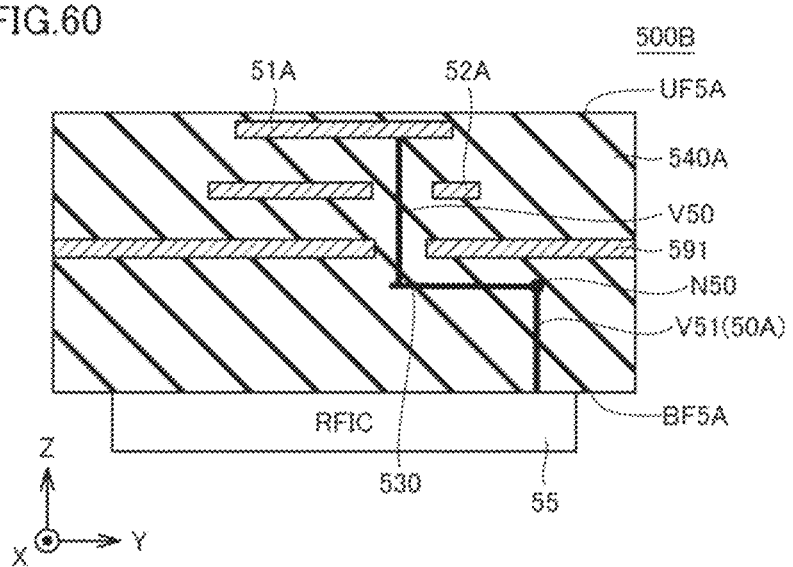
FIG. 60 is another sectional view of the antenna module in FIG. 57 formed as a multilayer body of multiple dielectric layers.

Note that, as in an antenna module 500B in FIG. 60, the line patterns 531 and 532 (stub 53) are not required to be formed. In the antenna module 500B, the line pattern 530 or the line pattern 530 and the via conductor V51 form a common line.

As described above, with the use of the antenna module according to Embodiment 5 and the modification thereof, deterioration in characteristics of an antenna module due to impedance mismatching may be suppressed because of the length of the common line described in Embodiment 1 and Embodiment 2.

Embodiment 6

Figure 61:
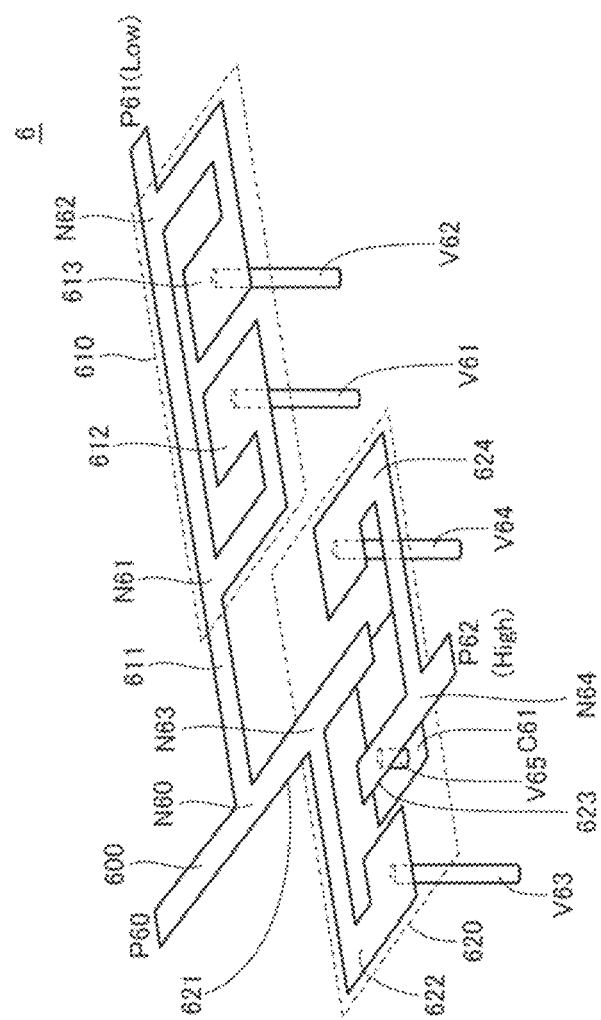
FIG. 61 is a perspective view of an electrode structure of a multiplexer according to Embodiment 6.

FIG. 61 is a perspective view of an electrode structure of a multiplexer 6 according to Embodiment 6. As illustrated in FIG. 61, the multiplexer 6 is configured to include flat plate-shaped electrodes and vias. More specifically, the multiplexer 6 includes a common terminal P60 to which a feed line being made common is connected, an input/output terminal P61 to which a low frequency side feed line is connected, and an input/output terminal P62 to which a high frequency side feed line is connected. A low pass filter 610 is formed between the common terminal P60 and the input/output terminal P61, and a high pass filter 620 is formed between the common terminal P60 and the input/output terminal P62.

A linear plate electrode 600 (carman line) is formed between the common terminal P60 and the common connection node N60.

The low pass filter 610 includes a linear plate electrode 611 connected to the common connection node N60 and the input/output terminal P61 and includes plate electrodes 612 and 613. The plate electrodes 612 and 613 are respectively branched from the branch nodes N61 and N62 of the plate electrode 611 and are disposed to face each other at a predetermined interval. The plate electrode 612 and the plate electrode 613 are disposed line-symmetrically in a plan view from a normal line direction of the substrate and are electromagnetically coupled to each other. End portions of the plate electrodes 612 and 613 are respectively connected to the ground point GND with via conductors V61 and V62. That is, the low pass filter 610 configures an LC series resonant circuit of a so-called π-type circuit including a series inductor (plate electrode 611) formed between the common connection node N60 and the input/output terminal P61 and two shunt stubs (plate electrodes 612 and 613+via conductors V61 and V62) branching from the series inductor. Each of the two shunt stubs is a λ/4 line (short stub) in which one end of the shunt stub is connected to the ground point GND through a via conductor. Each of the two shunt stubs may be a λ/2 line (open stub) in which neither of both ends of the shunt stub is connected to the ground point GND. The low pass filter 610 may constitute an LC series resonant circuit of a T-type circuit formed of one stub. Note that the length of the distributed constant line is the length from the branch node to the stub end, or the length from the branch node, through the stub, to the end portion of the via conductor connected to the stub.

The high pass filter 620 includes a linear plate electrode 621, one end of which is connected to the common connection node N60, plate electrodes 622, 623, and 624, and a capacitor electrode C61. The plate electrode 622 is branched from the branch node N63 of the plate electrode 621, and the end portion thereof is connected to the Ground point GND with a via conductor V63. The other end of the plate electrode 621 faces the capacitor electrode C61 disposed in different layer. The plate electrode 621 and the capacitor electrode C61 form a capacitor. The plate electrode 623 is connected to the capacitor electrode C61 through a via conductor V65 and is also connected to the input/output terminal P62. The plate electrode 624 is branched from the branch node N64 of the plate electrode 623, and the end portion thereof is connected to the ground point GND with a via conductor V64. That is, the high pass filter 620 configures an LC series resonant circuit of a so-called π-type circuit including a series capacitor (plate electrode 621 and capacitor electrode C61) formed between the common terminal P60 and the input/output terminal P62 and two shunt stubs (plate electrodes 622 and 624+via conductors V63 and V64) respectively branching from both ends of the capacitor. Each of the two shunt stubs is a λ/4 line (short stub) in which one end of the shunt stub is connected to the ground point GND through a via conductor. Each of the two shunt stubs may be a λ/2 line (open stub) in which neither of both ends of the shunt stub is connected to the ground point GND. The high pass filter 620 may constitute an LC series resonant circuit of a T-type circuit formed of one stub.

Note that the low pass filter 610 and the high pass filter 620 may be disposed in the same layer as in FIG. 61 or may be disposed in different layers to partially overlap with each other in a plan view from a normal direction of the substrate on which the filter device is formed. When the low pass filter 610 and the high pass filter 620 are formed in different layers, the ground point GND is disposed in a layer between the low pass filter 610 and the high pass filter 620 in order to prevent mutual coupling.

As described above, with the use of the multiplexer according to Embodiment 6, deterioration in characteristics of a multiplexer due to impedance mismatching may be suppressed, because of the length of the common line and the length of the transmission line described in Embodiment 1 and Embodiment 2.

The embodiments disclosed herein are also intended to be appropriately combined and implemented within a range that does not contradict each other. It should be understood that the embodiments disclosed herein are illustrative and non-restrictive in every respect. It is intended that the scope of the present disclosure be indicated by the appended claims rather than the foregoing description, and that all changes within the meaning and range of equivalency of the appended claims shall be embraced therein.

REFERENCE SIGNS LIST 1, 1A to 1E, 2A to 2D, 3, 6 MULTIPLEXER, 10, 10B, 10C, 20, 20B, 50, 50A COMMON LINE, 11, 12E, 21, 22C DISTRIBUTED CONSTANT FILTER, 12, 22 LC FILTER, 13, 13B, 13D, 14, 14B, 14D, 23, 23C, 23D, 24, 24C, 24D TRANSMISSION LINE, 31 to 34, C1, C2, C12, C14, C34 CAPACITOR, 51, 51A, 52, 52A, 421, 422 RADIATING ELEMENT, 53, 411 STUB, 101, 101C, 102, 111, 112, 310 to 314, 320 to 322, 331, 332, 430 to 433, 433A, 530 to 532, 910 to 912 LINE PATTERN, 191 to 196, 194C, 491 to 493, 491A, 493A, 590, 591 GROUND, ELECTRODE, 340, 440, 440A, 540, 540A MULTILAYER BODY, 400, 400A, 500, 500A, 500B ANTENNA MODULE, 410 ANTENNA, 600, 611 to 613, 621 to 624 PLATE ELECTRODE, 610 LOW PASS FILTER, 620 HIGH PASS FILTER, C61 CAPACITOR ELECTRODE, L1 INDUCTOR, P10, P60 COMMON TERMINAL, P11, P12, P61, P62 INPUT/OUTPUT TERMINAL, Rs1 to Rs4 DISTRIBUTED CONSTANT LINE, Rt1, Rt2 PATH, Sb1 TO Sb3, Sb2C, Sb11, Sb12 SUBSTRATE, V1, V1C, V10, V20, V31, V32, V40, V41, V50 to V53, V61 to V65, V91 to V93, V92C, V93C VIA CONDUCTOR

The invention claimed is:

1. A multiplexer, comprising:
a common terminal;
a common line connected between the common terminal and a common connection node;
a first terminal;
a second terminal;
a first filter being connected between the common connection node and the first terminal and having a first pass band; and
a second filter being connected between the common connection node and the second terminal and having a second pass band,
wherein at least one of a first condition and a second condition is satisfied, the first condition being that in the first pass band any one of a first impedance of the common line alone viewed from the common terminal and a second impedance of the first filter viewed from the common connection node includes an inductive property, and the other includes a capacitive property, the second condition being that in the second pass band one of the first impedance and a third impedance of the second filter viewed from the common connection node includes an inductive property, and the other includes a capacitive property,
wherein the second filter is a distributed constant filter.

2. The multiplexer according to claim 1,
wherein the second pass band is higher than the first pass band, and
the first impedance in the second pass band includes an inductive property.

3. The multiplexer according to claim 2,
wherein a magnitude of the first impedance is larger than a reference impedance,
the first filter is a distributed constant filter formed of multiple distributed constant lines, and
a length of the common line is substantially equal to or shorter than a length of one of the multiple distributed constant lines.

4. The multiplexer according to claim 3, further comprising:
a first line connected between the first filter and the first terminal; and
a second line connected between the second filter and the second terminal,
wherein each of a length of the first line and a length of the second line is substantially equal to a length of one of the multiple distributed constant lines.

5. The multiplexer according to claim 2,
wherein the common line is connected to a reference line having a reference impedance, and
a width of the common line is narrower than a width of the reference line having the reference impedance.

6. The multiplexer according to claim 2, further comprising:
a ground electrode portion,
wherein the common line is connected to a reference line having a reference impedance, and
a distance between the common line and the ground electrode portion is longer than a distance between the reference line and the ground electrode portion.

7. The multiplexer according to claim 2,
wherein a magnitude of the first impedance is smaller than a reference impedance,
the first filter is a distributed constant filter formed of multiple distributed constant lines, and
the common line is shorter than one of the multiple distributed constant lines.

8. The multiplexer according to claim 7, further comprising:
a first line connected between the first filter and the first terminal; and
a second line connected between the second filter and the second terminal,
wherein the first line is shorter than one of the multiple distributed constant lines, and
the second line is shorter than one of the multiple distributed constant lines.

9. The multiplexer according to claim 2,
wherein the common line is connected to a reference line having a reference impedance, and
a width of the common line is wider than a width of the reference line.

10. The multiplexer according to claim 2, further comprising:
a ground electrode portion,
wherein the common line is connected to a reference line having a reference impedance, and
a distance between the common line and the ground electrode portion is shorter than a distance between the reference line and the ground electrode portion.

11. An antenna module, comprising:
the multiplexer according to claim 2; and
a radiating element connected to the common terminal.

12. An antenna module, comprising:
the multiplexer according to claim 1; and
a radiating element connected to the common terminal.

13. The multiplexer according to claim 1,
wherein the first pass band is higher than the second pass band, and
the first impedance in the first pass band includes a capacitive property.

14. The multiplexer according to claim 13,
wherein a magnitude of the first impedance is smaller than a reference impedance, the first filter is a distributed constant filter formed of multiple distributed constant lines, and the common line is longer than one of the multiple distributed constant lines.

15. The multiplexer according to claim 14, further comprising:

a first line connected between the first filter and the first terminal; and a second line connected between the second filter and the second terminal, wherein the first line is longer than one of the multiple distributed constant lines, and the second line is longer than one of the multiple distributed constant lines.

16. The multiplexer according to claim 13, wherein the first impedance is larger than a reference impedance, the first filter is a distributed constant filter formed of multiple distributed constant lines, and a length of the common line is substantially equal to or longer than a length of one of the multiple distributed constant lines.

17. The multiplexer according to claim 16, further comprising:

a first line connected between the first filter and the first terminal; and a second line connected between the second filter and the second terminal, wherein each of a length of the first line and a length of the second line is substantially equal to a length of one of the multiple distributed constant lines.

* * * * *